US006058044A

United States Patent [19]

Sugiura et al.

[11] Patent Number: 6,058,044

[45] Date of Patent: May 2, 2000

[54] SHIELDED BIT LINE SENSING SCHEME FOR NONVOLATILE SEMICONDUCTOR MEMORY

[75] Inventors: Yoshihisa Sugiura, Kamakura; Yoshihisa Iwata; Hiroshi Watanabe, both of Yokohama, all of Japan

[73] Assignee: Kabushiki Kaisha Toshiba, Kawasaki, Japan

[21] Appl. No.: 09/207,929

[22] Filed: Dec. 9, 1998

[30] Foreign Application Priority Data

Dec. 10, 1997 [JP] Japan .................................... 9-339796

[51] Int. Cl.[7] ..................................................... G11C 16/04

[52] U.S. Cl. ........................ 365/185.17; 365/63; 365/203

[58] Field of Search ........................ 365/203, 63, 230.03, 365/185.05, 185.17

[56] References Cited

U.S. PATENT DOCUMENTS

| | | | |
|---|---|---|---|
| 5,453,955 | 9/1995 | Sakui et al. | 365/203 |
| 5,793,666 | 4/1998 | Yamazaki | 365/63 |
| 5,886,937 | 3/1999 | Jang | 365/203 |
| 5,892,715 | 4/1999 | Hirata et al. | 365/230.03 |
| 5,914,903 | 6/1999 | Kanma et al. | 365/203 |

OTHER PUBLICATIONS

Tomoharu Tanaka et al., A Quick Intelligent Page–Programming Architecture and a Shielded Bitline Sensing Method for 3 V–Only NAND Flash Memory'; IEEE Journal of Solid–State Circuits, vol. 29, No. 11; Nov. 1994; pp. 1366–1373.

Ken Takeuchi et al.; A Double–Level–Vth Select Gate Array Architecture for Multilevel NAND Flash Memories'; IEEE Journal of Solid–State Circuits, vol. 31, No. 4; Apr. 1996; pp. 602–609.

*Primary Examiner*—Son T. Dinh

*Attorney, Agent, or Firm*—Banner & Witcoff, Ltd.

[57] ABSTRACT

A memory incorporates a shield bit line reading system for fixing one of two bit lines disposed adjacent to each other to a shield potential and reading data to the other bit line. Selected bit lines are precharged to a power source potential, and then brought to a floating state. The shield bit lines are fixed to the power source potential. A period in which the power source potential is applied to the selected bit lines and a period in which the power source potential is applied to the shield bit lines are the same. A source line decoder applies the power source potential to sources of NAND cell units connected to selected bit lines and applies a ground potential to sources of NAND cell units connected to shield bit lines. Then, an output of data is produced from the memory cell to the selected bit lines.

26 Claims, 35 Drawing Sheets

FIG. 12D
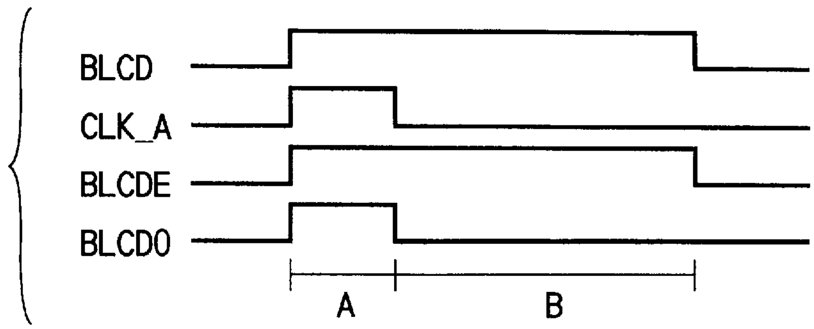
FIG. 12E
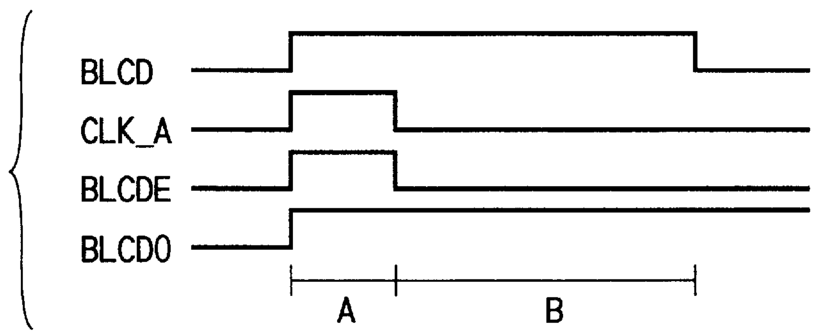
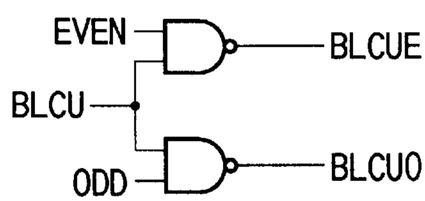
FIG. 12F
FIG. 12G
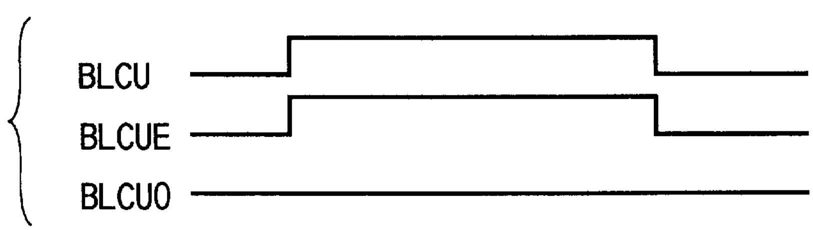
FIG. 12H
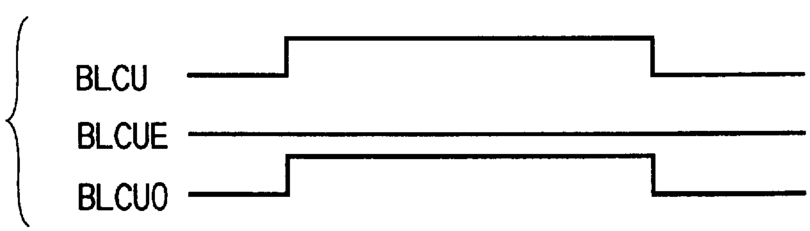

SHIELDED BIT LINE SENSING SCHEME FOR NONVOLATILE SEMICONDUCTOR MEMORY

BACKGROUND OF THE INVENTION

The present invention relates to a nonvolatile semiconductor memory in which a shielded bit line sensing scheme is used in data read.

Hitherto, in a nonvolatile semiconductor memory, for example, a NAND flash memory EEPROM structured as shown in FIG. 1, data read is conducted for each page (a memory cell group connected to one word line).

A data read operation will now be described in brief. After all of bit lines BL0, BL1, . . . , BLi are precharged to 2.5 V. Then, all of the bit lines BL0, BL1, . . . , BLi are brought to a floating state. In selected block BLKj, select gates SGS and SGD of select transistors at both ends of NAND cell units and non-selected word lines (control gates) CG0, CG1, CG3 to CG15 are set to VCGH (=3.5 V). Moreover, a selected word line (a control gate) CG2 is set to the ground potential (=0 V). In non-selected blocks, select gates SGS and SGD of the select transistors at both ends of the NAND cell units are set to the ground potential (=0 V).

The threshold voltage of a memory cell for storing, for example, data "1" is set to a level lower than 0 V. On the other hand, the threshold voltage of the memory cell for storing, for example, data "0" is set to a level higher than 0 V and lower than 3.5 V. A source line SL is set to the ground potential (=0 V).

In the selected block BLkj, the select transistors at the NAND cell units are turned on at this time. Also the memory cells which are connected to the non-selected word lines CG0, CG1, CG3 to CG15 are turned on regardless of the value of data ("1" or Therefore, the potentials of the bit lines BL0, BL1, . . . , BLi are determined in accordance with data in each of the memory cells connected to the selected word line CG2. For example, if data in memory cell M0 is "1", the threshold voltage of the memory cell M0 is lower than 0 V. Therefore, the memory cell M0 is turned on so that the electric charge of the bit line BL0 is discharged to a source line SL (=0 V). For example, if data in memory cell M1 is "0", the threshold voltage of the memory cell M1 is higher than 0 V. Therefore, the memory cell M1 is turned off. Thus, the bit line BL1 maintains the precharge potential.

Thus, the potential of each of the bit lines BL0, BL1, . . . , BLi is changed from the precharge potential to the ground potential (=0 V) when data in the select cells is "1". When data in the select cells is "0", the precharge potential is maintained.

The potential (data) of the bit lines BL0, BL1, . . . , BLi are amplified and latched by a latch circuit having a function of a sense amplifier. Thus, the data read operation is completed.

The nonvolatile semiconductor memory for performing a data read operation for each page has the following defects.

If the memory cells are fixed due to increasing memory capacity, a parasitic capacity between two adjacent bit lines becomes larger than a parasitic capacity between the bit line and the ground point (for example, a semiconductor substrate). In the case, for example, discharge of electricity from the bit lines BLi−1 and BLi+1 on both sides of the bit line BLi which must maintain the precharge potential sometimes causes the potential of the bit line BLi to also be lowered correspondingly to the discharge of the bit lines BLi−1 and BLi+1. Thus, a read error sometimes occurs.

To prevent such a read error, a data read scheme, that is, a shielded bit line sensing scheme is employed, in which data read in memory cell groups corresponding to one page connected to one word line is performed by two kinds of read operations consisting of an operation for reading data in memory cells connected to even-numbered bit lines and an operation for reading data in memory cells connected to odd-numbered bit lines.

The method will now be described. A first read operation is performed for example such that, while the odd-numbered bit lines BL1, BL3, . . . , are fixed to the ground potential GND, data in the memory cells are output to only the even-numbered bit lines BL0, BL2, . . . , and then data is latched by the latch circuit. A second read operation is performed for example such that, while even-numbered bit lines BL0, BL2, . . . are fixed to the ground potential GND, data is output to only the odd-numbered bit lines BL1, BL3, . . . , and the data is latched by the latch circuit.

With the shielded bit line sensing scheme, since the bit lines BLi−1 and BLi+1 on both sides of the bit line BLi which receives data are fixed to the ground potential GND, change in the potential of the bit line BLi can be prevented which is caused from change in the potential of the bit lines BLi−1 and BLi+1.

FIG. 2 is a diagram showing a main portion of the structure of a NAND flash EEPROM to which the shielded bit line sensing scheme is applied.

A memory cell array 11 comprises a plurality of NAND cell units 12 arranged in an array configuration. Each of the NAND cell units 12 is structured with a NAND column composed of a plurality of memory cells connected in series and two select transistors connected to both ends of the NAND column (see FIG. 1).

In each of blocks BLK0, BLK1, BLK2, . . . , of the memory cell array 11, is arranged a line group 14 including select gates SGS and SGD and word lines (control gates) CG0 to CG15 of select transistors extending in a row direction. A row decoder 13 selects one block in response to a block address signal.

A select gate driver 15 applies VCGH (=3.5 V) to the select gates SGS and SGD of the select transistors at both ends of the NAND cell units 12 in the selected blocks. Moreover, the row decoder 13 applies the ground potential to the select gate SGS and SGD of the select transistors at both ends of the NAND cell units 12 in the non-selected blocks. The row decoder 13 applies VCGH (=3.5 V) to the non-selected word lines and applies the ground potential to the selected word lines.

A source line SL is connected to ends of the NAND cell units 12. A source is shared by the NAND cell units (NAND cell units in one block) 12 in the row direction, and is connected to the source line SL. The source line SL is common to all of the NAND cell units 12 in the memory cell array 11, and is applied with the ground potential.

A predetermined one of bit lines BLi−1, BLi, BLi+1, BLi+2, . . . , is connected to the other ends of the NAND cell units 12 in the column direction. One end of each of the bit lines BLi−1, BLi, BLi+1, BLi+2, . . . , is connected to a VDD/GND supply circuit 18 through a switch circuit 17 for switching the precharge potential and the shield potential.

For example, if the bit lines BLi−1, BLi+1, . . . , are shield bit lines and the bit lines BLi, BLi+2, . . . , are selected bit lines, signal BLCDO is set to VDD (power source potential= 2.5 V), the VDD (power source potential=2.5 V) is supplied from the VDD/GND supply circuit 18 to the bit lines BLi, BLi+2, . . . , to precharge the bit lines BLi, BLi+2, . . . , to VDD, and then signal BLCDO is set to 0 V. Then, the signal BLCDE is made to be VDD (power source potential=2.5 V), and the ground potential GND is supplied from the VDD/GND supply circuit 18 to the bit lines BLi−1, BLi+1, . . . , to fix the bit lines BLi−1, BLi+1, . . . , to the ground potential GND.

The reason why the potential of the shield bit line is made to be the ground potential (=0 V) lies in that the potential of the source line SL has been set to be 0 V. If the potential of the shield bit line is made to be the power source potential VDD, a short is caused between the shield bit line (the power source potential), which and the source line (the ground potential) are short-circuited through the NAND column when all of the transistors of the NAND cells in the selected blocks connected to the shield bit line are turned on. In this case, a large electric current flows, causing power loss.

The other end of each of the bit lines BLi−1, BLi, BLi+1, BLi+2, . . . , is connected to a latch circuit 20 having a function of a sense amplifier through the switch circuit 19. For example, the bit lines BLi−1, BLi+1, . . . , are made to be shield bit lines and the bit lines BLi, BLi+2, . . . , are made to be selected bit lines, signal BLCUE is made to be the ground potential GND and signal BLCUO is made to be the power source potential VDD, so that the potentials (data) of the shield bit lines BLi, BLi+2, . . . , can be applied to the latch circuit 20 having the function of the sense amplifier.

A column decoder 21 selects one column in response to the column address signal. Data in the latch circuit 20 in the selected column is supplied to an I/O buffer 23 through a column select circuit 22.

If one chip includes, for example, n memory cell arrays, n I/O buffers and n I/O pads, an output of n-bit data is simultaneously output to the outside.

A conventional device structure of the NAND flash EEPROM to which the shielded bit line sensing scheme is applied will now be described.

FIG. 3 shows a layout pattern of a source contact section of the memory cell array 11 shown in FIG. 2. FIG. 4 shows a pattern of a device isolation film of the memory cell array 11 shown in FIG. 2. FIG. 5 is a cross-sectional view taken along line V—V shown in FIG. 3. FIG. 6 is a cross-sectional view taken along line VI—VI shown in FIG. 3.

A device isolation film 31 of an STI (Shallow Trench Isolation) structure formed on a semiconductor substrate 30. The device isolation film 31 electrically isolates two adjacent NAND cell units from each other. The semiconductor substrate includes a plurality of N-type diffusion layers 32 and 32*a* formed therein.

The N-type diffusion layer 32*a* serves as a source of the NAND cell unit, the N-type diffusion layer 32*a* being commonly used by a plurality of NAND cell units in the row direction. Floating gates 33, . . . , and control gates CG15, CG14, . . . , of the memory cell are formed on channels between the N-type diffusion layers 32. Select gates SGS of the select transistors are formed on the channels between the N-type diffusion layers 32 and 32*a*.

An interlayer insulating film 34 is formed to cover the NAND cell units comprising the memory cell and the select transistors. A source line SL which is connected to the N-type diffusion layer 32*a* is formed on the interlayer insulating film 34. An interlayer insulating film 35 for covering the source line SL is formed on the interlayer insulating film 34. Bit lines BLi−1, BLi, BLi+1, BLi+2 which are connected to the drains of the NAND cell units are formed on the interlayer insulating film 35.

The shielded bit line sensing scheme using the NAND flash EEPROM shown in FIG. 2 will now be described.

Initially, a first data read operation is performed.

The signals BLCUE and BLCUO are made to be the ground potential, and all of the transistors in the switch circuit 19 are turned off. When the bit lines BLi−1, BLi+1, . . . , are made to be the shield bit lines, and the bit lines BLi, BLi+2, . . . , are made to be selected bit lines, the signal BLCDO is set to VDD (power source potential=2.5 V) and the signal BLCDE is set to the ground potential GND. Then, VDD (power source potential=2.5 V) is supplied from the VDD/GND supply circuit 18 to the bit lines BLi, BLi+2, . . . , so that the bit lines BLi, BLi+2, . . . , are precharged to VDD. Thereafter, when the signal BLCDO is set to the ground potential GND, the bit lines BLi, BLi+2, . . . , are brought to a floating state.

Then, the signal BLCDE is set to VDD (power source potential=2.5 V) and the ground potential GND is supplied from the VDD/GND supply circuit 18 to the bit lines BLi−1, BLi+1, . . . so that the bit lines Bli−1, BLi+1, . . . , are made to be the ground potential GND. If the signal BLCDE maintains the power source potential VDD, the shield bit lines BLi−1, BLi+1, . . . , can be fixed to the ground potential GND.

Then, the row decoder 13 selects one block and one word line (a row) in response to a block address signal and a row address signal. The select gate driver 15 applies VCGH (=3.5 V) to the select gates SGS and SGD of the select transistors at both ends of the NAND cell units in the selected blocks, while applying the ground potential to the select gates SGS and SGD of the select transistors at both ends of the NAND cell units in the non-selected blocks. The control gate driver 16 applies VCGH (=3.5 V) to the non-selected word lines while applying the ground potential to the selected word lines.

For example, the selected bit lines BLi, BLi+2, . . . , maintain the precharge potential when data in the memory cells connected to the selected word lines is "0" (when the threshold voltage is higher than 0 V), while, when data in the memory cells connected to the selected word lines is "1" (when the threshold voltage is lower than 0 V), they discharge to be made to be the ground potential.

Thereafter, the signal BLCUO becomes the power source potential and data output to the selected bit lines BLi, BLi+2 is introduced to the latch circuit 20 having the function of the sense amplifier. Data in the latch circuit 20 having the function of the sense amplifier is supplied to the I/O buffer 23 through the column select circuit 22, and then transmitted to the outside of the chip.

Then, the selected bit lines and the shield bit lines are switched, that is, the bit lines BLi, BLi+2, . . . , are changed to the shield bit lines and the bit lines BLi−1, BLi+1, . . . , are changed to the selected bit lines. Then, a second data read operation is performed.

Both of the signals BLCUE and BLCUO are set to the ground potential so that all of the transistors in the switch circuit 19 are turned off. When the bit lines BLi, BLi+2, . . . , are made to be the shield bit lines, and the bit lines BLi−1, BLi+1, . . . , are made to be the selected bit lines, the signal BLCDE is set to VDD (power source potential=2.5 V), the signal BLCDO is set to the ground potential GND, and VDD (power source potential=2.5 V) is supplied from the VDD/GND supply circuit 18 to the bit lines BLi−1, BLi+1, . . . , so that the bit lines BLi−1, BLi+1, . . . , are precharged. Thereafter, when the signal BLCDE is set to the ground potential GND, the bit lines BLi−1, BLi+1, . . . , are brought to the floating state.

Then, the signal BLCDO is made to be VDD (power source potential=2.5 V), the ground potential GND is supplied from VDD/GND supply circuit 18 to the bit lines BLi, BLi+2, . . . , and the bit lines BLi, BLi+2, . . . , are changed to the ground potential GND. If the BLCDO maintains the power source potential VDD, the shield bit lines BLi, BLi+2, . . . , can be fixed to the ground potential GND.

Then, one block and one word line (a row) is selected by the row decoder 13 in response to the block address signal and the row address signal. The select gate driver 15 applies VCGH (=3.5 V) to the select gates SGS and SGD of the select transistors at both ends of the NAND cell units in the selected block, while supplying the ground potential GND to the select gates SGS and SGD of the select transistors at both ends of the NAND cell units in the non-selected blocks. The control gate driver 16 applies VCGH (=3.5 V) to the non-selected word line and applies the ground potential GND to the selected word lines.

For example, the selected bit lines BLi−1, BLi+1, . . . , maintain the precharge potential when data in the memory cells connected to the selected word lines is “0” (when the threshold voltage is higher than 0 V), while when data in the memory cells connected to the selected word lines is “1” (when the threshold voltage is lower than 0 V), they discharge to be changed to the ground potential.

Thereafter, the signal BLCUE is made to be the power source potential, and data output to the selected bit lines BLi−1, BLi+1, . . . is supplied to the latch circuit 20 having the function of the sense amplifier. Data from the latch circuit 20 having the function of the sense amplifier is supplied to the I/O buffer 23 through the column select circuit 22, and then transmitted to the outside of the chip.

According to the above-mentioned shielded bit line sensing scheme, the bit lines on both sides of the selected bit line are fixed to the ground potential, so that the change of the potential of the selected bit line caused from change in the potential of the adjacent bit line can be prevented.

However, the bit lines (the shield bit lines) on both sides of the selected bit line are fixed to the ground potential, so that, when the selected bit line is precharged to the power source potential VDD, there arises a problem in that the capacity between the selected bit line and the shield bit line undesirably causes precharge time to be prolonged.

As shown in FIGS. 7 and 8, the stress of the potential difference of 3.5 V (VCGH-0 V) is imposed between the channels of the memory cells MC, which are connected to the shield bit line and non-selected word lines (the control gates) CG0, CG1, CG3 to CG15, and the control gate.

The stress relationship (the control gate is a high potential and the channel is a low potential) is the same as the stress relationship in an operation for writing “0”, that is, in an operation for implanting electrons into the floating gate. If the above-mentioned stress is repeatedly imposed on the memory cell, a so-called soft program occurs. If the worst happens, a memory cell in an erased state (in a state in which “1” has been written, that is, a depletion type) is changed to a write state (in a state in which “0” has been written, that is, an enhancement type).

BRIEF SUMMARY OF THE INVENTION

To overcome the above-mentioned problems, an object of the present invention is to cause a nonvolatile semiconductor memory to which a shielded bit line sensing scheme is applied to perform a high speed operation of precharging bit lines with low power consumption in data read even if intervals among bit lines are reduced because the capacity of the memory must be enlarged. Moreover, the stress which is imposed on the memory cell connected to shield bit lines is relaxed to prevent occurrence of a soft program in data read.

(1) A nonvolatile semiconductor memory according to the present invention comprises: a memory cell array having first and second memory cells; a word line commonly connected to control gates of the first and second memory cells; a first bit line connected to a drain-side node of the first memory cell; and a second bit line connected to a drain-side node of the second memory cell and disposed adjacent to the first bit line. The nonvolatile semiconductor memory according to the present invention includes a switch circuit. The switch circuit is structured to be operated in a first data read in such a manner as to precharge the first bit line to a precharge potential followed by bringing the first bit line to a floating state and to fix the second bit line to a positive potential and to be operated in a second data read in such a manner as to precharge the second bit line to the precharge potential followed by bringing the second bit line to the floating state and to fix the first bit line to the positive potential.

The nonvolatile semiconductor memory according to the present invention includes a decoder. The decoder selects the word line, produces an output of data in the first memory cell to the first bit line in a first data read and produces data in the second memory cell to the second bit line in second data read.

The precharge potential and the positive potential are substantially simultaneously supplied to the first and second bit lines. For example, when each of the precharge potential and the positive potential is the power source potential, the precharge potential and the positive potential are substantially simultaneously supplied to the first and second bit lines from a power source.

(2) A nonvolatile semiconductor memory according to the present invention comprises: a memory cell array having first and second memory cells; a word line commonly connected to control gates of the first and second memory cells; a first bit line connected to a drain-side node of the first memory cell; a second bit line connected to a drain-side node of the second memory cell and disposed adjacent to the first bit line; a first source line connected to a source-side node of the first memory cell; and a second source line connected to a source-side node of the second memory cell and isolated from the first source line.

The nonvolatile semiconductor memory according to the present invention includes a source line decoder. The source line decoder is operated in a first data read such that data of the first memory cell is output in such a manner as to set the second source line to a positive potential and set the first source line to a low potential which is lower than the positive potential and operated in a second data read such that data of the second memory cell is output in such a manner as to set the first source line to the positive potential and set the second source line to the low potential.

The nonvolatile semiconductor memory according to the present invention includes a switch circuit. The switch circuit is operated in the first data read in such a manner as to precharge the first bit line to a precharge potential followed by bringing the first bit line to a floating state and to fix the second bit line to a positive potential and operated in the second data read in such a manner as to precharge the second bit line to the precharge potential followed by bringing the second bit line to the floating state and to fix the first bit line to the positive potential.

The nonvolatile semiconductor memory according to the present invention incorporates a decoder for selecting the word line, outputting data of the first memory cell to the first bit line in the first data read and outputting data of the second memory cell to the second bit line in the second data read.

Each of the precharge potential and positive potential is a power source potential and the low potential is a ground potential. A source-side node of the first memory cell and a source-side node of the second memory cell are isolated from each other.

(3) A nonvolatile semiconductor memory according to the present invention comprises: first and second NAND cell units including NAND columns having a plurality of memory cells connected to one another in series and two select transistors each of which is connected to each of two ends of the NAND columns; a first bit line connected to a drain-side node of the first NAND cell unit; and a second bit line connected to a drain-side node of the second NAND cell unit and disposed adjacent to the first bit line.

The nonvolatile semiconductor memory according to the present invention includes a switch circuit operated in a first data read in such a manner as to precharge the first bit line to a precharge potential followed by bringing the first bit line to a floating state and to fix the second bit line to a positive potential and operated in a second data read in such a manner as to precharge the second bit line to the precharge potential followed by bringing the second bit line to the floating state and to fix the first bit line to the positive potential.

The nonvolatile semiconductor memory includes a decoder for outputting data of one memory cell in the first NAND cell units to the first bit line in the first data read and outputting data of one memory cell in the second NAND cell units to the second bit line in the second data read.

The nonvolatile semiconductor memory according to the present invention incorporates a first source line connected to a source-side node of the first NAND cell cell unit; and a second source line connected to a source-side node of the second NAND cell unit and isolated from the first source line.

The nonvolatile semiconductor memory includes a source line decoder. The source line decoder is operated in the first data read in such a manner as to set the second source line to the positive potential and set the first source line to a low potential which is lower than the positive potential and operated in the second data read in such a manner as to set the first source line to the positive potential and set the second source line to the low potential.

Each of the precharge potential and the positive potential is a power source potential and the low potential is a ground potential. The source-side node of the first memory cell and the source-side node of the second memory cell are isolated from each other.

The first NAND cell unit and the second NAND cell unit are isolated from each other by a device isolation film having a line pattern extending substantially in parallel with the first and second bit lines.

(4) A data read method according to the present invention is applied to a nonvolatile semiconductor memory having a word line commonly connected to control gates of first and second memory cells, a first bit line connected to a drain-side node of the first memory cell and a second bit line connected to a drain-side node of the second memory cell and disposed adjacent to the first bit line. The method comprises the step of: precharging the first bit line to a precharge potential followed by bringing the first bit line to a floating state and producing an output of data in the first memory cell to the first bit line in a state in which the second bit line is fixed to a positive potential in a first data read. The method comprises the step of precharging the second bit line to the precharge potential followed by bringing the second bit line to the floating state and producing an output of data in the second memory cell to the second bit line in a state in which the first bit line is fixed to the positive potential in a second data read.

A period of time in which the precharge potential is applied to the first bit line and a period of time in which the positive potential is applied to the second bit line are substantially the same in the first data read, and a period of time in which the precharge potential is applied to the second bit line and a period of time in which the positive potential is applied to the first bit line are substantially the same in the second data read.

Each of the precharge potential and the positive potential is a power source potential, and the power source potential is simultaneously applied to the first and second bit lines from a power source in the first and second data read.

The positive potential is applied to a source-side node of the second memory cell and a low potential which is lower than the positive potential is applied to a source-side node of the first memory cell in the first data read, and the positive potential is applied to a source-side node of the first memory cell and the low potential is applied to a source-side node of the second memory cell in the second data read. Each of the precharge potential and the positive potential is a power source potential, and the low potential is a ground potential.

(5) A data read method according to the present invention is applied to a nonvolatile semiconductor memory having a first bit line connected to a drain-side node of a first NAND cell unit and a second bit line connected to a drain-side node of a second NAND cell unit and disposed adjacent to the first bit line. The method comprises the step of: precharging the first bit line to a precharge potential followed by bringing the first bit line to a floating state and outputting data of one memory cell of the first NAND cell unit to the first bit line in a state in which the second bit line is fixed to a positive potential in a first data read.

The method comprises the step of: precharging the second bit line to the precharge potential followed by bringing the second bit line to the floating state and outputting data of one memory cell in the second NAND cell unit to the second bit line in a state in which the first bit line is fixed to the positive potential in a second data read. A period of time in which the precharge potential is applied to the first bit line and a period of time in which the positive potential is applied to the second bit line are substantially the same in the first data read, and a period of time in which the precharge potential is applied to the second bit line and a period of time in which the positive potential is applied to the first bit line are substantially the same in the second data read.

Each of the precharge potential and the positive potential is a power source potential, and the power source potential is simultaneously applied to the first and second bit lines from a power source in the first and second data read.

The positive potential is applied to a source-side node of the second NAND cell unit and a low potential which is lower than the positive potential is applied to a source-side node of the first NAND cell unit in the first data read, and the positive potential is applied to a source-side node of the first NAND cell unit and the low potential is applied to a source-side node of the second NAND cell unit in the second data read. Each of the precharge potential and the positive potential is a power source potential, and the low potential is a ground potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12D is a timing chart of signals in a shield line control circuit;

FIG. 12E is a timing chart of signals in a shield line control circuit;

FIG. 12F is a diagram showing a bit line control circuit;

FIG. 12G is a timing chart of signals in a bit line control circuit;

FIG. 12H is a timing chart of signals in a bit line control circuit;

DESCRIPTION OF THE PREFERRED EMBODIMENTS

A nonvolatile semiconductor memory according to the present invention will now be described with reference to the drawings.

Figure 9:
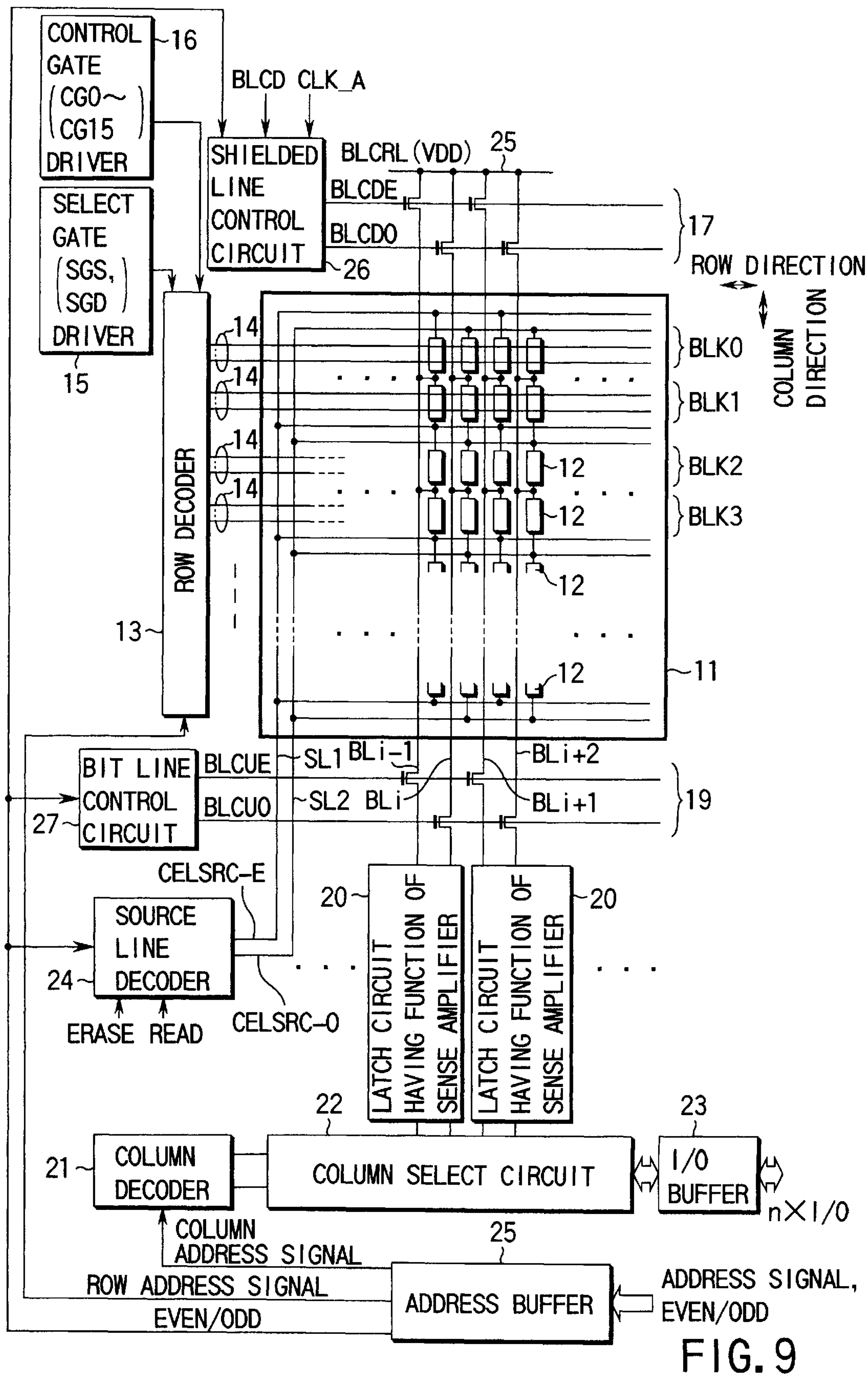
FIG. 9 is a diagram showing a first embodiment of a NAND EEPROM according to the present invention.

FIG. 9 shows a first embodiment of a NAND flash EEPROM according to the present invention and structured to read data by a shielded bit line sensing scheme.

Figure 1:
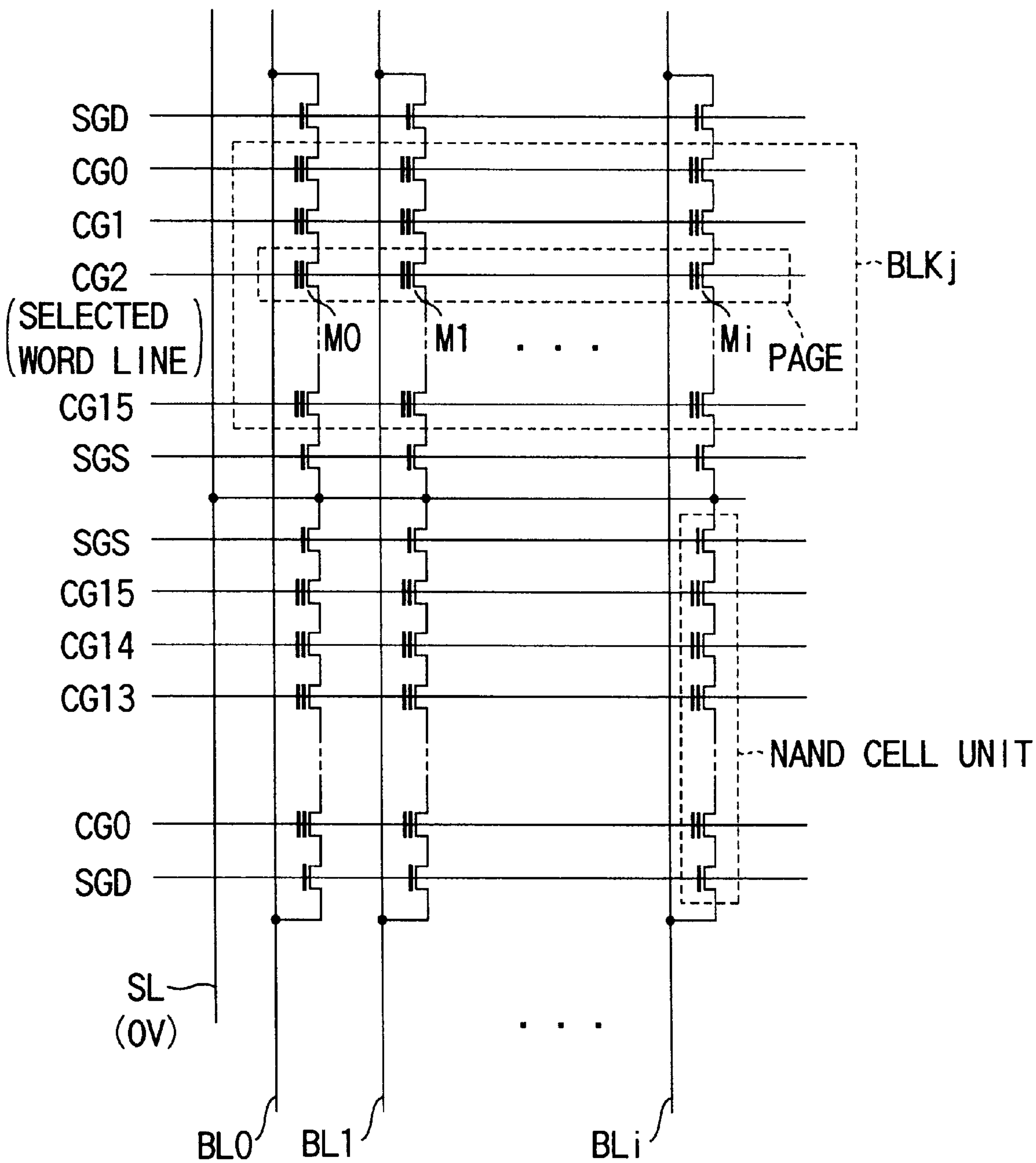
FIG. 1 is a diagram showing a memory cell array of a conventional NAND EEPROM.

A memory cell array 11 is composed of a plurality of NAND cell units 12 arranged in an array configuration. Each of the NAND cell units 12 is composed of NAND columns composed of a plurality of memory cells connected in series and two select transistors connected to both ends of the NAND column (see FIG. 1).

Line groups 14 each of which is composed of select gates SGS and SGD of select transistors extending in a row direction and word lines (control gates) CG0 to CG15 are disposed in each of BLK0, BLK1, BLK2, . . . , of the memory cell array 11. The row decoder 13 selects one block and one word line (a row) in response to a block address signal and a row address signal.

In data read, the select gate driver 15 applies VCGH (=3.5 V) to select gates SGS and SGD of select transistors at both ends of the NAND cell units in the selected block. Moreover, the select gate driver 15 applies ground potential to the select gates SGS and SGD of the select transistors at both ends of the NAND cell units in non-selected blocks. In data read, the control gate driver 16 applies VCGH (=3.5 V) to the non-selected word lines and applies ground potential (=0 V) to the selected word lines.

Source lines SL1 and SL2 are connected to an end of the NAND cell units 12. An essential portion of this embodiment is a structure that both source lines are provided. Both source lines SL1 and SL2 are disposed on the memory cell array 11 formed independently from each other and arranged to be capable of independently determining the potentials thereof. The sources (the diffusion layers) of each of the NAND cell units 12 are independently formed (which are not common to NAND cell units in a row direction) and connected to the source line SL1 or the source line SL2.

The sources (the diffusion layers) of the NAND cell units which are connected to even-numbered bit lines BL0, BL2, . . . , BLi−1, BLi+1, . . . , (where i is an odd number) are connected to the source line SL1. The sources (the diffusion layers) of the NAND cell units which are connected to odd-numbered bit lines BL1, BL3, . . . , BLi, BLi+2, . . . , (where i is an odd number) are connected to the source line SL2.

The potentials of the source lines SL1 and SL2 are determined by a source line decoder 24. For example, in data read, the source line decoder 24 makes the potential of either (a source line which is connected to a NAND cell unit connected to a bit line which serves as a select bit line) of the source line SL1 or the source line SL2 to be the ground potential. The source line decoder 24 makes the potential of the other source line (which is a source line which is connected to a NAND cell unit which is connected to a bit line which serves as a shield bit line) to be power source potential VDD (=2.5 V).

A predetermined bit line of the bit lines BLi−1, BLi, BLi+1, BLi+2, . . . , is connected to another end of the NAND cell units 12 in a column direction. An end of each of the BLi−1, BLi, BLi+1, BLi+2, . . . , is connected to a power supply line 25 through a switch circuit 17. The switch circuit 17 applies a precharge potential or a shield potential (each of which is the power source potential VDD (=2.5 V)) to the BLi−1, BLi, BLi+1, BLi+2, . . . , and brings the select bit line applied with the precharge potential to a floating state. Thus, the switch circuit 17 fixes the shield bit line to the shield potential.

The present invention has the structure that the shield potential which is applied to the shield bit line is made to be the same as the precharge potential which is applied to the select bit line. Therefore, no parasitic capacitance is caused between the shield bit line and the select bit line when precharge is performed. Therefore, a high speed precharging operation can be performed with a small electric power consumption.

Moreover, the shield potential which is applied to the shield bit line is made to be the power source potential (=2.5 V). In addition, also the potential of the source line which is connected to the NAND cell units which is connected to the shield bit line is made to be the power source potential (=2.5 V). Therefore, stress which is imposed on the memory cell in the NAND cell units which is connected to the shield bit line in data read can be relaxed.

Another end of each of the bit lines BLi−1, BLi, BLi+1, BLi+2, . . . , is connected to a latch circuit 20 having a function of a sense amplifier through a switch circuit 19. A transistor of the switch circuit 19 is turned off when precharge is performed so that the select bit line is brought to the floating state. Then, either of the signal BLCUE or BLCUO is made to be the power source potential VDD so that the select bit line and the latch circuit 20 are connected to each other.

If the bit lines BLi−1, BLi+1, . . . , are made to be the shield bit lines and the bit lines BLi, BLi+2, . . . , are made to be the select bit lines, the signal BLCUE is made to be the ground potential GND and the signal BLCUO is made to be the power source potential VDD. Thus, the potential of the select bit lines BLi, BLi+2, . . . , can be applied to the latch circuit 20 having the function of the sense amplifier.

A column decoder 21 selects one column in response to a column address signal. Data in the latch circuit 20 existing in a selected column is supplied to an I/O buffer 23 through a column select circuit 22.

If n memory cell arrays 11, n I/O buffers and n I/O pads exist in one chip, n-bit data can simultaneously be transmitted to the outside of the chip.

A row address signal is supplied to a row decoder 13 through an address buffer 25. A column address signal is supplied to a column decoder 21 through the address buffer 25. An EVEN/ODD signal is supplied to a source line decoder 24, a shielded line control circuit 26 and a bit line control circuit 27 through the address buffer 25.

The source line decoder 24 determines the potential (the power source potential VDD or the ground potential GND) of each of two source lines SL1 and SL2 in response to erase mode signal ERASE, read mode signal READ and the EVEN/ODD signal. Control signal BLCD, clock signal CLK_A and the EVEN/ODD signal are supplied to a shielded line control circuit 26. Signals BCLDE and BLCDO are transmitted from the shielded line control circuit 26. Control signal BLCU and the EVEN/ODD signal are supplied to a bit line control circuit 27. Signals BLCUE and BLCUO are transmitted from the bit line control circuit 27.

A shielded bit line sensing scheme using the NAND flash EEPROM shown in FIG. 9 will now be described.

Initially, a first read operation is performed.

Both of the signals BLCUE and BLCUO are made to be the ground potential GND so that all of the transistors of the switch circuit 19 are turned off. When even-numbered bit lines BLi−1, BLi+1, . . . , (where i is an odd number) are made to be the shield bit lines and odd-numbered bit lines BLi, BLi+2, . . . , are made to be the select bit lines, both of the signals BLCDE and BLCDO are made to be the power source potential VDD so that all of the transistors of the switch circuit 17 are turned on. As a result, the shield bit lines BLi−1, BLi+1, . . . , are set to be the shield potential (power source potential VDD (=2.5 V)). The select bit lines BLi, BLi+2, . . . , are precharged to the precharge potential (power source potential VDD (=2.5 V)).

Then, the signal BLCUO is made to be the ground potential GND so that the select bit lines BLi, BLi+2, . . . , are brought to the floating state. If the power source potential VDD of the signal BLCUE is maintained, the shield bit lines BLi−1, BLi+1, . . . , can be fixed to the power source potential VDD.

Then, a source line decoder 24 is operated so that a signal CELSRC-E is made to be the power source potential VDD. On the other hand, signal CELSRC-O is made to be the ground potential GND. As a result, the sources of the NAND cell units which are connected to the shield bit lines BLi−1, BLi+1, . . . , are applied with the power source potential VDD. On the other hand, the sources of the NAND cell units which are connected to the select bit lines BLi, BLi+2, . . . , are applied with the ground potential GND.

Then, the row decoder 13 selects one block in response to the block address signal. The select gate driver 15 applies VCGH (=3.5 V) to select gates SGS and SGD of the select transistors at both ends of the NAND cell units in the selected blocks and applies ground potential GND (=0 V) to the select gates SGS and SGD of the select transistors at both ends of the NAND cell units in the non-selected blocks. The control gate driver 16 applies VCGH (=3.5 V) to the non-selected word lines and applies ground potential (=0 V) to the selected word lines.

When data in the memory cell connected to the selected word line is “0” (when the threshold voltage is higher than 0 V), the select bit lines BLi, BLi+2, . . . , maintain the precharge potential. When data in the memory cell connected to the selected word lines is “1” (when the threshold voltage is lower than 0 V), electric charges are discharged. Thus, the potential is made to be the ground potential.

Then, the signal BLCUO is made to be the power source potential so that data transmitted to the select bit lines BLi, BLi+2, . . . , is supplied to the latch circuit 20 having the function of the sense amplifier. Data from the latch circuit 20 is supplied to the I/O buffer 23 through the column select circuit 22, and then transmitted to the outside of the chip.

Then, the select bit lines and the shield bit lines are interchanged, that is, the bit lines BLi, BLi+2, . . . , are made to be the shield bit lines. Moreover, the bit lines BLi−1, BLi+1, . . . , are made to be the select bit lines. Then, a second read operation is performed.

Both of the signals BLCUE and BLCUO are made to be the ground potential GND so that all of the transistors of the switch circuit 19 are turned off. When even-numbered bit lines BLi−1, BLi+1, . . . , (where i is an odd number) are made to be the select bit lines and odd-numbered bit lines BLi, BLi+2, . . . , are made to be the shield bit lines, both of the signals BLCDE and BLCDO are made to be the ground potential GND so that all of the transistors of the switch circuit 17 are turned on. As a result, the shield bit lines BLi, BLi+2, . . . , are set to be the shield potential (the power source potential VDD (=2.5 V)). On the other hand, the select bit lines BLi−1, BLi+1, . . . , are precharged to the precharge potential (power source potential VDD (=2.5 V)).

Then, the signal BLCDE is made to be the ground potential GND and the shield bit lines BLi−1, BLi+1, . . . , are brought to the floating state. When the power source potential VDD of the signal BLCDO is maintained, the shield bit lines BLi, BLi+2, . . . , can be fixed to the power source potential VDD.

Then, the source line decoder 24 is operated so that the signal CELSRC-O is made to be the power source potential VDD and the signal CELSRC-E is made to be the ground potential GND. As a result, the sources of the NAND cell units which are connected to the shield bit lines BLi, BLi+2, . . . , are applied with the power source potential VDD. On the other hand, the sources of the NAND cell units which are connected to the select bit lines BLi−1, BLi+1, . . . , are applied with the ground potential GND.

Then, the row decoder 13 selects one block and one word line (a row) in response to the block address signal and the row address signal. The select gate driver 15 applies VCGH (=3.5 V) to the select gates SGS and SGD of the select transistors at both ends of the NAND cell units in the selected bit line and applies the ground potential (=0 V) to the select gates SGS and SGD of the select transistors at both ends of the NAND cell units in the non-selected blocks. The control gate driver 16 applies VCGH (=3.5 V) to the non-selected word lines and applies the ground potential (=0 V) to the selected word lines.

When data in the memory cell connected to the selected word line is “0” (when the threshold voltage is higher than 0 V), the select bit lines BL−1, BLi+1, . . . , maintain the precharge potential. When data in the memory cell connected to the selected word lines is “1” (when the threshold voltage is lower than 0 V), electric charges are discharged. Thus, the potential is made to be the ground potential.

Then, the state is made to be the ground potential so that data transmitted to the select bit lines BLi−1, BLi+1, . . . , is supplied to the latch circuit 20 having the function of the sense amplifier. Data from the latch circuit 20 is supplied to the I/O buffer 23 through the column select circuit 22, and then transmitted to the outside of the chip.

The NAND flash EEPROM and the data reading method have the structure that the shield bit lines are not set to be the ground potential GND. The shield bit lines are set to be the power source potential VDD which is the same as the precharge potential of the select bit lines. Therefore, when the select bit lines are precharged, no parasitic capacitance is caused between adjacent bit lines, that is, between the select bit line and the shield bit line. As a result, a high speed precharging operation can be performed with low power consumption (see FIG. 13A).

Moreover, the sources of the NAND cell units which are connected to the select bit lines are applied with the ground potential GND. On the other hand, the sources of the NAND cell units which are connected to the shield bit lines are applied with the power source potential VDD. Therefore, the potential of the select bit line maintains the precharge potential or changes to the ground potential in accordance with data (the threshold voltage) in the selected memory cell. Therefore, a usual data read operation can be performed. On the other hand, the sources and drains of the NAND cell units which are connected to the shield bit lines are commonly applied with the power source potential VDD. Therefore, stress which is imposed on the memory cells of the NAND cell units which are connected to the shield bit lines can be relaxed.

Figure 13A:
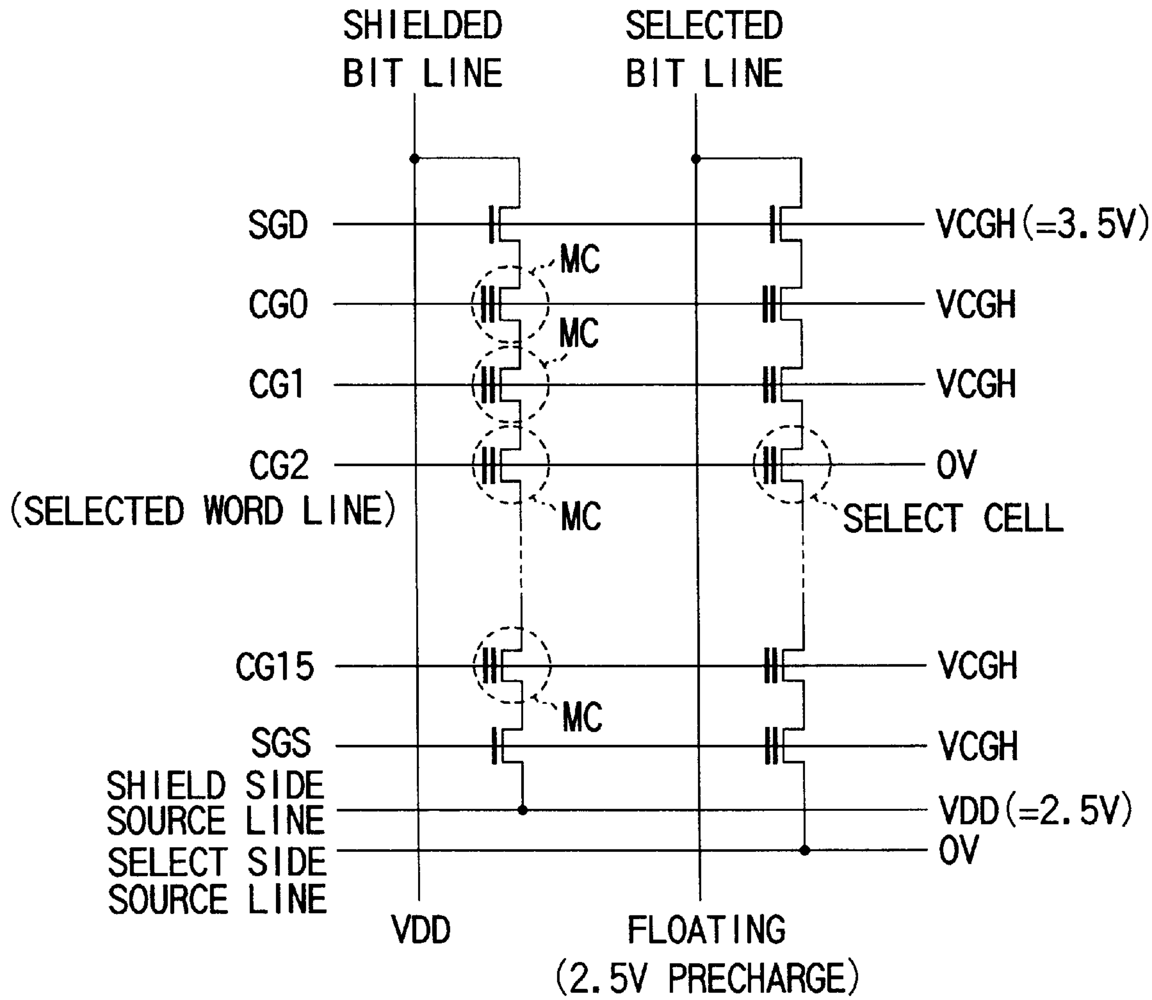
FIG. 13A is a diagram showing potentials which are applied to memory cells when a read operation is performed.
Figure 13B:
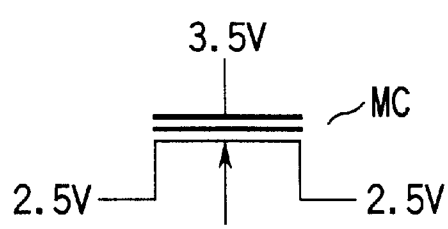
FIG. 13B is a diagram showing a potential which are applied to a non-select cell which is connected to a shield bit line when a read operation is performed.

In an example NAND cell unit which is connected to the shield bit line as shown in FIGS. 13A and 13B, stress of a potential difference of 1.0 V (VCGH-VDD) is imposed between the channels of the memory cell MC, which is connected to the non-selected word lines (the control gates) CG0, CG1 and CG3 to CG15, and the control gate.

Figure 2:
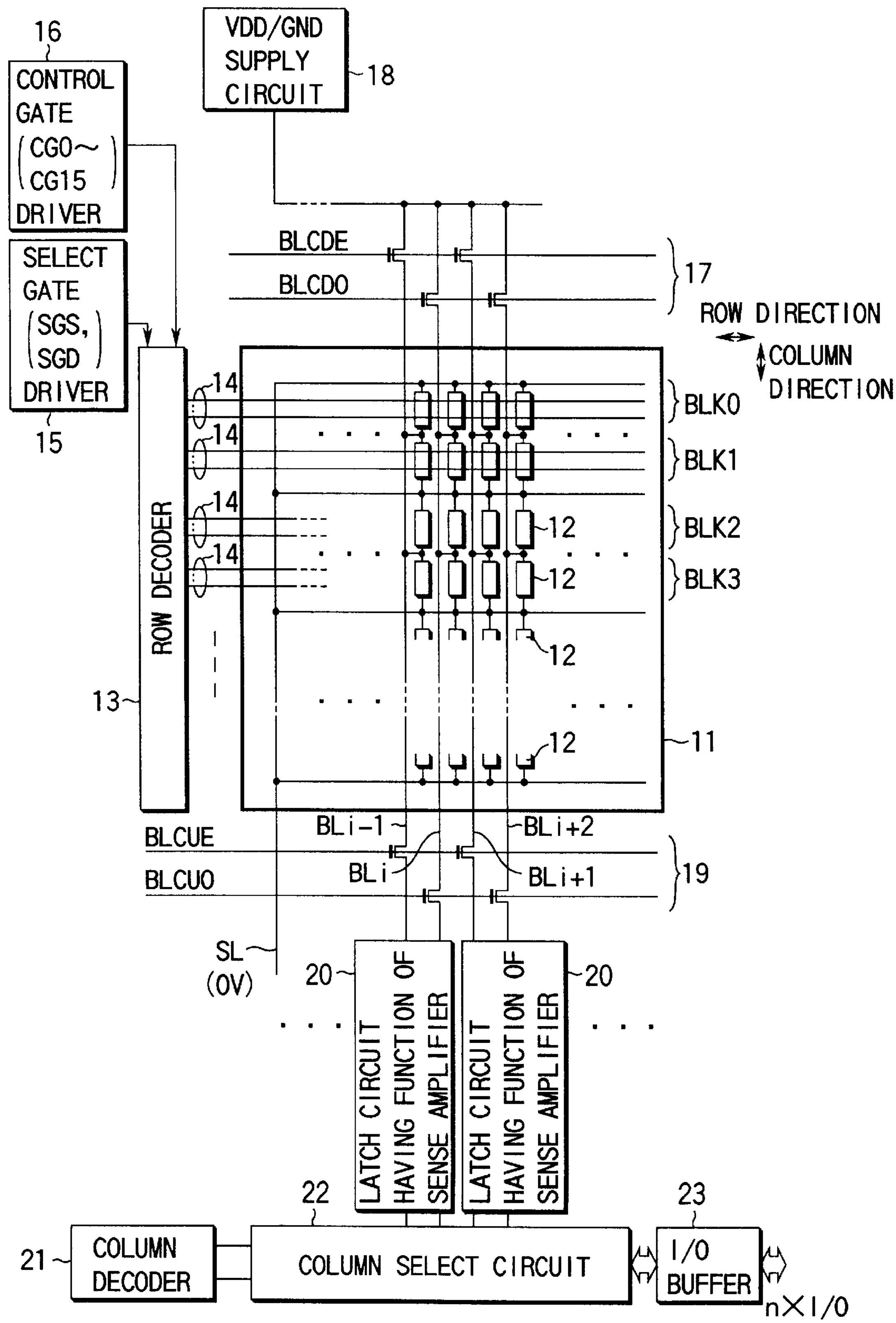
FIG. 2 is a diagram showing the conventional NAND EEPROM.
Figure 3:
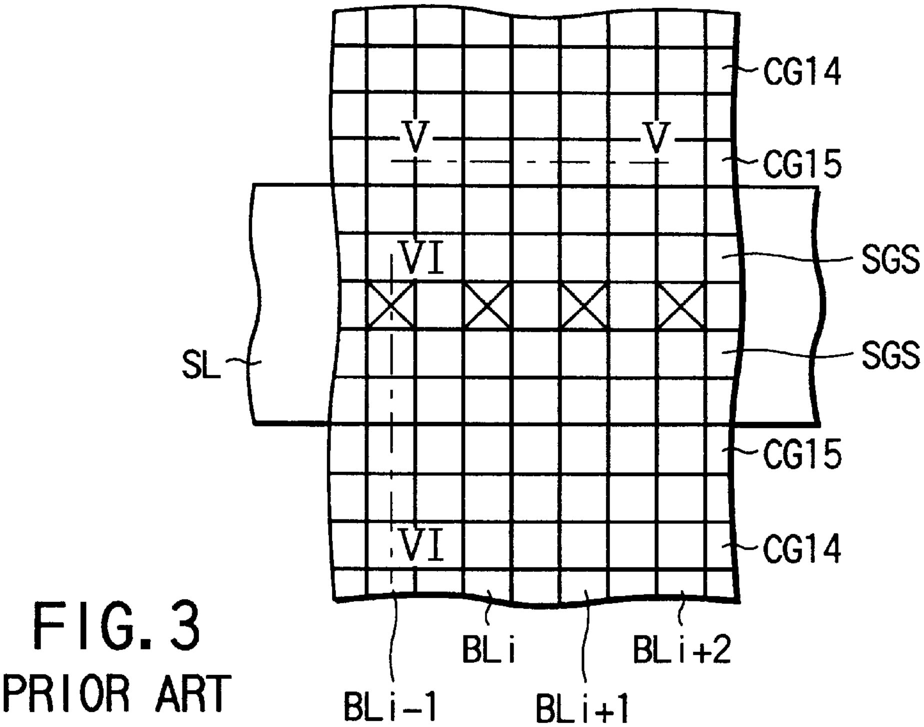
FIG. 3 is a diagram showing a layout of a conventional memory cell array section.
Figure 4:
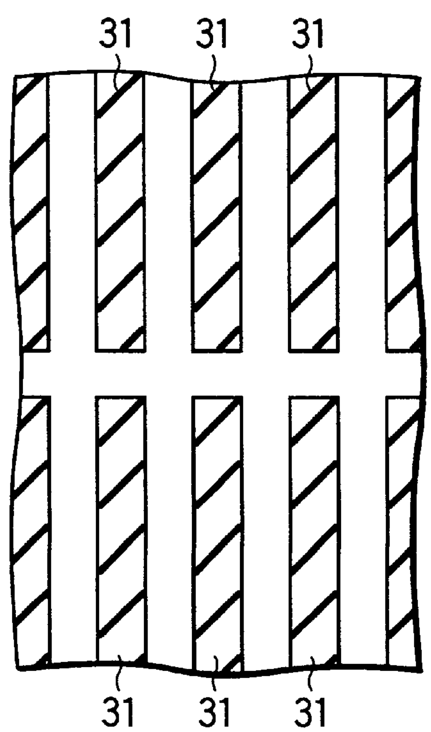
FIG. 4 is a diagram showing a layout of a conventional device isolation film.
Figure 5:
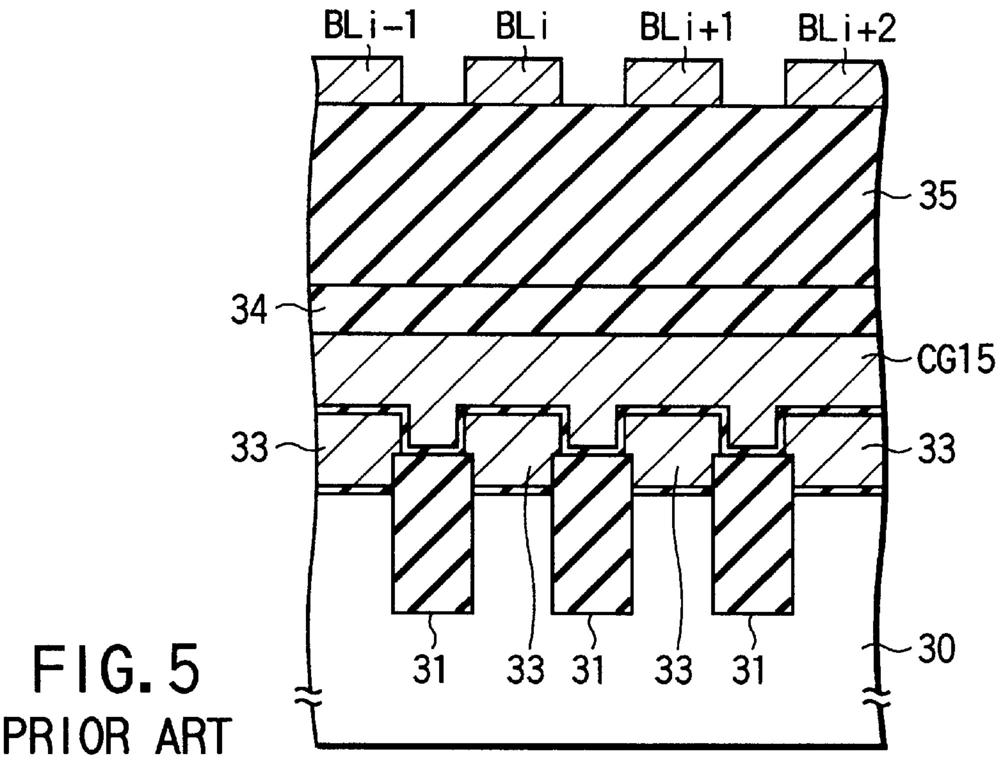
FIG. 5 is a cross sectional view taken along line V—V shown in FIG. 3.
Figure 6:
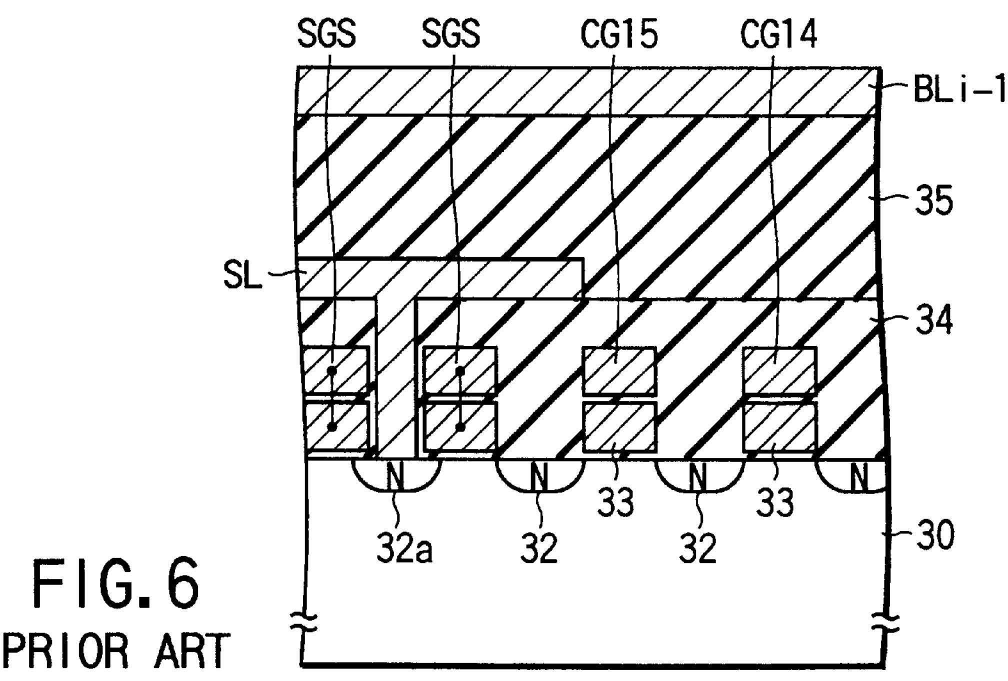
FIG. 6 is a cross sectional view taken along line VI—VI shown in FIG. 3.
Figure 7:
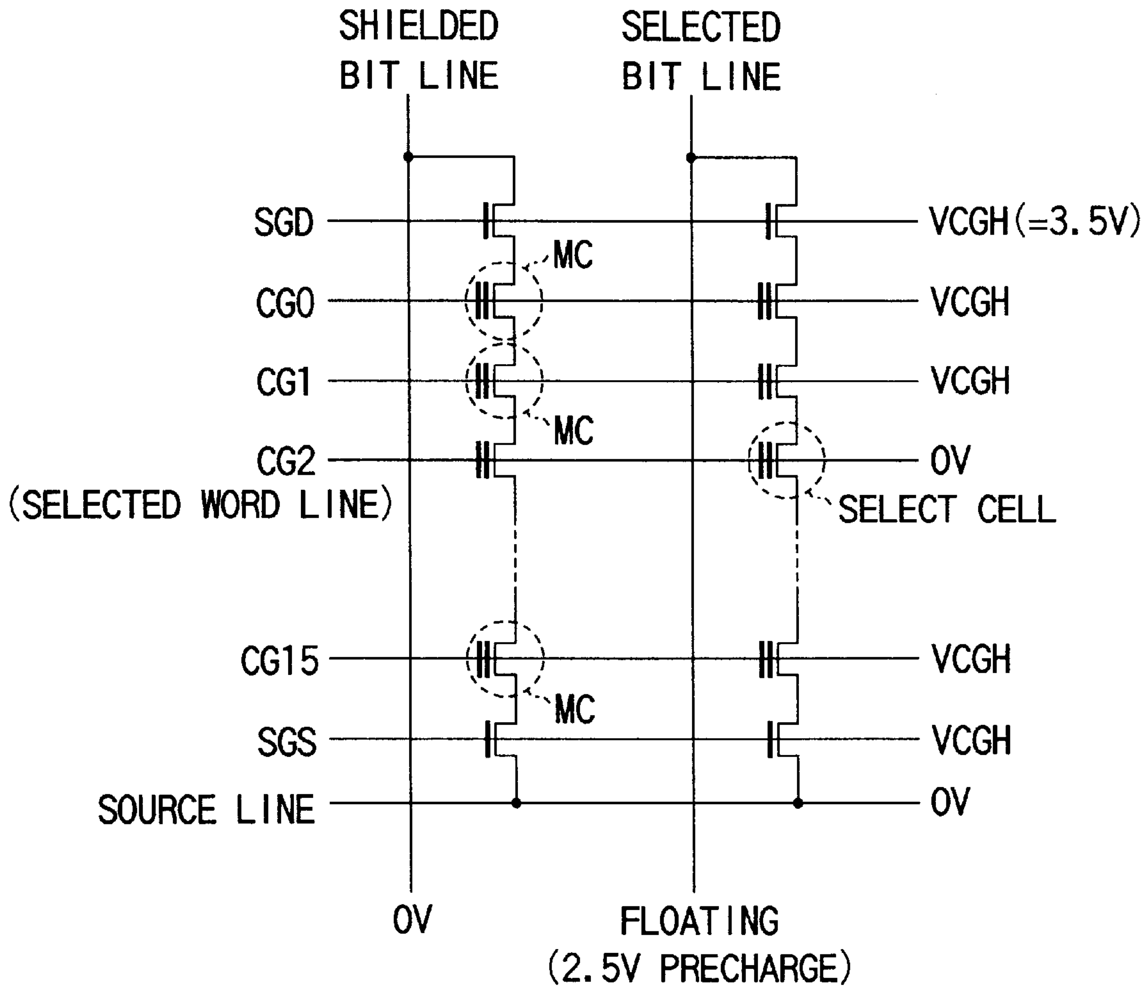
FIG. 7 is a diagram showing potentials which are applied to a memory cell when a read operation is performed.
Figure 8:
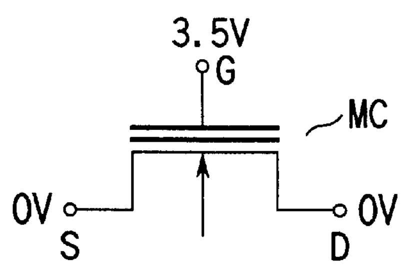
FIG. 8 is a diagram showing a potential which are applied to a non-select cell which is connected to a shield bit line when a read operation is performed.

Moreover, the circuit according to the present invention has the structure that the select bit lines are precharged to the power source potential VDD and the shield bit lines are fixed to the power source potential VDD. Therefore, the VDD/GND apply circuit 18 as shown in FIG. 2 is not required. Therefore, the size of the circuit of the memory is not enlarged.

Figure 45:
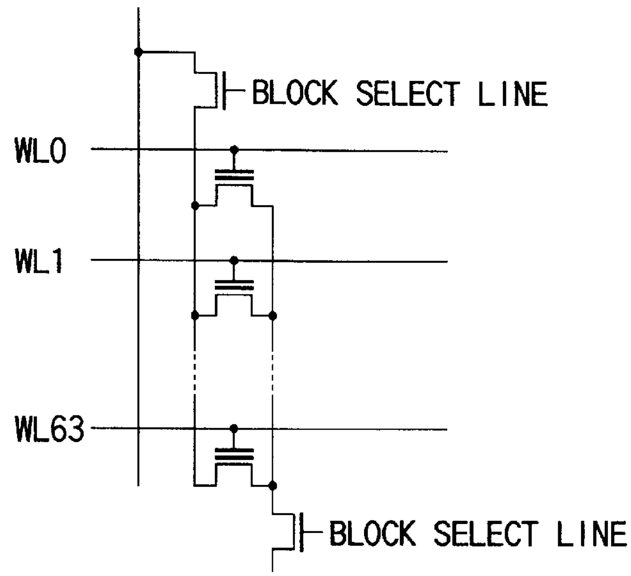
FIG. 45 is a diagram showing an AND EEPROM.
Figure 46:
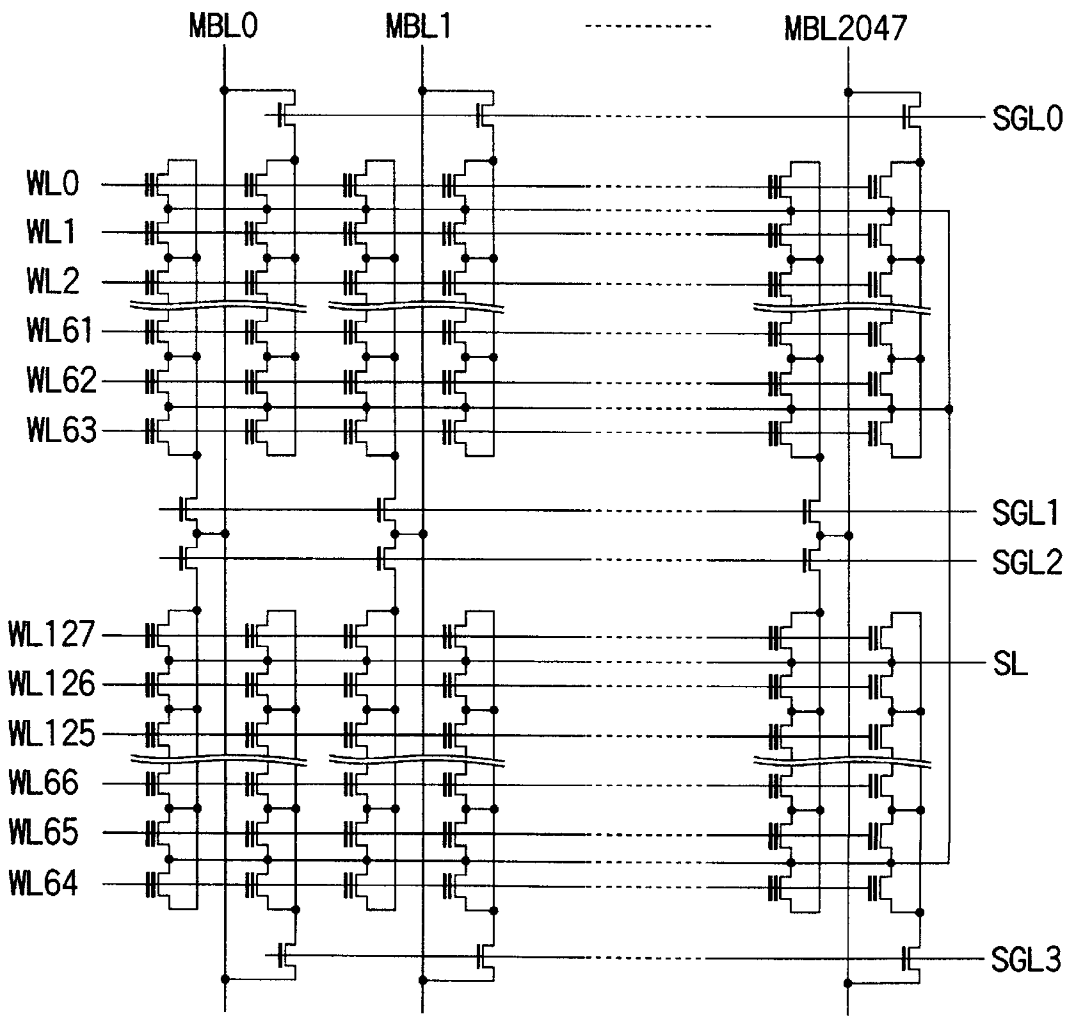
FIG. 46 is a diagram showing a DINOR EEPROM.

Although the NAND flash EEPROM has been described in this embodiment, the present invention may be applied to memories, such as a NOR type flash EEPROM, an AND type flash EEPROM (see FIG. 45) and a DINOR type flash EEPROM (see FIG. 46), for performing a dynamic data read operation.

Figure 10:
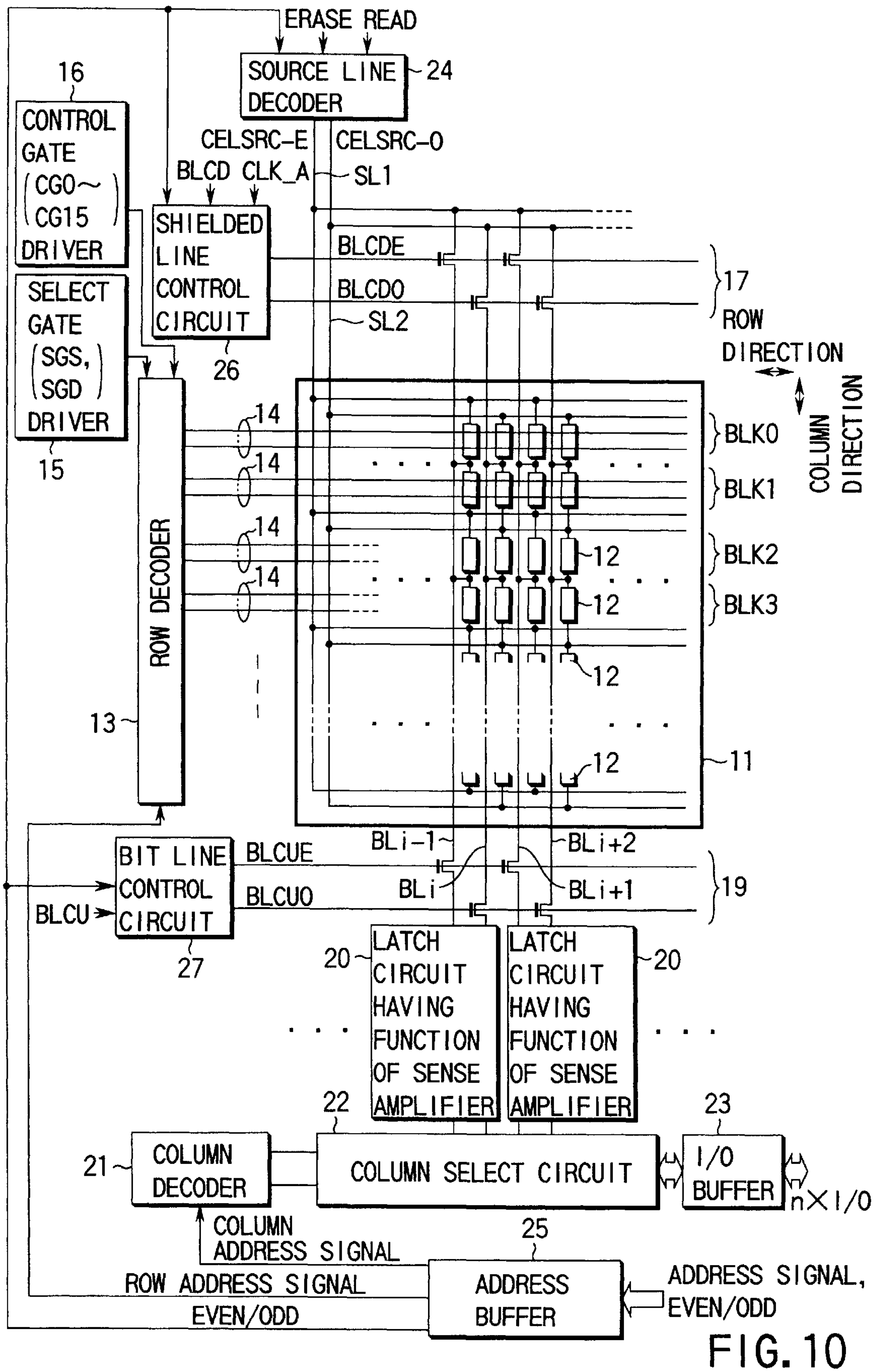
FIG. 10 is a diagram showing a second embodiment of the NAND EEPROM according to the present invention.

FIG. 10 shows a second embodiment of the NAND flash EEPROM to which the shielded bit line sensing scheme is applied in data read.

The memory according to this embodiment which is different from the memory according to the first embodiment will now be described. The source line decoder 24 according to this embodiment also serves as a circuit for applying a potential to the bit lines (the select bit lines and the shield bit lines).

The structure of the memory according to this embodiment will now be described.

The memory cell array 11 is composed of a plurality of NAND cell units 12 arranged in an array configuration.

A memory cell array 11 is composed of a plurality of NAND cell units 12 arranged in an array configuration. Each of the NAND cell units 12 is composed of NAND columns composed of a plurality of memory cells connected in series and two select transistors connected to both ends of the NAND column (see FIG. 1).

Line groups 14 each of which is composed of select gates SGS and SGD of select transistors extending in a row direction and word lines (control gates) CG0 to CG15 are disposed in each of BLK0, BLK1, BLK2, . . . , of the memory cell array 11. The row decoder 13 selects one block and one word line (a row) in response to a block address signal and a row address signal.

In data read, the select gate driver 15 applies VCGH (=3.5 V) to select gates SGS and SGD of select transistors at both ends of the NAND cell units in the selected block. Moreover, the select gate driver 15 applies ground potential to the select gates SGS and SGD of the select transistors at both ends of the NAND cell units in non-selected blocks. In data read, the control gate driver 16 applies VCGH (=3.5 V) to the non-selected word lines and applies ground potential (=0 V) to the selected word lines.

Source lines SL1 and SL2 are connected to an end of the NAND cell units 12. An essential portion of this embodiment is a structure that both source lines are provided similarly to the first embodiment. Both source lines SL1 and SL2 are disposed on the memory cell array 11 independently from each other and arranged to be capable of independently determining the potentials thereof. The sources (the diffusion layers) of each of the NAND cell units 12 are independently formed (which are not common to NAND cell units in a row direction) and connected to the source line SL1 or the source line SL2.

The sources (the diffusion layers) of the NAND cell units which are connected to even-numbered bit lines BL0, BL2, . . . , BLi−1, BLi+1, . . . , (where i is an odd number) are connected to the source line SL1. The sources (the diffusion layers) of the NAND cell units which are connected to odd-numbered bit lines BL1, BL3, . . . , BLi, BLi+2, . . . , (where i is an odd number) are connected to the source line SL2.

The potentials of the source lines SL1 and SL2 are determined by a source line decoder 24. For example, in data read, the source line decoder 24 makes the potential of either (a source line which is connected to a bit line which serves as a select bit line) of the source line SL1 or the source line SL2 to be the ground potential. The source line decoder 24 makes the potential of the other source line (which is a source line which is connected to a NAND cell unit which is connected to a bit line which serves as a shield bit line) to be power source potential VDD (=2.5 V).

A predetermined bit line of the bit lines BLi−1, BLi, BLi+1, BLi+2, . . . , is connected to another end of the NAND cell units 12 in a column direction. The even-numbered bit lines BL0, BL2, . . . , BLi−1, BLi+1, . . . , (where i is an odd number) are connected to the source line SL1 through the switch circuit 17. Odd-numbered bit lines BL1, BL3, . . . , BLi, BLi+2, . . . , (where i is an odd number) are connected to the source line SL2 through the switch circuit 17.

That is, this embodiment is characterized in that the power source potential VDD (=2.5 V) generated in the source line decoder 24 is used to apply the shield potential to the shield bit lines and the precharge potential is applied to the select bit lines. When the shield potential and the precharge potential are applied, both of the signals BLCDE and BLCDO are made to be the power source potential. Thus, all of the transistors of the switch circuit 17 are turned on.

The switch circuit 17 applies the precharge potential or the shield potential (which are the power source potential VDD (=2.5 V)) common to the bit lines BLi−1, BLi, BLi+1, BLi+2, . . . , and brings the select bit lines applied with the precharge potential to the floating state. Thus, the switch circuit 17 fixes the shield bit lines to the shield potential.

As described above, this embodiment has the structure that the shield potential, which is applied to the shield bit lines, is made to be the same as the precharge potential which is applied to the select bit lines, similarly to the first embodiment. Therefore, no parasitic capacitance is caused between the shield bit lines and the select bit lines when precharge is performed. Therefore, a high speed precharging operation can be performed with low power consumption.

Moreover, the shield potential which is applied to the shield bit lines is made to be the power source potential (=2.5 V). In addition, also the potential of the source lines, which are connected to the NAND cell units which are connected to the shield bit lines, is made to be the power source potential (=2.5 V) as described above. Therefore, stress which is imposed on the memory cells in the NAND cell units which are connected to the shield bit lines in data read can be relaxed (see FIGS. 12 and 13).

The other ends of the bit lines BLi−1, BLi, BLi+1, BLi+2, . . . , are connected to the latch circuit 20 having the function of the sense amplifier through the switch circuit 19. The transistors of the switch circuit 19 are turned off when precharge is performed. Thus, the select bit lines are brought to the floating state. Then, either of the signal BLCUE or BLCUO is made to be the power source potential VDD so that the select bit lines and the latch circuit 20 are connected to each other.

If the bit lines BLi−1, BLi+1, . . . , are made to be the shield bit lines and the bit lines BLi, BLi+2, . . . , are made to be the select bit lines, the signal BLCUE is made to be the ground potential GND and the signal BLCUO is made to be the power source potential VDD. Thus, the potential of the select bit lines BLi, BLi+2, . . . , can be applied to the latch circuit 20 having the function of the sense amplifier.

The column decoder 21 selects one column in response to the column address signal. Data in the latch circuit 20 existing in the selected column is supplied to the I/O buffer 23 through the column select circuit 22.

A row address signal is supplied to a row decoder 13 through an address buffer 25. A column address signal is supplied to a column decoder 21 through the address buffer 25. An EVEN/ODD signal is supplied to a source line decoder 24, a shielded line control circuit 26 and a bit line control circuit 27 through the address buffer 25.

The source line decoder 24 determines the potential (the power source potential VDD or the ground potential GND) of each of two source lines SL1 and SL2 in response to erase mode signal ERASE, read mode signal READ and the EVEN/ODD signal. Control signal BLCD, clock signal CLK and the EVEN/ODD signal are supplied to a shielded line control circuit 26. Signals BCLDE and BLCDO are transmitted from the shielded line control circuit 26. Control signal BLCU and the EVEN/ODD signal are supplied to a bit line control circuit 27. Signal BLCUE and BLCUO are transmitted from the bit line control circuit 27.

Figure 11:
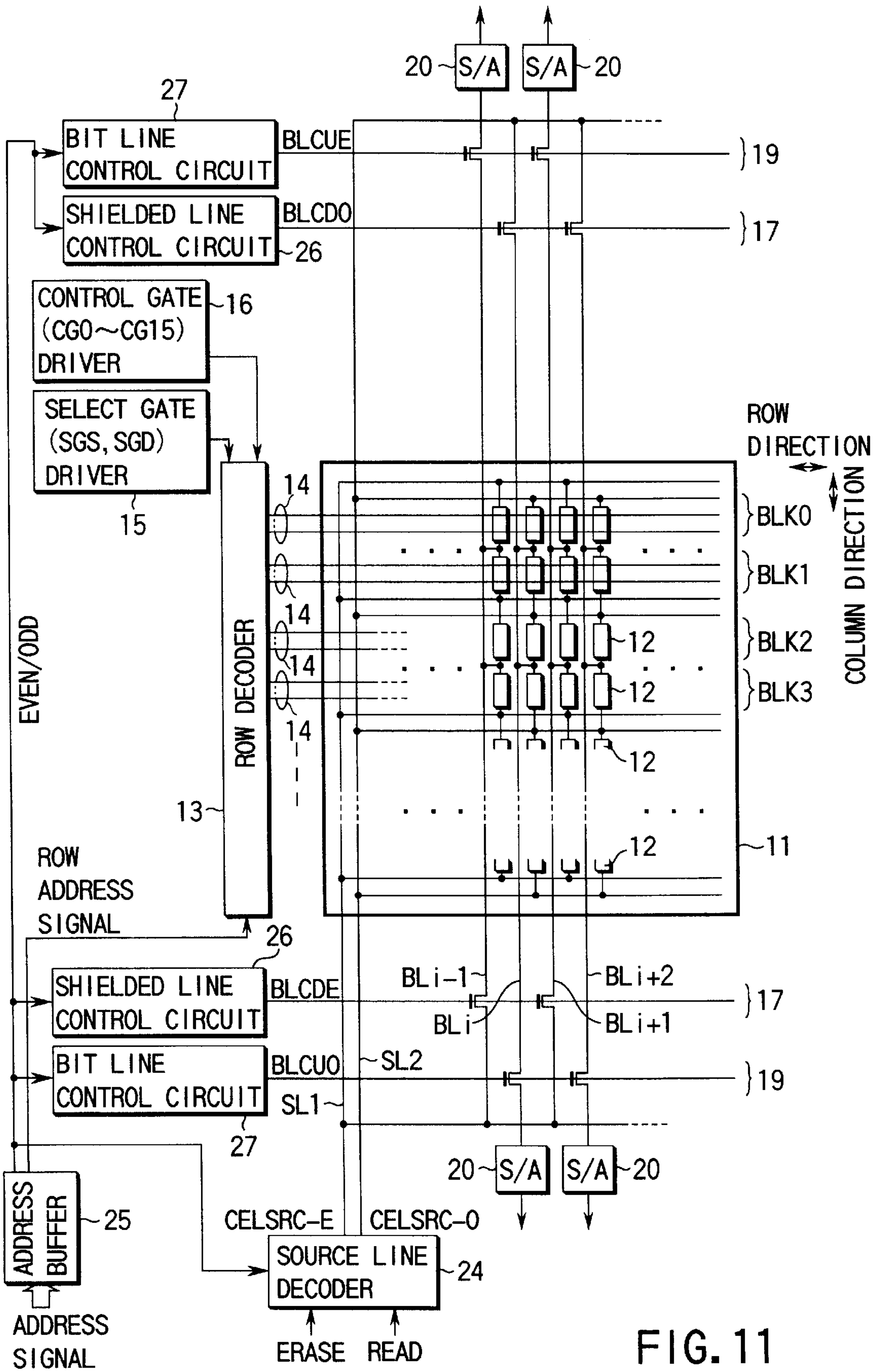
FIG. 11 is a diagram showing a third embodiment of the NAND EEPROM according to the present invention.

FIG. 11 shows a third embodiment of the NAND flash EEPROM to which the shielded bit line sensing scheme is applied in data read.

The memory according to this embodiment is different from the memories according to the first and second embodiments in that only one sense amplifier is connected to one bit line. That is, the memory according to this embodiment is not adapted to a so-called shared sense amplifier system in which two bit lines share one sense amplifier.

The structure of the memory according to this embodiment will now be described.

A memory cell array 11 is composed of a plurality of NAND cell units 12 arranged in an array configuration. Each of the NAND cell units 12 is composed of NAND columns composed of a plurality of memory cells connected in series and two select transistors connected to both ends of the NAND column (see FIG. 1).

Line groups 14 each of which is composed of select gates SGS and SGD of select transistors extending in a row direction and word lines (control gates) CG0 to CG15 are disposed in each of BLK0, BLK1, BLK2, . . . , of the memory cell array 11. The row decoder 13 selects one block and one word line (a row) in response to a block address signal and a row address signal.

In data read, the select gate driver 15 applies VCGH (=3.5 V) to select gates SGS and SGD of select transistors at both ends of the NAND cell units in the selected block. Moreover, the select gate driver 15 applies ground potential to the select gates SGS and SGD of the select transistors at both ends of the NAND cell units in non-selected blocks. In data read, the control gate driver 16 applies VCGH (=3.5 V) to the non-selected word lines and applies ground potential (=0 V) to the selected word lines.

Source lines SL1 and SL2 are connected to an end of the NAND cell units 12. An essential portion of this embodiment is a structure that both source lines are provided. Both source lines SL1 and SL2 are disposed on the memory cell array 11 independently from each other and arranged to be capable of independently determining the potentials thereof. The sources (the diffusion layers) of each of the NAND cell units 12 are independently formed (which are not common to NAND cell units in a row direction) and connected to the source line SL1 or the source line SL2.

The sources (the diffusion layers) of the NAND cell units which are connected to even-numbered bit lines BL0, BL2, . . . , BLi−1, BLi+1, . . . , (where i is an odd number) are connected to the source line SL1. The sources (the diffusion layers) of the NAND cell units which are connected to odd-numbered bit lines BL1, BL3, . . . , BLi, BLi+2, . . . , (where i is an odd number) are connected to the source line SL2.

The potentials of the source lines SL1 and SL2 are determined by a source line decoder 24. For example, in data read, the source line decoder 24 makes the potential of either (a source line which is connected to a bit line which serves as a select bit line) of the source line SL1 or the source line SL2 to be the ground potential. The source line decoder 24 makes the potential of the other source line (which is a source line which is connected to a NAND cell unit which is connected to a bit line which serves as a shield bit line) to be power source potential VDD (=2.5 V).

A predetermined bit line of the bit lines BLi−1, BLi, BLi+1, BLi+2, . . . , is connected to another end of the NAND cell units 12 in a column direction. The even-numbered BL0, BL2, . . . , BLi−1, BLi+1, . . . , (where i is an odd number) are connected to the source line SL1 through the switch circuit 17. Odd-numbered bit lines BL1, BL3, . . . , BLi, BLi+2, . . . , (where i is an odd number) are connected to the source line SL2 through the switch circuit 17.

That is, this embodiment is characterized in that the power source potential VDD (=2.5 V) generated in the source line decoder 24 is used to apply the shield potential to the shield bit lines and the precharge potential is applied to the select bit lines. When the shield potential and the precharge potential are applied, both of the signals BLCDE and BLCDO are made to be the power source potential. Thus, all of the transistors of the switch circuit 17 are turned on.

The switch circuit 17 applies the precharge potential or the shield potential (which are the power source potential VDD (=2.5 V)) common to the bit lines BLi−1, BLi, BLi+1, BLi+2, . . . , and brings the select bit lines applied with the precharge potential to the floating state. Thus, the switch circuit 17 fixes the shield bit lines to the shield potential.

As described above, the present invention has the structure that the shield potential, which is applied to the shield bit lines, is made to be the same as the precharge potential which is applied to the select bit lines. Therefore, no parasitic capacitance is caused between the shield bit lines and the select bit lines when precharge is performed. Therefore, a high speed precharging operation can be performed with low power consumption.

Moreover, the shield potential which is applied to the shield bit lines is made to be the power source potential (=2.5 V). In addition, also the potential of the source lines, which are connected to the NAND cell units which are connected to the shield bit lines, is made to be the power source potential (=2.5 V) as described above. Therefore, stress which is imposed on the memory cells in the NAND cell units which are connected to the shield bit lines in data read can be relaxed (see FIGS. 12 and 13).

The other ends of the bit lines BLi−1, BLi, BLi+1, BLi+2, . . . , are connected to the latch circuit 20 having the function of the sense amplifier through the switch circuit 19. The transistors of the switch circuit 19 are turned off when precharge is performed. Thus, the select bit lines are in the floating state. Then, either of the signal BLCUE or BLCUO is made to be the power source potential VDD so that the select bit lines and the latch circuit 20 are connected to each other.

If the bit lines BLi−1, BLi+1, . . . , are made to be the shield bit lines and the bit lines BLi, BLi+2, . . . , are made to be the select bit lines, the signal BLCUE is made to be the ground potential GND and the signal BLCUO is made to the power source potential VDD. Thus, the potential of the select bit lines BLi, BLi+2, . . . , can be applied to the latch circuit 20 having the function of the sense amplifier.

The column decoder 21 selects one column in response to the column address signal. Data in the latch circuit 20 existing in the selected column is supplied to the I/O buffer 23 through the column select circuit 22.

A row address signal is supplied to a row decoder 13 through an address buffer 25. A column address signal is supplied to a column decoder 21 through the address buffer 25. An EVEN/ODD signal is supplied to a source line decoder 24, a shielded line control circuit 26 and a bit line control circuit 27 through the address buffer 25.

The source line decoder 24 determines the potential (the power source potential VDD or the ground potential GND) of each of two source lines SL1 and SL2 in response to erase mode signal ERASE, read mode signal READ and the EVEN/ODD signal. Control signal BLCD, clock signal CLK_A and the EVEN/ODD signal are supplied to a shielded line control circuit 26. Signals BCLDE and BLCDO are transmitted from the shielded line control circuit 26. Control signal BLCU and the EVEN/ODD signal are supplied to a bit line control circuit 27. Signal BLCUE and BLCUO are transmitted from the bit line control circuit 27.

A shielded bit line sensing scheme which is adapted to the NAND flash EEPROM shown in FIGS. 10 and 11 will now be described.

Initially, a first read operation is performed.

Both of the signals BLCUE and BLCUO are made to be the ground potential GND so that all of the transistors of the switch circuit 19 are turned off. When even-numbered bit lines BLi−1, BLi+1, . . . , (where i is an odd number) are made to be the shield bit lines and odd-numbered bit lines BLi, BLi+2, . . . , are made to be the select bit lines, the source line decoder 24 makes both of the signal CELSRC-E and CELSRC-O to be the power source potential VDD. Moreover, the source line decoder 24 makes both of the signals BLCDE and BLCDO to be the power source potential VDD. Thus, all of the transistors in the switch circuit 17 are turned on. As a result, the shield bit lines BLi−1, BLi+1, . . . , are set to be the shield potential (power source potential VDD (=2.5 V)). The select bit lines BLi, BLi+2, . . . , are precharged to the precharge potential (power source potential VDD (=2.5 V)).

Then, the signal BLCUO is made to be the ground potential GND so that the select bit lines BLi, BLi+2, . . . , are brought to the floating state. If the power source potential VDD of the signal BLCUE is maintained, the shield bit lines BLi−1, BLi+1, . . . , can be fixed to the power source potential VDD.

Then, a source line decoder 24 is operated so that a signal CELSRC-E is made to be the power source potential VDD. On the other hand, signal CELSRC-O is made to be the ground potential GND. As a result, the sources of the NAND cell units which are connected to the shield bit lines BLi−1, BLi+1, . . . , are applied with the power source potential VDD. On the other hand, the sources of the NAND cell units which are connected to the select bit lines BLi, BLi+2, . . . , are applied with the ground potential GND.

Then, the row decoder 13 selects one block and one word line (a row) in response to the block address signal and the row address signal. The select gate driver 15 applies VCGH (=3.5 V) to select gates SGS and SGD of the select transistors at both ends of the NAND cell units in the selected block and applies ground potential GND (=0 V) to the select gates SGS and SGD of the select transistors at both ends of the NAND cell units in the non-selected block. The control gate driver 16 applies VCGH (=3.5 V) to the non-selected word lines and applies ground potential (=0 V) to the selected word lines.

When data in the memory cell connected to the selected word line is "0" (when the threshold voltage is higher than 0 V), the select bit lines BLi, BLi+2, . . . , maintain the precharge potential. When data in the memory cell connected to the selected word lines is "1" (when the threshold voltage is lower than 0 V), electric charges are discharged. Thus, the potential is made to be the ground potential.

Then, the signal BLCUO is made to be the power source potential so that data transmitted to the select bit lines BLi, BLi+2, . . . , is supplied to the latch circuit 20 having the function of the sense amplifier. Data from the latch circuit 20 is supplied to the I/O buffer 23 through the column select circuit 22, and then transmitted to the outside of the chip.

Then, the select bit lines and the shield bit lines are interchanged, that is, the bit lines BLi, BLi+2, . . . , are made to be the shield bit lines. Moreover, the bit lines BLi−1, BLi+1, are made to be the select bit lines. Then, a second read operation is performed.

Both of the signals BLCUE and BLCUO are made to be the ground potential GND so that all of the transistors of the switch circuit 19 are turned off. When even-numbered bit lines BLi−1, BLi+1, . . . , (where i is an odd number) are made to be the select bit lines and odd-numbered bit lines BLi, BLi+2, . . . , are made to be the shield bit lines, the source line decoder 24 makes both of the signals CELSRC-E and CELSRC-O to be the ground potential GND. The source line decoder 24 makes both of the signal BLCDE and BLCDO to be the power source potential VDD so that all of the transistors of the switch circuit 17 are turned on. As a result, the shield bit lines BLi, BLi+2, . . . , are set to be the shield potential (the power source potential VDD (=2.5 V)). On the other hand, the select bit lines BLi−1, BLi+1, . . . , are precharged to the precharge potential (power source potential VDD (=2.5 V)).

Then, the signal BLCUE is made to be the ground potential GND and the shield bit lines BLi−1, BLi+1, . . . , are brought to the floating state. When the power source potential VDD of the signal BLCUO is maintained, the shield bit lines BLi, BLi+2, . . . , can be fixed to the power source potential VDD.

Then, the source line decoder 24 is operated so that the signal CELSRC-O is made to be the power source potential VDD and the signal CELSRC-E is made to be the ground potential GND. As a result, the sources of the NAND cell units which are connected to the shield bit lines BLi, BLi+2, . . . , are applied with the power source potential VDD. On the other hand, the sources of the NAND cell units which are connected to the select bit lines BLi−1, BLi+1, . . . , are applied with the ground potential GND.

Then, the row decoder 13 selects one block and one word line (a row) in response to the block address signal and the row address signal. The select gate driver 15 applies VCGH (=3.5 V) to the select gates SGS and SGD of the select transistors at both ends of the NAND cell units in the selected bit line and applies the ground potential (=0 V) to the select gates SGS and SGD of the select transistors at both ends of the NAND cell units in the non-selected blocks. The control gate driver 16 applies VCGH (=3.5 V) to the non-selected word lines and applies the ground potential (=0 V) to the selected word lines.

When data in the memory cell connected to the selected word line is "0" (when the threshold voltage is higher than 0 V), the select bit lines BL−1, BLi+1, . . . , maintain the precharge potential. When data in the memory cell connected to the selected word lines is "1" (when the threshold voltage is lower than 0 V), electric charges are discharged. Thus, the potential is made to be the ground potential.

Then, the signal BLCUE is made to be the power source potential so that data transmitted to the select bit lines BLi−1, BLi+1, . . . , is supplied to the latch circuit 20 having the function of the sense amplifier. Data from the latch circuit 20 is supplied to the I/O buffer 23 through the column select circuit 22, and then transmitted to the outside of the chip.

The above-mentioned NAND flash EEPROM and the data reading method have the structure that shield bit lines are not set to be the ground potential GND. The shield bit lines are set to be the power source potential VDD which is the same as the precharge potential of the select bit lines. Therefore, when the select bit lines are precharged, no parasitic capacitance is caused between the select bit lines and the shield bit line. As a result, a high speed precharging operation can be performed with low power consumption (see FIG. 13A).

Moreover, the sources of the NAND cell units which are connected to the select bit lines are applied with the ground potential GND. On the other hand, the sources of the NAND cell units which are connected to the shield bit lines are applied with the power source potential VDD. Therefore, the potential of the select bit line maintains the precharge potential or changes to the ground potential in accordance with data (the threshold voltage) in the selected memory cell. Therefore, a usual data read operation can be performed. On the other hand, the sources and drains of the NAND cell units which are connected to the shield bit lines are commonly applied with the power source potential VDD. Therefore, stress which is imposed on the memory cells of the NAND cell units which are connected to the shield bit lines can be relaxed.

In an example in which NAND cell unit is connected to the shield bit line as shown in FIGS. 13A and 13B, poor stress of a potential difference of 1.0 V (VCGH-VDD) is imposed between the channels of the memory cell MC, which is connected to the non-selected word lines (the control gates) CG0, CG1 and CG3 to CG15, and the control gate.

Moreover, the circuit according to the present invention has the structure that the select bit lines are precharged to the power source potential VDD and the shield bit lines are fixed to the power source potential VDD. Therefore, the VDD/GND apply circuit 18 as shown in FIG. 2 is not required. That is, the circuit according to the present invention has the structure that the power source potential VDD is applied to the select bit lines and the shield bit lines. Therefore, enlargement of the size of the circuit in the memory can be prevented.

Although the NAND flash EEPROM has been described in this embodiment, the structure of the present invention may, of course, be applied to memories, such as a NOR type flash EEPROM, an AND type flash EEPROM (see FIG. 45) and a DINOR type flash EEPROM (see FIG. 46) for performing dynamic data reading.

An example of a circuit of an element of the memory shown in FIGS. 9 to 11 will now be described.

Figure 12A:
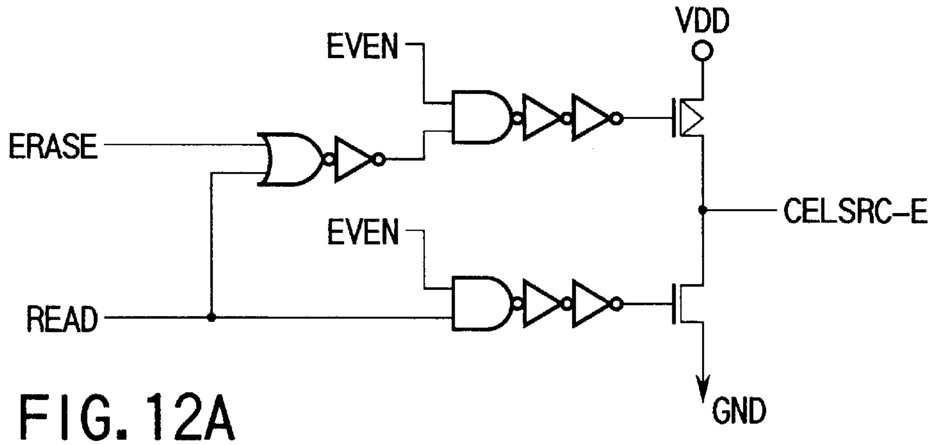
FIG. 12A is a diagram showing a source line decoder.
Figure 12B:
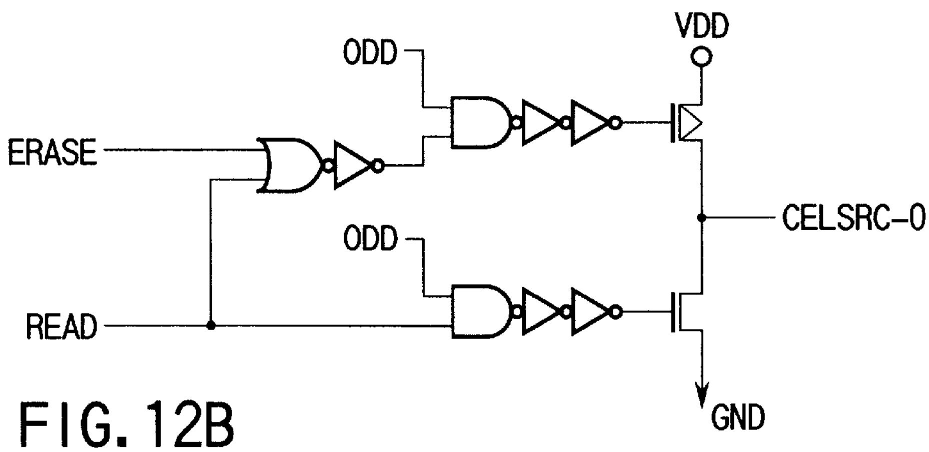
FIG. 12B is a diagram showing a source line decoder.

FIGS. 12A and 12B show an example of the source line decoder.

The erase mode signal ERASE is made to be "1" in an erase mode. The read mode signal READ is made to be "1" in a read mode. When even-numbered bit lines are made to be shield bit lines, the EVEN signal is made to be "1" and the ODD signal is made to be "0". When odd-numbered bit lines are made to be shield bit lines, the EVEN signal is made to be "0" and the ODD signal is made to be "1".

When the EVEN signal is "1" and the ODD signal is "0" in the read mode, the signal CELSRC-E is made to be the power source potential VDD and the signal CELSRC-O is made to be the ground potential GND. When the EVEN signal is "0" and the ODD signal is "1", the signal CELSRC-E is made to be the ground potential GND and the signal CELSRC-O is made to be power source potential VDD.

Figure 12C:
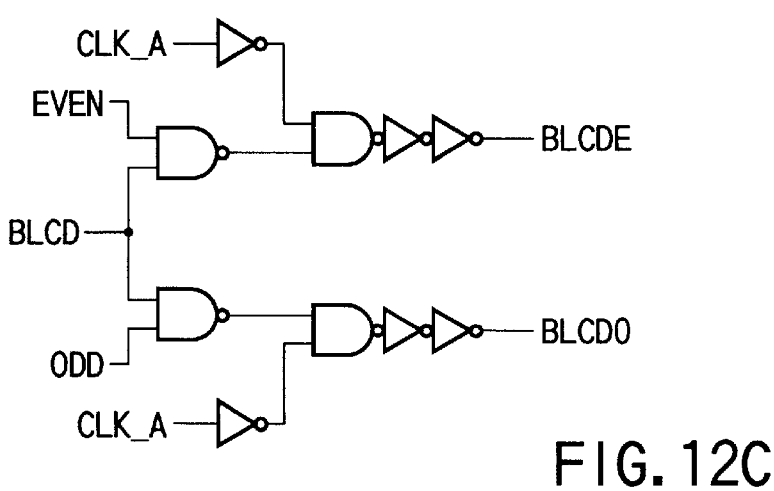
FIG. 12C is a diagram showing a shield line control circuit.

FIG. 12C shows an example of the shielded line control circuit.

When the EVEN signal is "1" and the ODD signal is "0", the waveforms of the signals shown in FIG. 12C are as shown in FIG. 12D. In period A, both of the signals BLCDE and BLCDO are made to be "1". Thus, the potential of all of the bit lines is set to be the power source potential VDD. In period B, the signal BLCUO is made to be "0". Moreover, odd-numbered bit lines (the selected bit lines) are brought to a floating state. Then, data in the memory cells are read and supplied to the selected bit lines.

When the EVEN signal is "0" and the ODD signal is "1", waveforms of the signals shown in FIG. 12C are as shown in FIG. 12E. In period A, both of the signals BLCDE and BLCDO are made to be "1". Thus, the potential of all of the bit lines is made to be the power source potential VDD. In period B, the signal BLCUE is made to be "0". Thus, even-numbered bit lines (the selected bit lines) are brought to the floating state. Then, data in the memory cell is read and supplied to the selected bit lines.

FIG. 12F shows an example of the bit line control circuit.

When the EVEN signal is "1" and the ODD signal is "0", waveforms of the signals shown in FIG. 12F are as shown in FIG. 12G. That is, the signal BLCUO is made to be "1". Thus, data on the odd-numbered bit lines (the selected bit lines) is supplied to the latch circuit having a function of a sense amplifier.

When the EVEN signal is "0" and the ODD signal is "1", waveforms of the signals shown in FIG. 12F are as shown in FIG. 12H. That is, the signal BLCUE is made to be "1". Thus, data on the even-numbered bit lines (the selected bit lines) is supplied to the latch circuit having the function of the sense amplifier.

A pattern (a structure of the device) of the memory cell array section for realizing the memory shown in FIGS. 9 to 11 will now be described.

Figure 14:
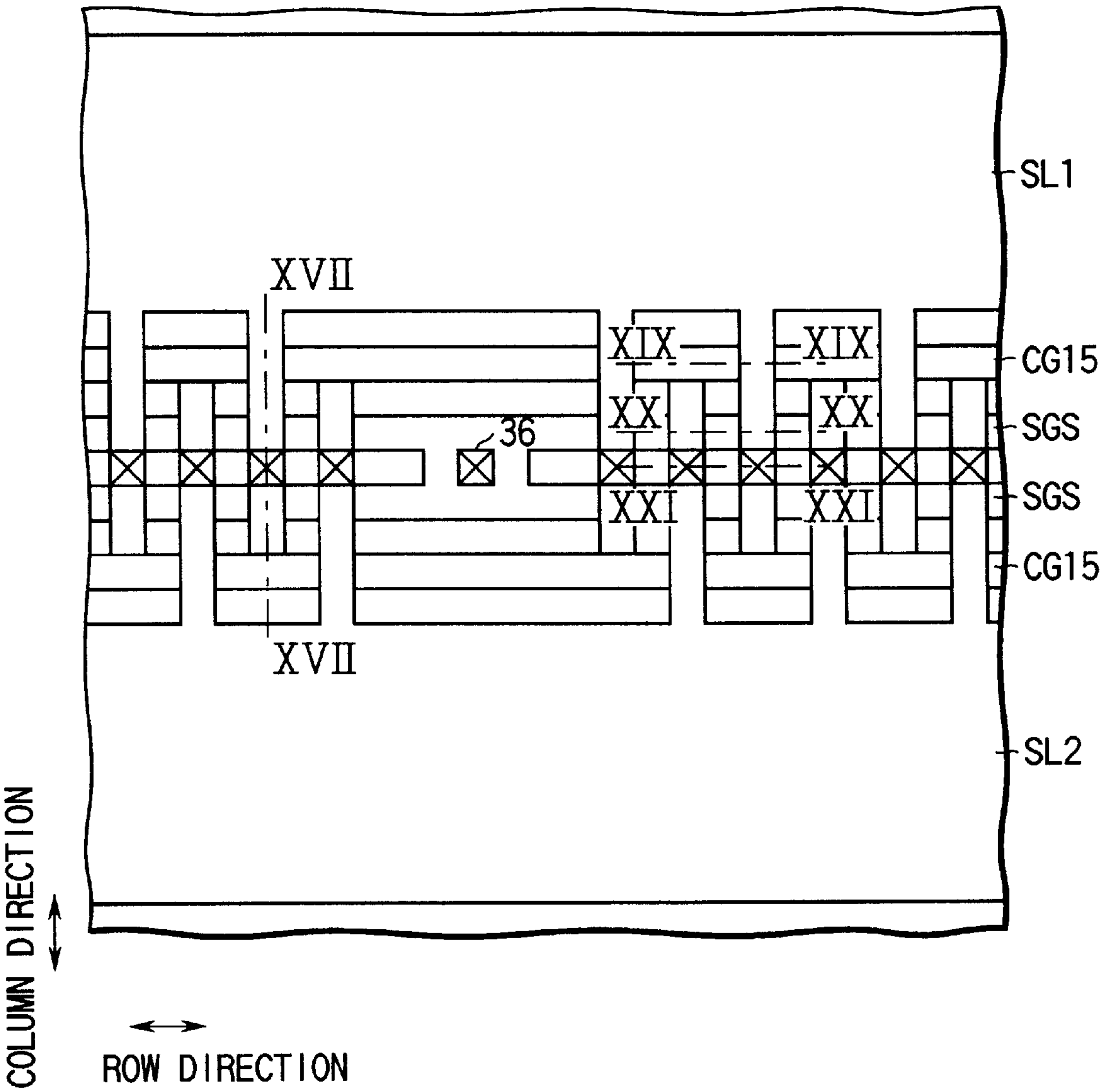
FIG. 14 is a plan view showing a layout of a portion including a source contact section of a memory cell array according to the present invention.
Figure 15:
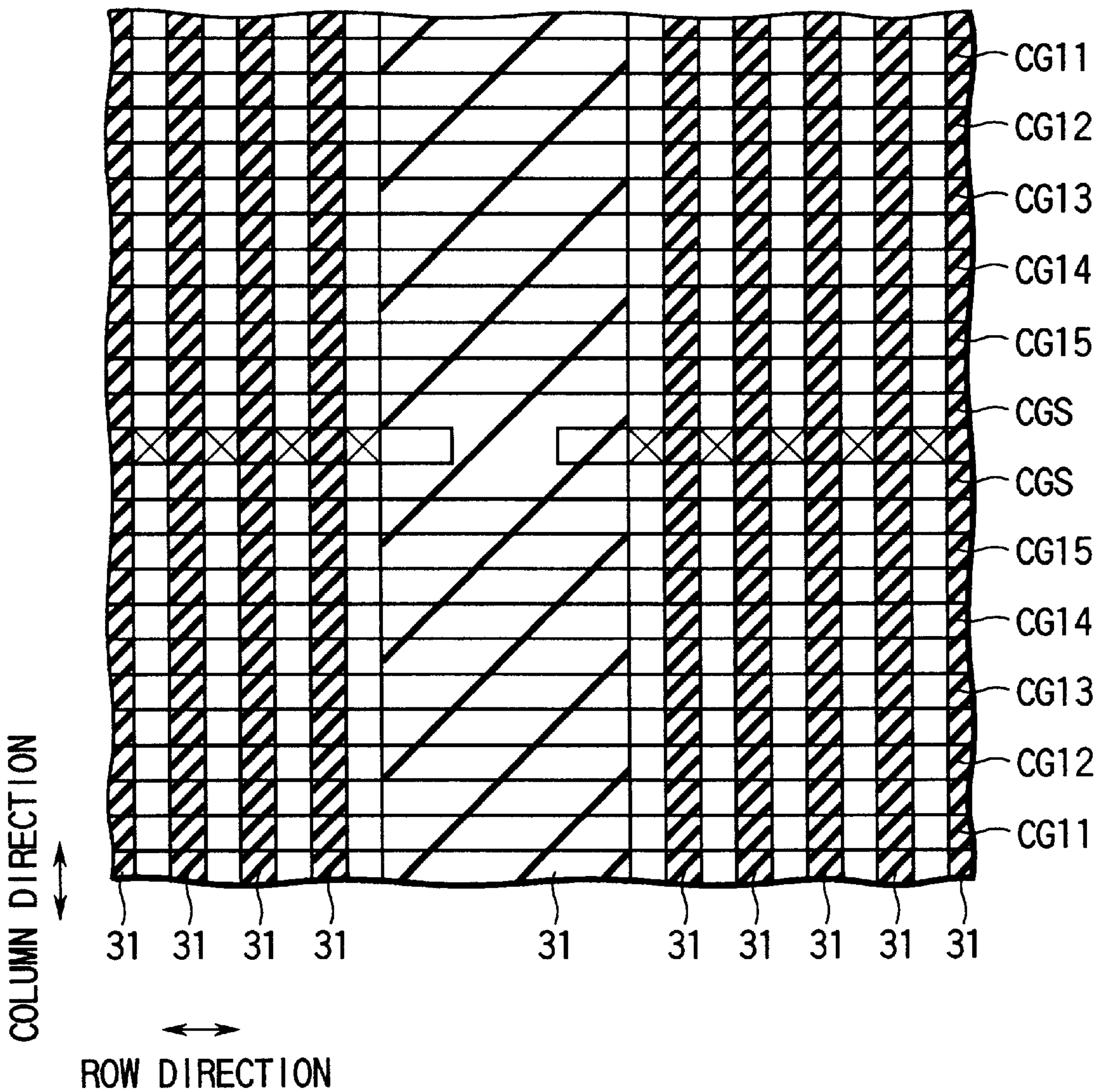
FIG. 15 is a diagram showing a portion including a source contact section of a device isolation film of the memory cell array according to the present invention.
Figure 16:
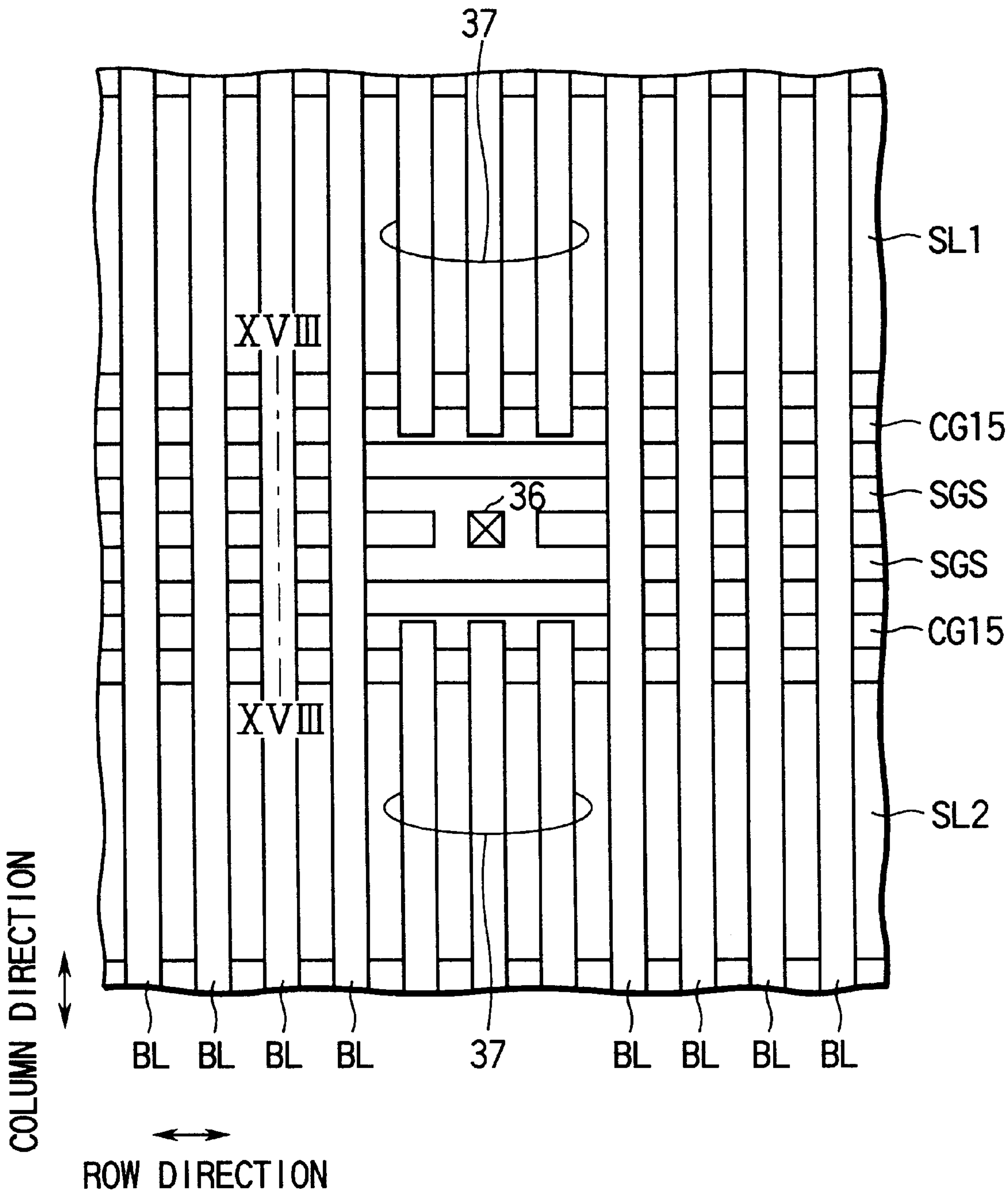
FIG. 16 is a diagram showing a structure formed by adding a layout of bit lines to the layout shown in FIG. 14.
Figure 17:
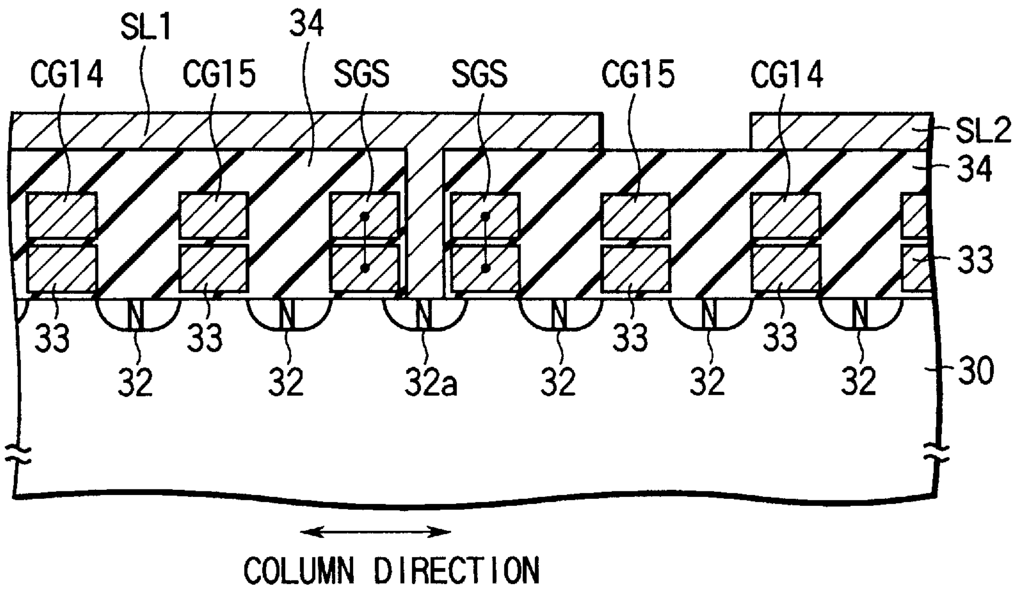
FIG. 17 is a cross sectional view taken along line XVII—XVII shown in FIG. 14.
Figure 18:
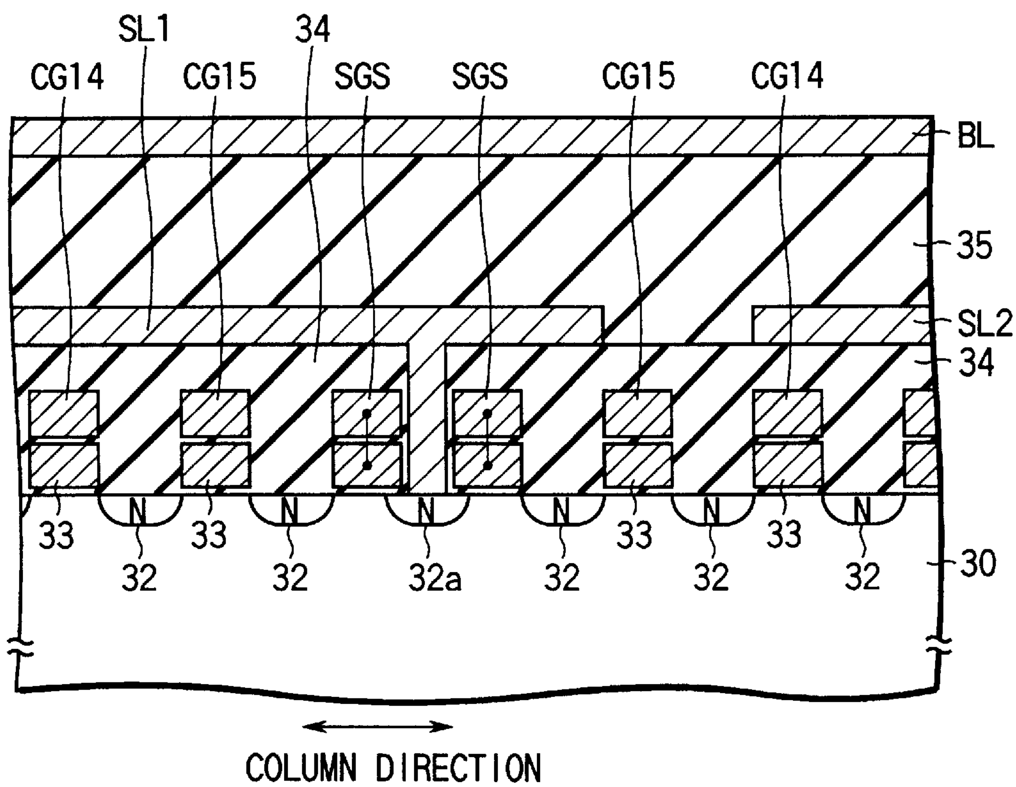
FIG. 18 is a cross sectional view taken along line XVIII—XVIII shown in FIG. 16.
Figure 19:
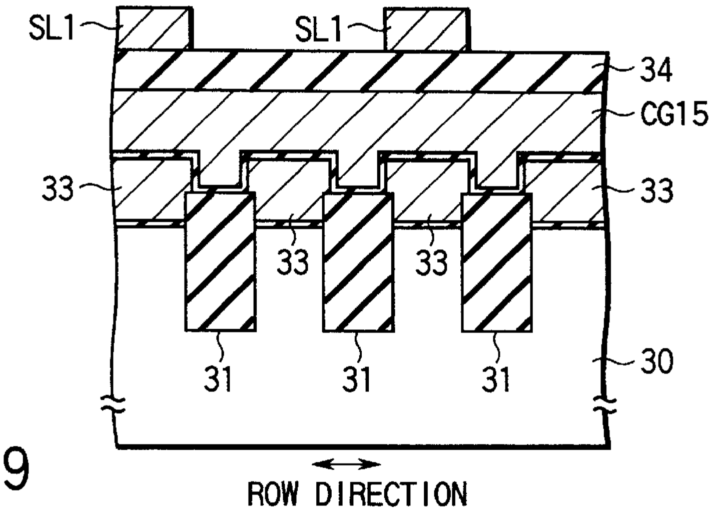
FIG. 19 is a cross sectional view taken along line XIX—XIX shown in FIG. 14.
Figure 20:
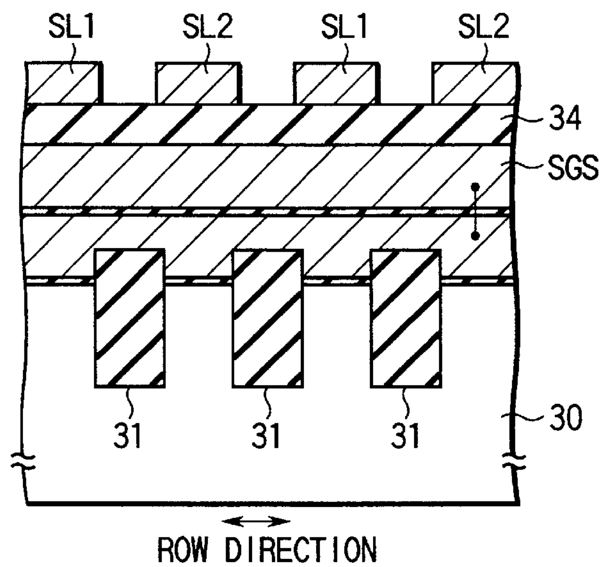
FIG. 20 is a cross sectional view taken along line XX—XX shown in FIG. 14.
Figure 21:
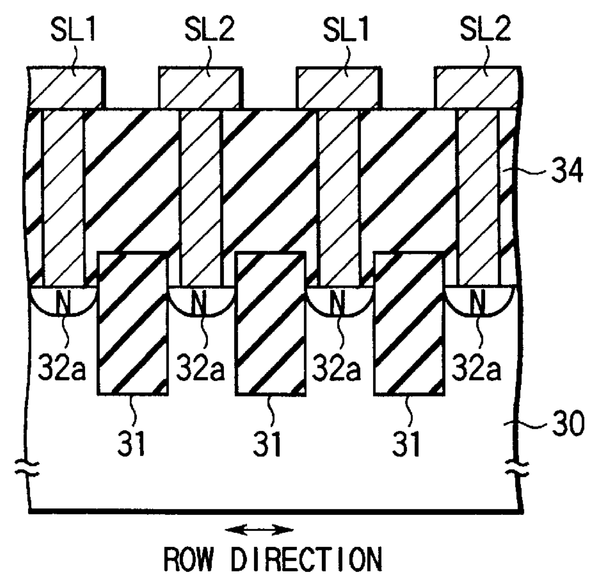
FIG. 21 is a cross sectional view taken along line XXI—XXI shown in FIG. 14.

FIG. 14 shows a pattern of a source contact section of a memory cell array. FIG. 15 shows a pattern of a device isolation film in the source contact section of the memory cell array. FIG. 16 shows a structure formed by adding a pattern of bit lines to the pattern shown in FIG. 14. FIG. 17 is a cross sectional view taken along line XVII—XVII shown in FIG. 14. FIG. 18 is a cross sectional view taken along line XVIII—XVIII shown in FIG. 16. FIG. 19 is a cross sectional view taken along line XIX—XIX shown in FIG. 14. FIG. 20 is a cross sectional view taken along line XX—XX shown in FIG. 14. FIG. 21 is a cross sectional view taken along line XXI—XXI shown in FIG. 14.

A semiconductor substrate 30 is provided with a device isolation film 31 formed into an STI (Shallow Trench Isolation) structure. The device isolation film 31 extends continuously in a row direction so as to electrically isolate two adjacent NAND cell units from each other. The semiconductor substrate 30 includes a plurality of N-type diffusion layers 32 and 32*a* formed therein.

The N-type diffusion layers 32*a* serve as the sources for the NAND cell units. The structure according to this embodiment is different from the conventional structure in that the N-type diffusion layer 32*a* is not a common source for the NAND cell units in the row direction. In this embodiment, the N-type diffusion layers 32*a* are made to be independent from one another. Floating gates 33 and controls CG15, CG14, . . . , of the memory cell are formed on the channels between the N-type diffusion layers 32. Select gates SGS of the select transistors are formed on the channels between the N-type diffusion layers 32 and the N-type diffusion layer 32*a*.

An interlayer insulating film 34 for covering the NAND cell units composed of the memory cells and the select transistors is formed. Source lines SL1 and SL2 connected to the N-type diffusion layers (the source of the NAND cell units) are formed on the interlayer insulating film 34. The source lines SL1 and SL2 are disposed in parallel with each other and extended in the row direction.

Either of the NAND cell units adjacent to each other in the row direction is connected to the source line SL1, while another NAND cell unit is connected to the source line SL2. For example, the sources of the NAND cell units corresponding to the even-numbered bit lines are connected to the source line SL1. The sources of the NAND cell units connected to the odd-numbered bit lines are connected to the source line SL2.

An interlayer insulating film 35 for covering the source lines SL1 and SL2 is formed on the interlayer insulating film 34. Bit lines BL connected to the drains of the NAND cell units are formed on the interlayer insulating film 35. The source lines SL1 and SL2 and the bit lines BL are formed on different layers. In this embodiment, the layer on which the source lines SL1 and SL2 are formed is formed below the layer on which the bit line BL is formed. The bit line BL extends in the column direction.

Reference numeral 36 represents a contact section between the select gate SGS of the source-side select transistor of the NAND cell unit and a metal layer which is formed on the select gate SGS. Reference numeral 37 represents a dummy bit line. The dummy bit line 37 is provided for the purpose of improving the workability and regularity of the pattern and making the parasitic capacitances among bit lines to be the same among all of the bit lines.

The above-mentioned layout enables both source lines SL1 and SL2 which are able to independently set the potentials thereof to be disposed on the memory cell array. Moreover, the sources (the diffusion layers) 32*a* of the NAND cell units are electrically isolated from each other by the device isolation film 31 continuously extending in the column direction and formed into, for example, the STI structure. Therefore, the sources of two NAND cell units adjacent to each other in the row direction are connected to different source lines so that their potentials are independently set. That is, the shielded bit line sensing scheme according to the present invention can be realized.

Figure 22:
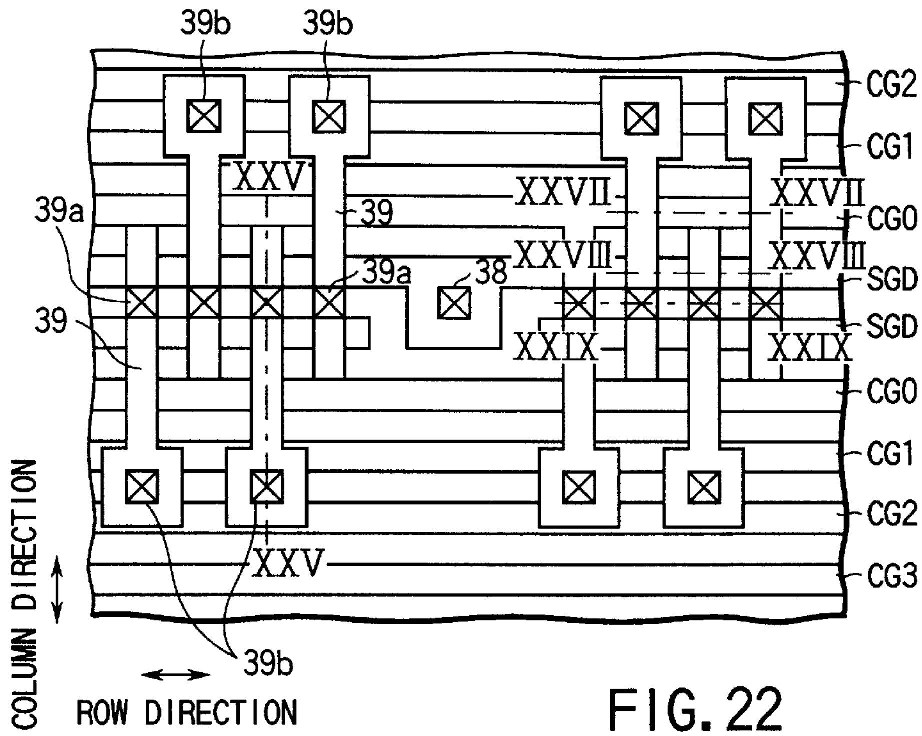
FIG. 22 is a plan view showing the layout of a portion including a drain contact section of the memory cell array according to the present invention.
Figure 23:
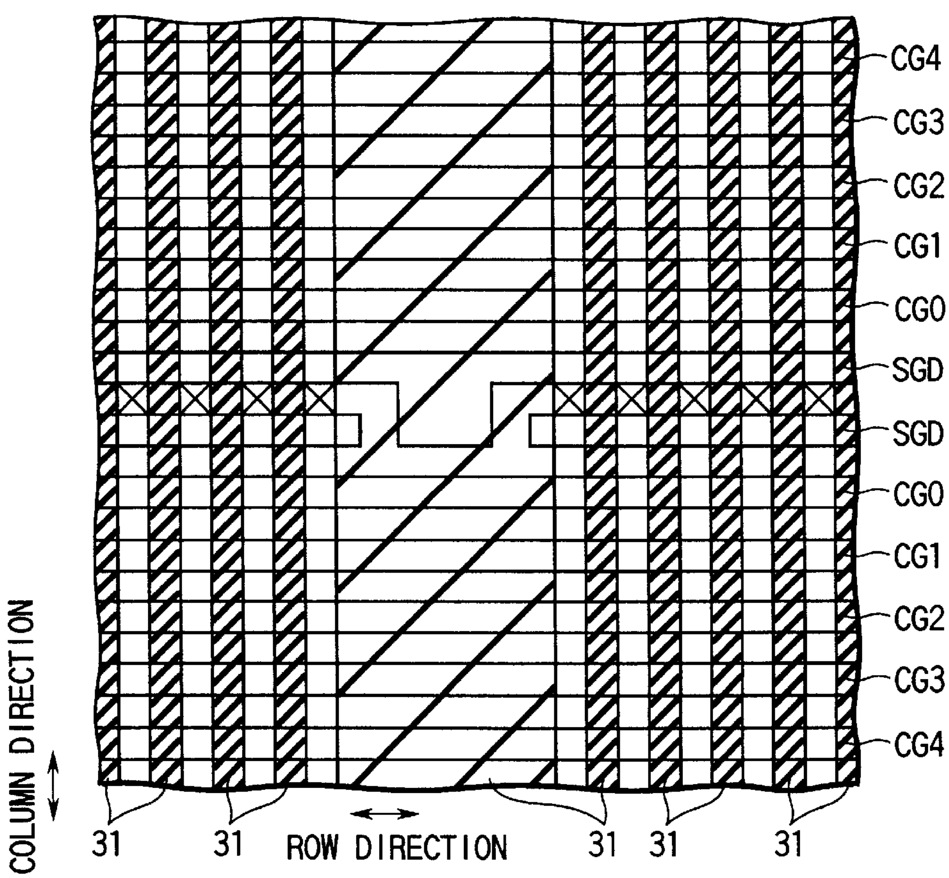
FIG. 23 is a plan view showing the layout of a portion including a drain contact section of a device isolation film of the memory cell array according to the present invention.
Figure 24:
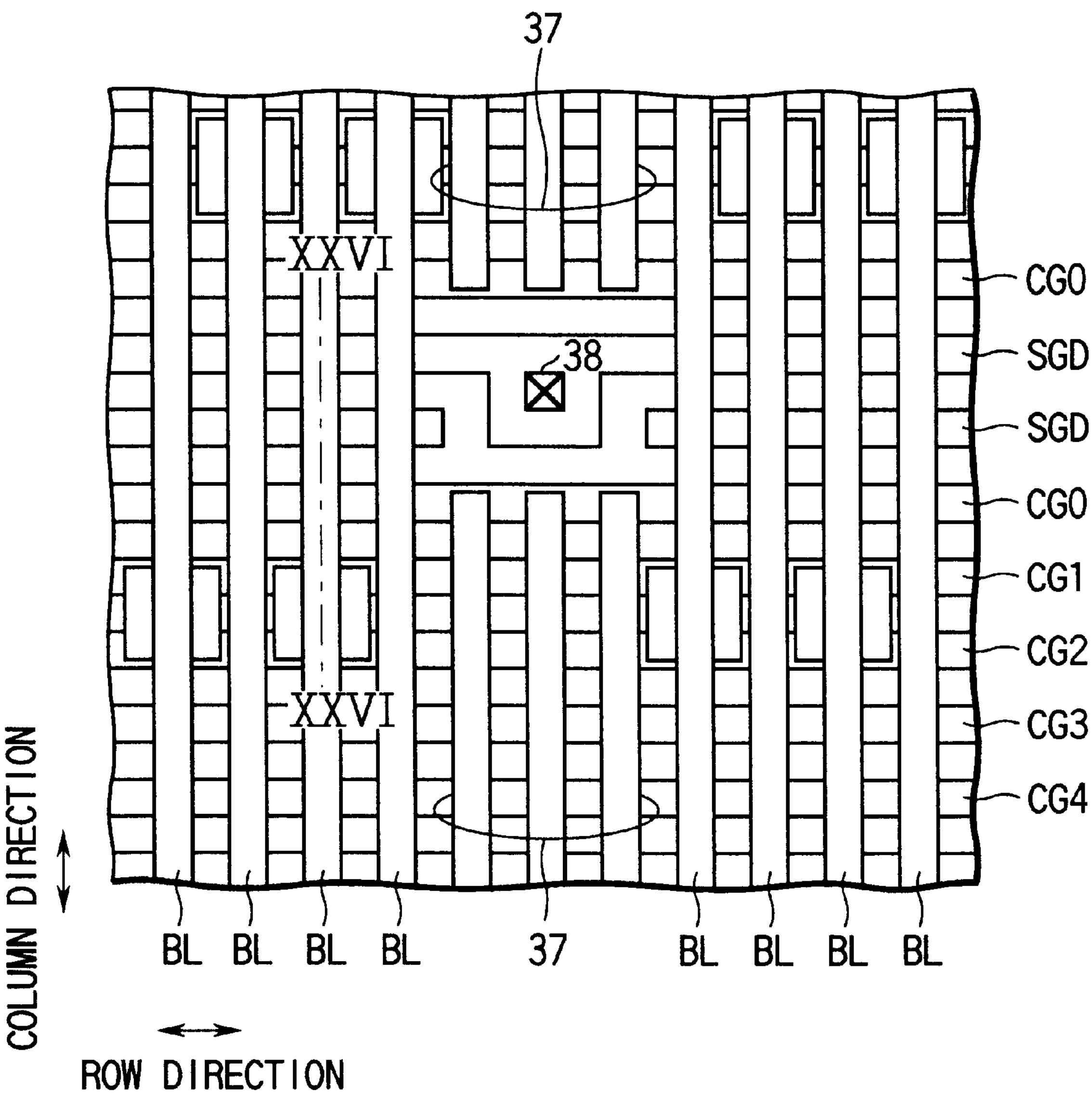
FIG. 24 is a diagram showing a structure formed by adding a layout of bit lines to the layout shown in FIG. 22.
Figure 25:
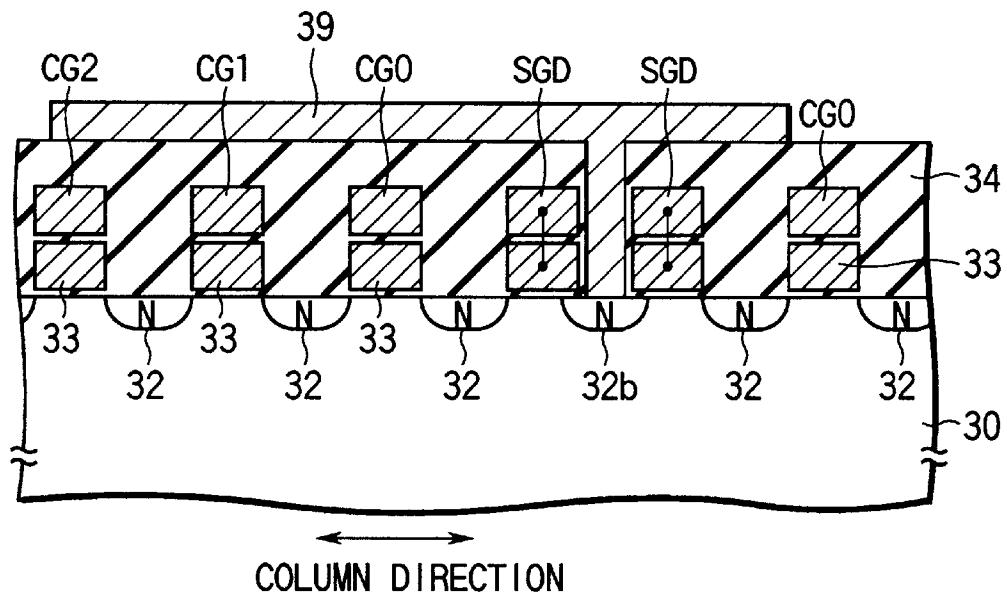
FIG. 25 is a cross sectional view taken along line XXV—XXV shown in FIG. 22.
Figure 26:
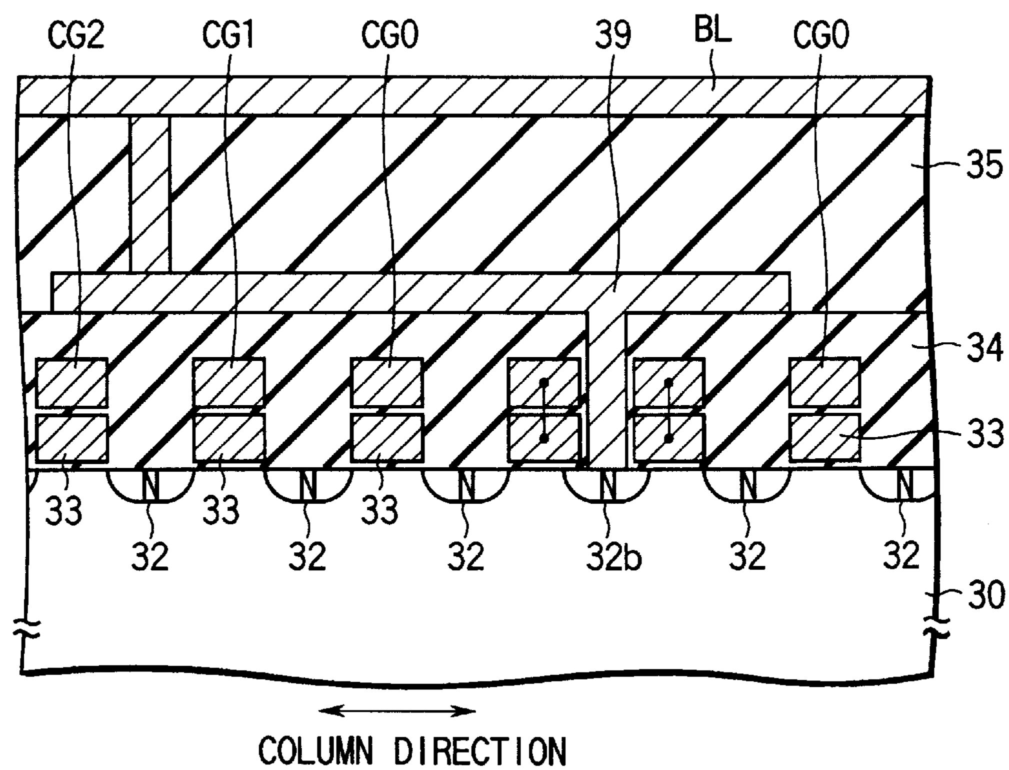
FIG. 26 is a cross sectional view taken along line XXVI—XXVI shown in FIG. 24.
Figure 27:
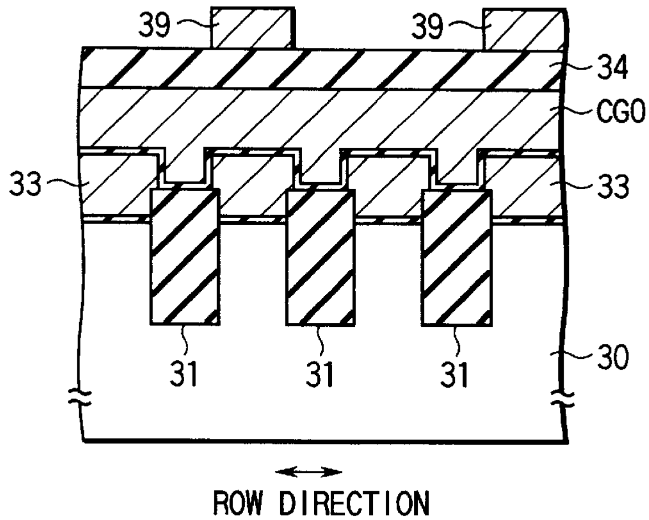
FIG. 27 is a cross sectional view taken along line XXVII—XXVII shown in FIG. 22.
Figure 28:
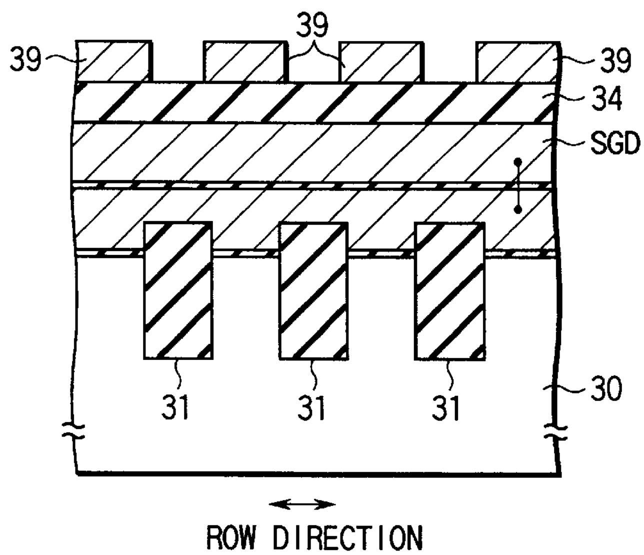
FIG. 28 is a cross sectional view taken along line XXVIII—XXVIII shown in FIG. 22.
Figure 29:
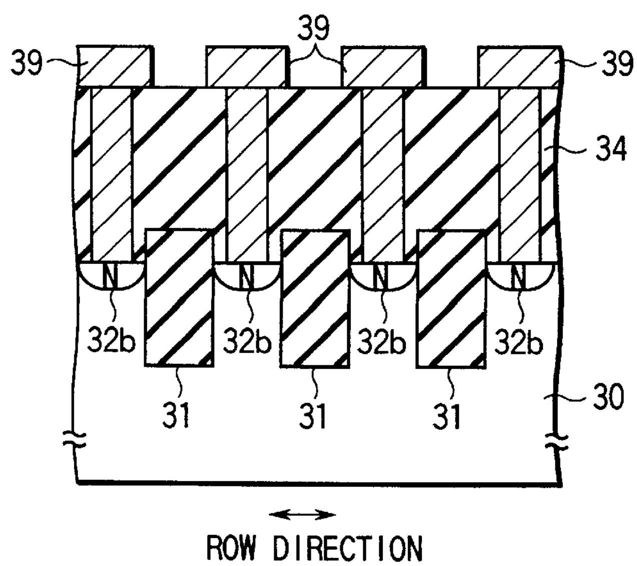
FIG. 29 is a cross sectional view taken along line XXIX—XXIX shown in FIG. 22.

FIG. 22 shows the pattern of the contact section between the drains of the memory cell array and the bit lines. FIG. 23 shows a pattern of the device isolation film in the drain contact section in the memory cell array. FIG. 24 shows a structure formed by adding a pattern of the bit lines to the pattern shown in FIG. 22. FIG. 25 is a cross sectional view taken along line XXV—XXV shown in FIG. 22. FIG. 26 is a cross sectional view taken along line XXVI—XXVI shown in FIG. 24. FIG. 27 is a cross sectional view taken along line XXVII—XXVII shown in FIG. 22. FIG. 28 is a cross sectional view taken along line XXVIII—XXVIII shown in FIG. 22. FIG. 29 is a cross sectional view taken along line XXIX—XXIX shown in FIG. 22.

The semiconductor substrate 30 has a device isolation film 31 formed into the STI (Shallow Trench Isolation) structure. The device isolation film 31 continuously extends in the column direction so as to electrically isolate two NAND cell units adjacent to each other. The semiconductor substrate 30 includes a plurality of N-type diffusion layer 32 and 32*b* formed therein.

The N-type diffusion layers 32*b* are drains for the NAND cell units and made to be independent among the NAND cell units. Floating gates 33 and control gates CG15, CG14, . . . , of the memory cells are formed on the channels between the N-type diffusion layers 32. Select gates SGD of the select transistors are formed on the channels between the N-type diffusion layer 32 and 32*b*.

An interlayer insulating film 34 for covering the NAND cell units composed of the memory cells and the select transistors is formed. Electric lines 39 which are connected to the N-type diffusion layers (the drains of the NAND cell units) 32*b* are formed on the interlayer insulating film 34. The electric lines 39 are formed on the layer on which the source lines SL1 and SL2 shown in FIGS. 14 to 21 are formed. The electric lines 39 are arranged in parallel with one another and structured to extend in the column direction.

Ends of the electric lines 39 are, in the contact section 39*a*, connected to drains 32*b* of the NAND cell units. An interlayer insulating film 35 for covering the electric lines 39 is formed on the interlayer insulating film 34. Bit lines BL which are, in the contact section 39*b*, connected to the other ends of the electric lines 39 are formed on the interlayer insulating film 35.

Reference numeral 38 represents a contact section between the select gate SGD of the drain-side select transistor of the NAND cell unit and a metal layer which is formed on the select gate SGD. Reference numeral 37 represents a dummy bit line. The dummy bit lines 37 are provided for the purpose of making the parasitic capacitances among the bit lines to be the same.

A method of manufacturing the memory device shown in FIGS. 14 to 21 and the memory device shown in FIGS. 22 to 29 will now be described.

In this embodiment, the pattern of the memory cell array section is the same as that of the memory device shown in FIGS. 14 to 21 and the memory device shown in FIGS. 22 to 29. However, the structures and materials of the NAND cell units and the electric lines will specifically be described (that is, best modes will now be described).

Figure 30:
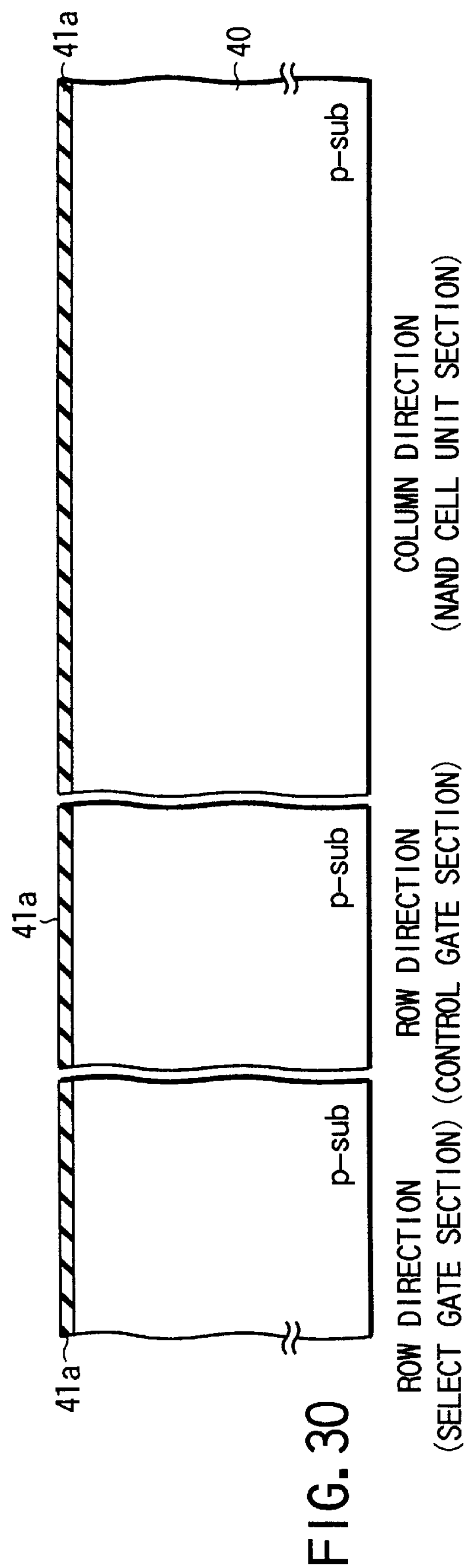
FIG. 30 is a cross sectional view showing a step of a method of manufacturing a semiconductor memory according to the present invention.

As shown in FIG. 30, a silicon oxide film 41*a* having a thickness of about 10 nm is formed on a p-type silicon substrate 40 by, for example, heat oxidation.

Figure 31:
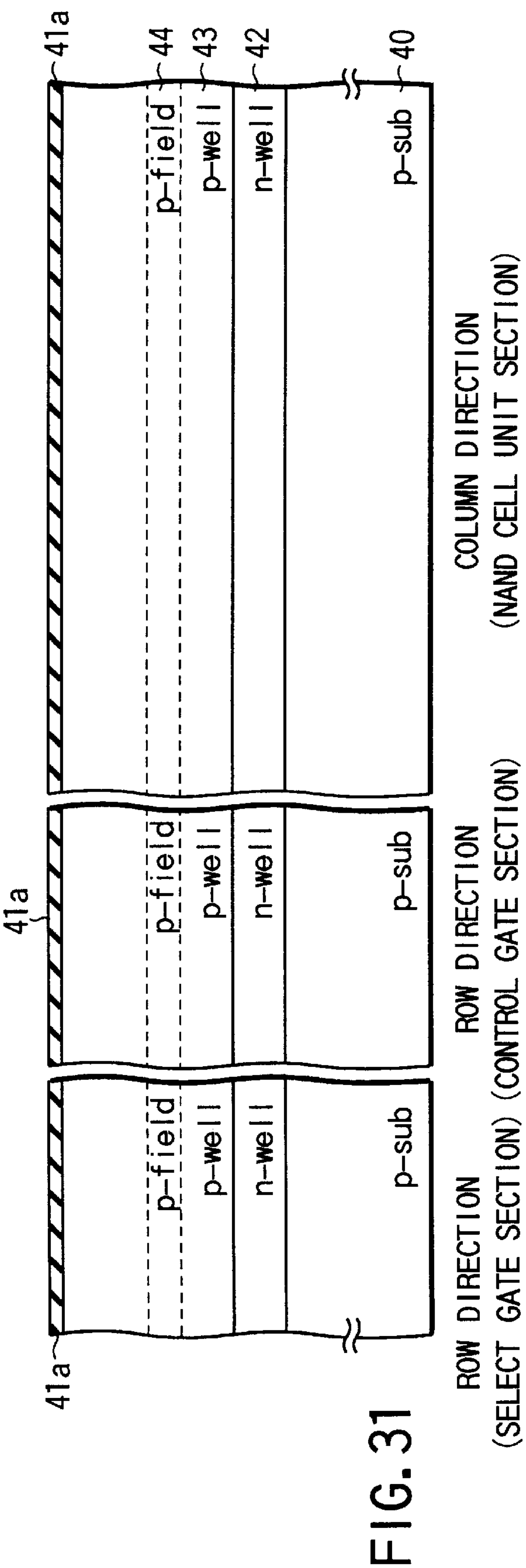
FIG. 31 is a cross sectional view showing a step of the method of manufacturing the semiconductor memory according to the present invention.

Then, an n-well forming mask is used when ions of n-type impurities (for example, phosphor (P)) are implanted into the silicon substrate 40, as shown in FIG. 31. Thus, an n-well region 42 is formed. The n-well region 42 is formed by an ion implanting process consisting of, for example, three steps. That is, a first step is performed, for example, such that phosphor ions are implanted into the silicon substrate in a dose quantity of $4.0\times10^{12}$ $cm^{-2}$ with acceleration energy of 1.5 MeV. A second step is performed, for example, such that phosphor ions are implanted into the silicon substrate in a dose quantity of $8.0\times10^{12}$ $cm^{-2}$ with acceleration energy of 750 KeV. A third step is performed, for example, such that phosphor ions are implanted into the silicon substrate in a dose quantity of $1.0\times10^{12}$ $cm^{-2}$ with acceleration energy of 150 KeV.

Then, a p-well forming mask is used when ions of p-type impurities (for example, boron (B)) are implanted into the silicon substrate 40 so that a p-well region 43 is formed. The p-well region 43 is formed by, for example, two steps of ion implanting operations. A first step is performed such that boron ions are implanted into the silicon substrate in a dose quantity of $4.0\times10^{13}$ $cm^{-2}$ with acceleration energy of 400 KeV. A second step is performed such that boron ions are implanted into the silicon substrate in a dose quantity of $1.0\times10^{12}$ $cm^{-2}$ with acceleration energy of 200 KeV.

A p-field region 44 containing impurities in a concentration higher than that in the p-well region 43 is formed in the p-well region 43. Then, the silicon oxide film 41*a* is removed.

Figure 32:
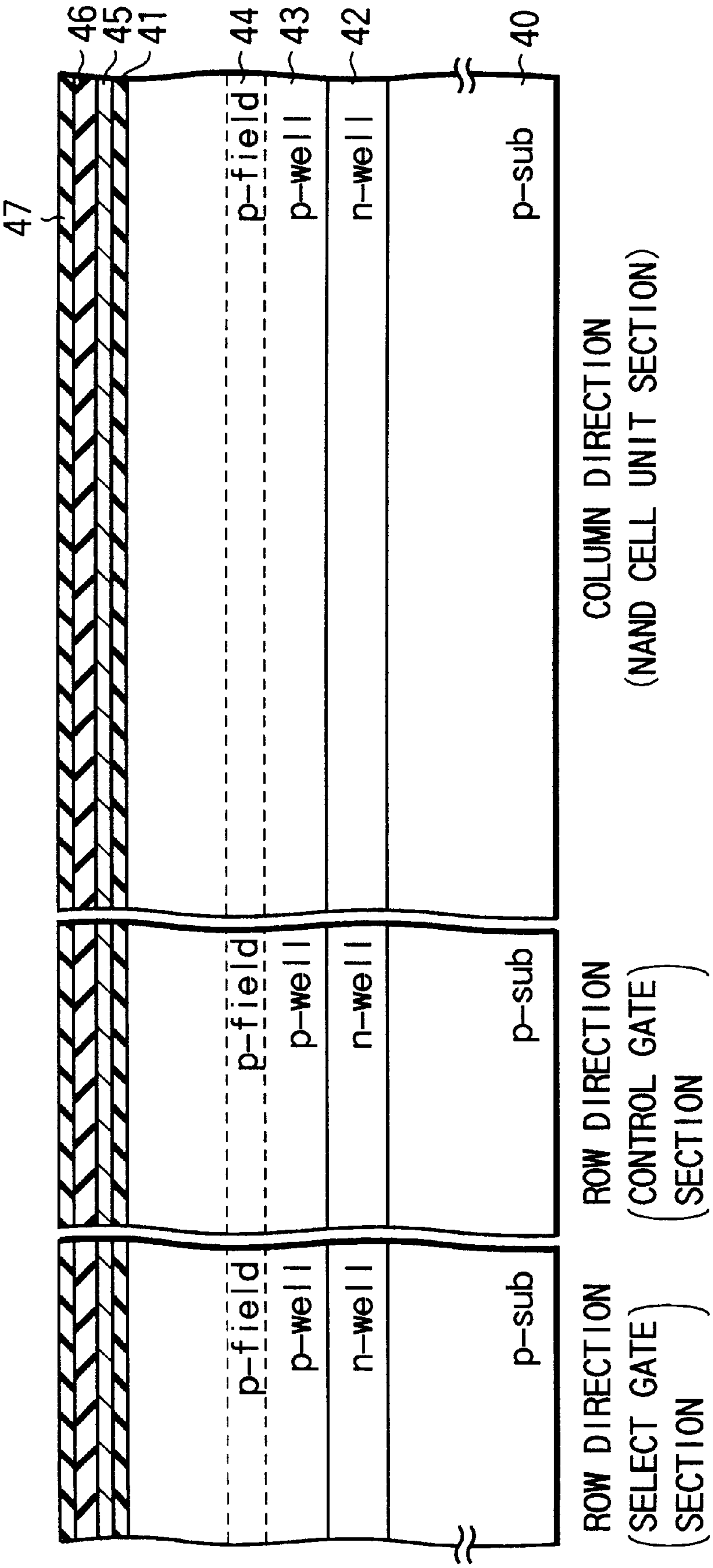
FIG. 32 is a cross sectional view showing a step of the method of manufacturing the semiconductor memory according to the present invention.

Then, as shown in FIG. 32, heat oxidation is performed in an oxygen atmosphere at temperatures of about 750° C. so that a silicon oxide film 41 having a thickness of about 8 nm is formed on the silicon substrate 40. Then, for example, a CVD method is employed to form an n-type polysilicon film 45 containing n-type impurities (for example, phosphor) in a quantity of about $2\times10^{20}$ $cm^{-3}$ and having a thickness of about 60 nm on the silicon oxide film 41.

Then, for example, the CVD method is employed to form a silicon nitride film 46 having a thickness of about 150 nm on the n-type polysilicon film 45. Then, for example, the CVD method is employed to form a silicon oxide film 47 having a thickness of about 100 nm on the silicon nitride film 46.

Figure 33:
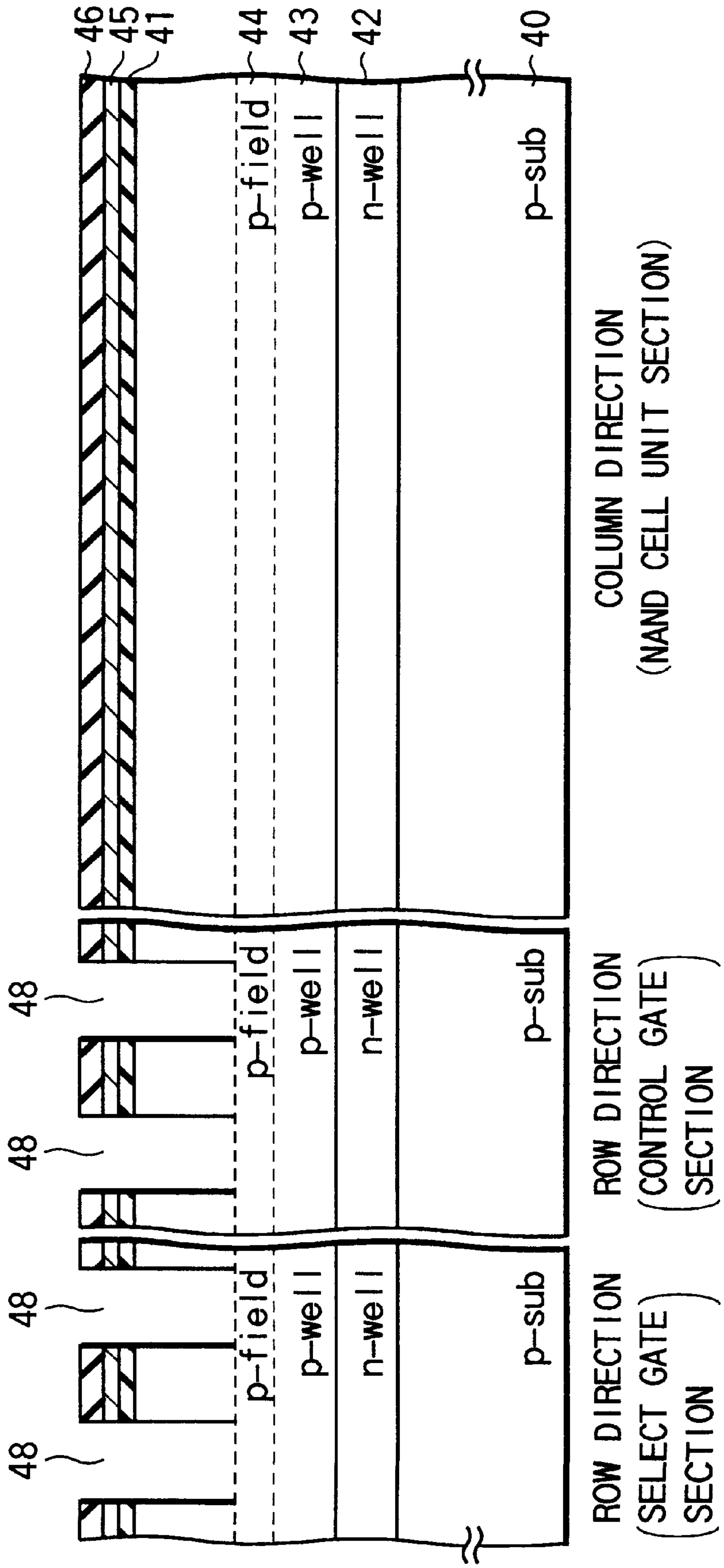
FIG. 33 is a cross sectional view showing a step of the method of manufacturing the semiconductor memory according to the present invention.

Then, as shown in FIG. 33, a PEP (Photo Engraving Process) is employed to form a resist pattern on the silicon oxide film 47. The formed resist pattern is used as a mask when the silicon oxide film 47 is etched by RIE (Reactive Ion Etching). The silicon oxide film 47 is used as a mask when the silicon nitride film 46 is etched by the RIE method. Then, the silicon oxide film 47 is removed.

Then, the silicon nitride film 46 is used as a mask when the n-type polysilicon film 45 and the silicon oxide film 41 are sequentially etched by the RIE method. Then, the silicon nitride film 46 is used as a mask when the silicon substrate 40 is etched. Thus, a trench 48 having a bottom which reaches the p-field region 44 is formed on the silicon substrate 40.

Figure 34:
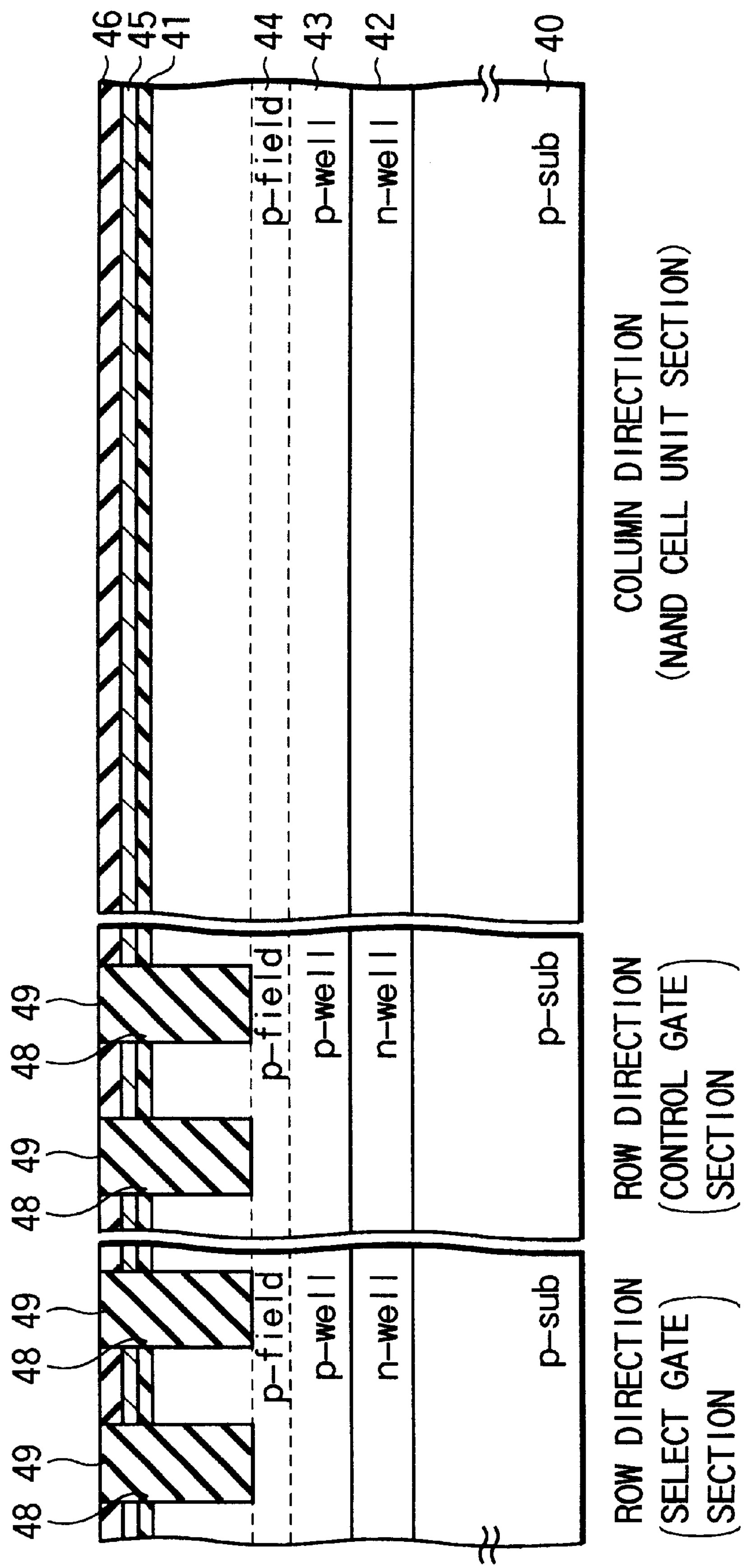
FIG. 34 is a cross sectional view showing a step of the method of manufacturing the semiconductor memory according to the present invention.

Then, as shown in FIG. 34, for example, the CVD method is employed when a TEOS film 49 having a thickness of about 820 nm and completely covering the trench 48 is formed on the silicon nitride film 46. Then, a CMP (Chemical Mechanical Polishing) method is employed to polish the TEOS film 49 in such a manner that the TEOS film 49 is left in only the trench 48. Thus, the STI (Shallow Trench Isolation) structure is formed.

Since the silicon nitride film 46 serves as an etching stopper when the CMP process is performed, the surface of the TEOS film 49 is substantially flush with the surface of the silicon nitride film 46 (in general, the surface of the TEOS film 49 is somewhat lower than the surface of the silicon nitride film 46). Then, the silicon nitride film 46 is removed.

Figure 35:
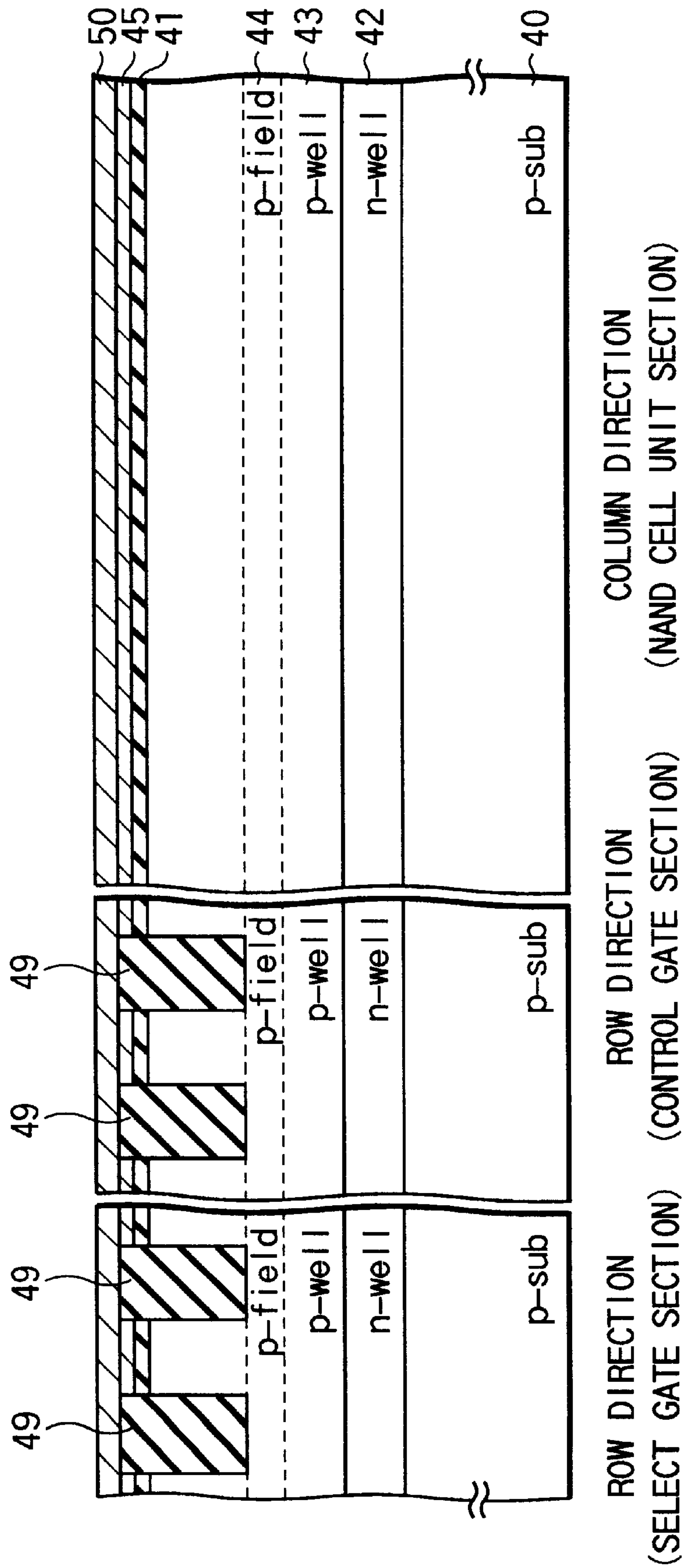
FIG. 35 is a cross sectional view showing a step of the method of manufacturing the semiconductor memory according to the present invention.

Then, as shown in FIG. 35, for example, the CVD method is employed to form an n-type polysilicon film 50 containing n-type impurities (for example, phosphor) in a quantity of about $2\times10^{20}$ $cm^{-3}$ and having a thickness of about 100 nm on the n-type polysilicon film 45.

Figure 36:
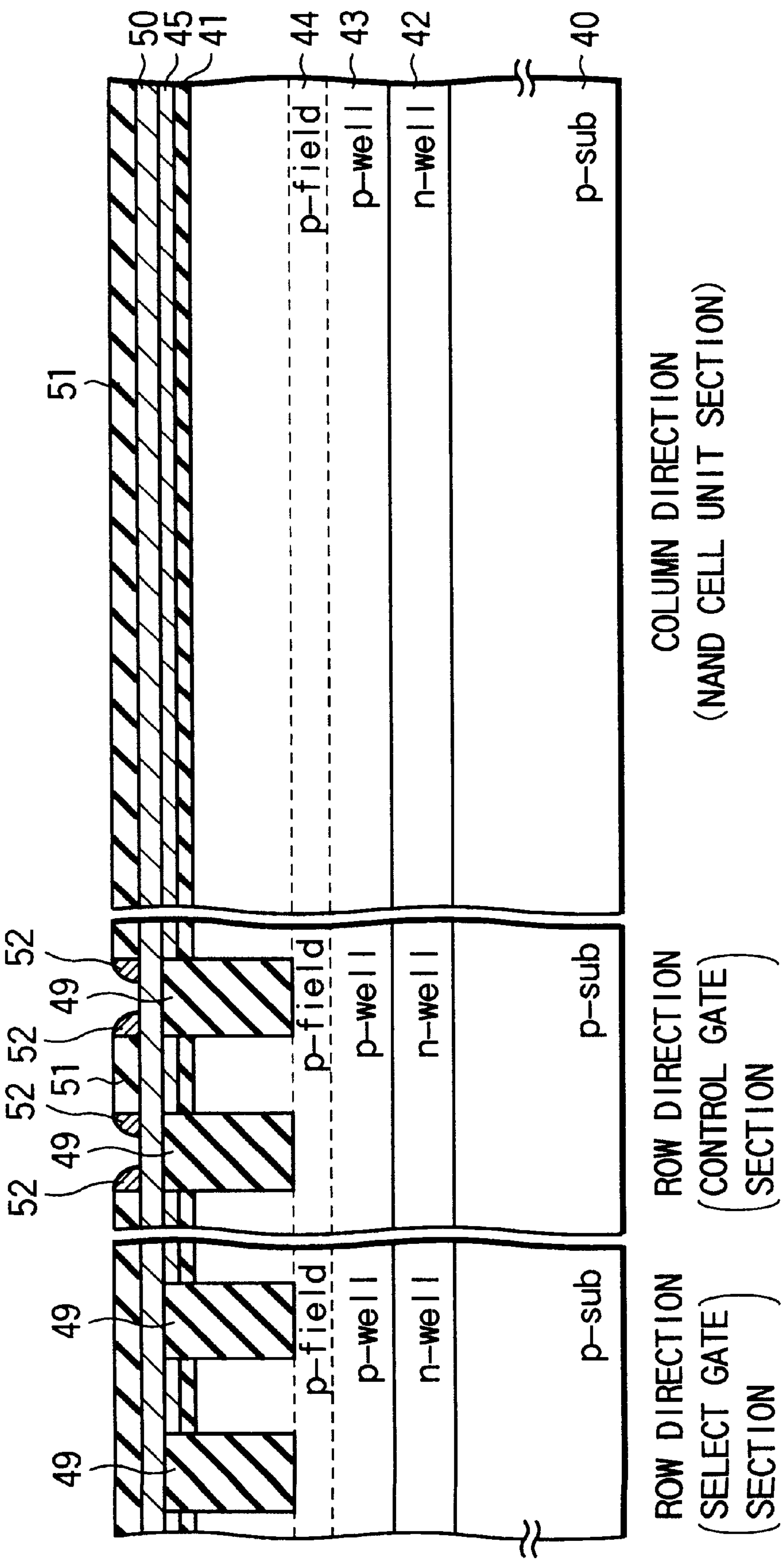
FIG. 36 is a cross sectional view showing a step of the method of manufacturing the semiconductor memory according to the present invention.
Figure 37:
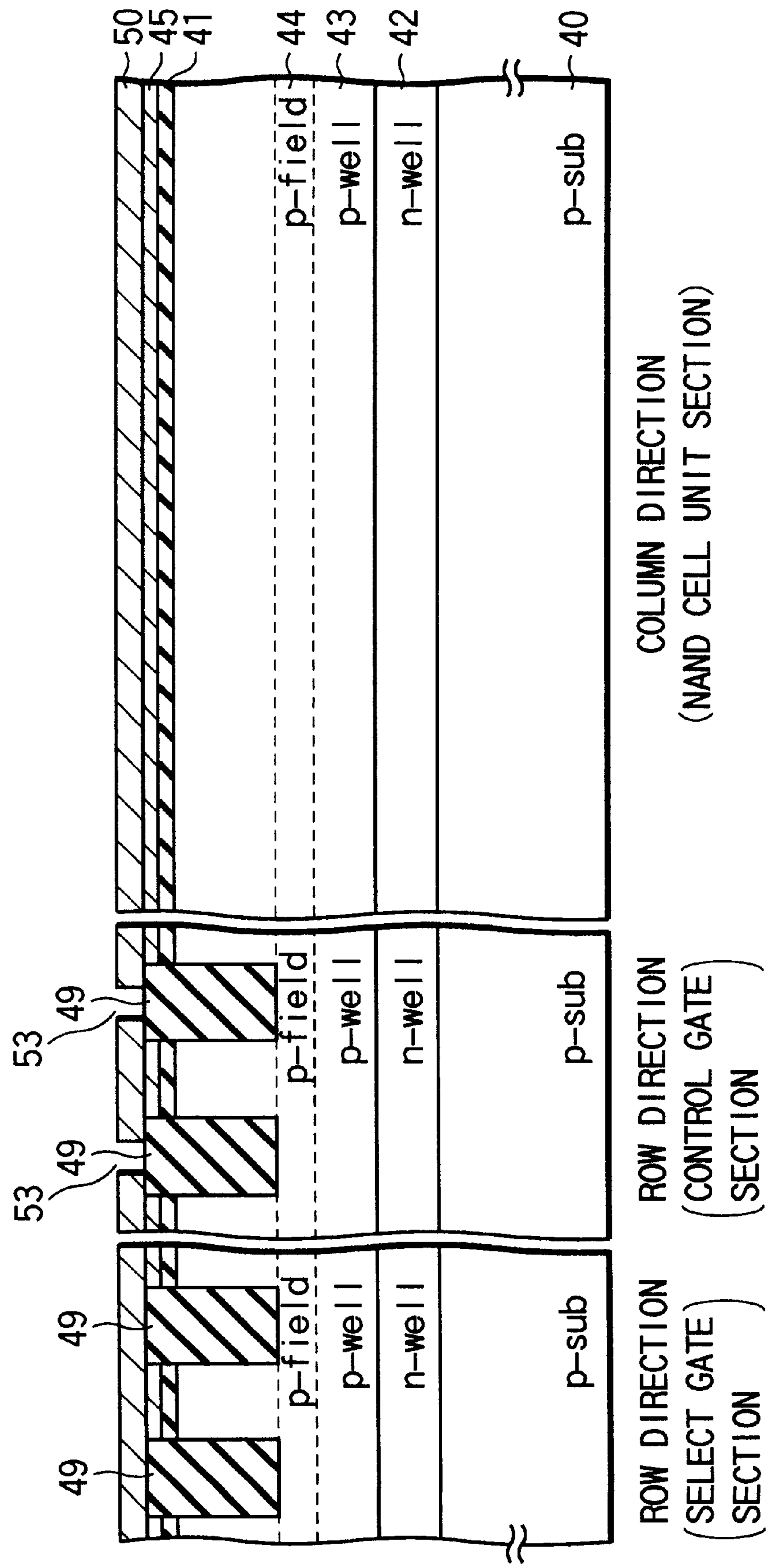
FIG. 37 is a cross sectional view showing a step of the method of manufacturing the semiconductor memory according to the present invention.

Then, as shown in FIG. 36, for example, the CVD method is employed to form a silicon nitride film 51 having a thickness of about 200 nm on the n-type polysilicon film 50. Then, the silicon nitride film 51 is patterned so that slits are provided for the silicon nitride film 51. The width (the width in the row direction) of each slit is 200 nm to 300 nm.

Then, the CVD method is employed to form a silicon nitride film 52 having a thickness of about 80 nm on the silicon nitride film 51. The silicon nitride film 52 is etched by RIE so that the silicon nitride film 52 is left in only the side walls of the slits of the silicon nitride film 51.

Then, the silicon nitride films 51 and 52 are used as masks when the n-type polysilicon film 50 is etched by RIE. Thus, slit-shape openings 53 are formed in the n-type polysilicon film 50. The width of each of the openings 53 (the width in the row direction) is smaller than the width (the width in the row direction) of the TEOS film 49 for realizing the STI structure. Therefore, the polysilicon films 45 and 50 which are formed into the floating gates are formed into wing shapes.

Then, the silicon nitride films 51 and 52 are removed.

Figure 38:
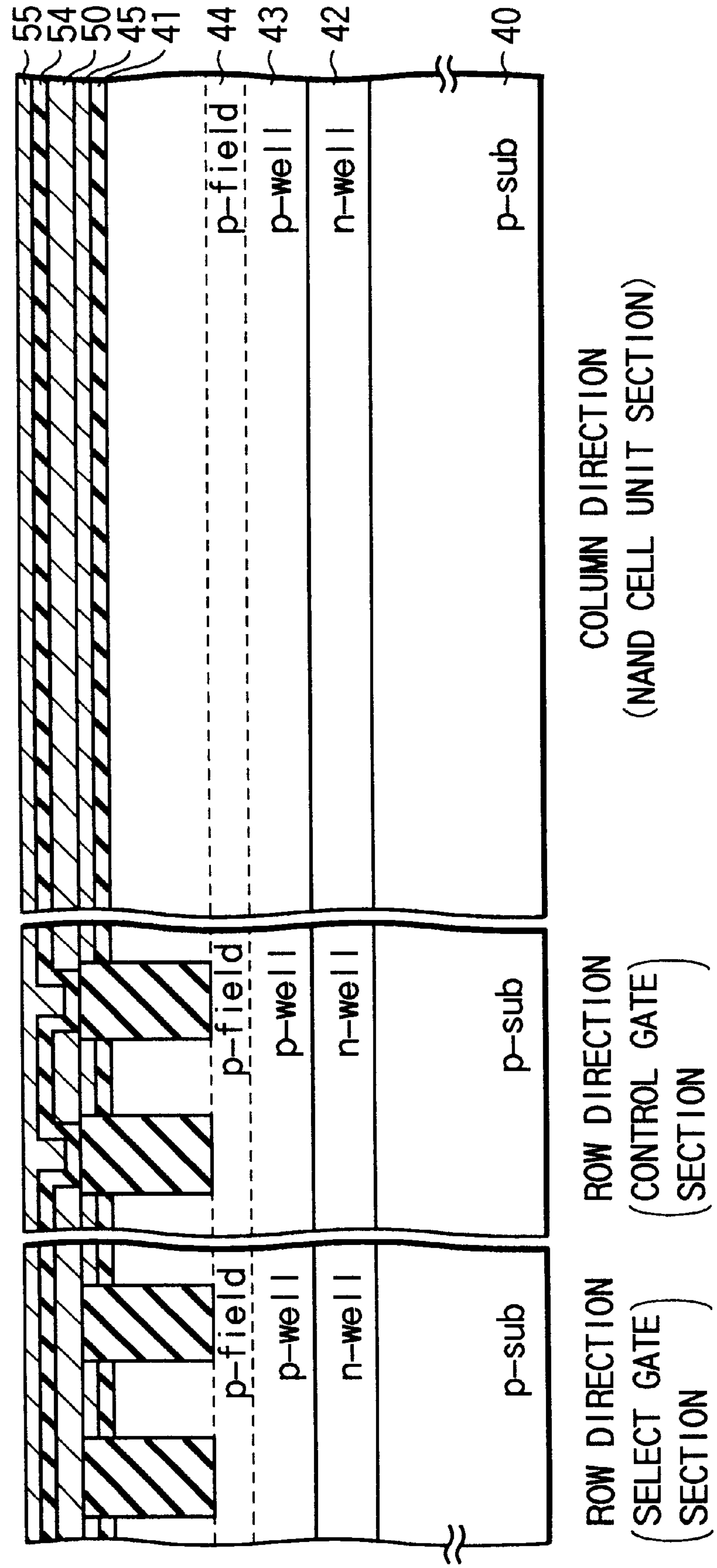
FIG. 38 is a cross sectional view showing a step of the method of manufacturing the semiconductor memory according to the present invention.

As shown in FIG. 38, an insulating film 54 is formed on the n-type polysilicon film 50. The insulating film 54 is composed of, for example, a silicon oxide film having a thickness of about 5 nm, a silicon nitride film having a thickness of about 8 nm and a silicon oxide film having a thickness of about 5 nm (that is, a so-called ONO film). Moreover, for example, the CVD method is employed to form a polysilicon film 55 containing n-type impurities (for example, phosphor) by about $3.6\times10^{20}$ $cm^{-3}$ and having a thickness of about 200 nm on the insulating film 54.

Figure 39:
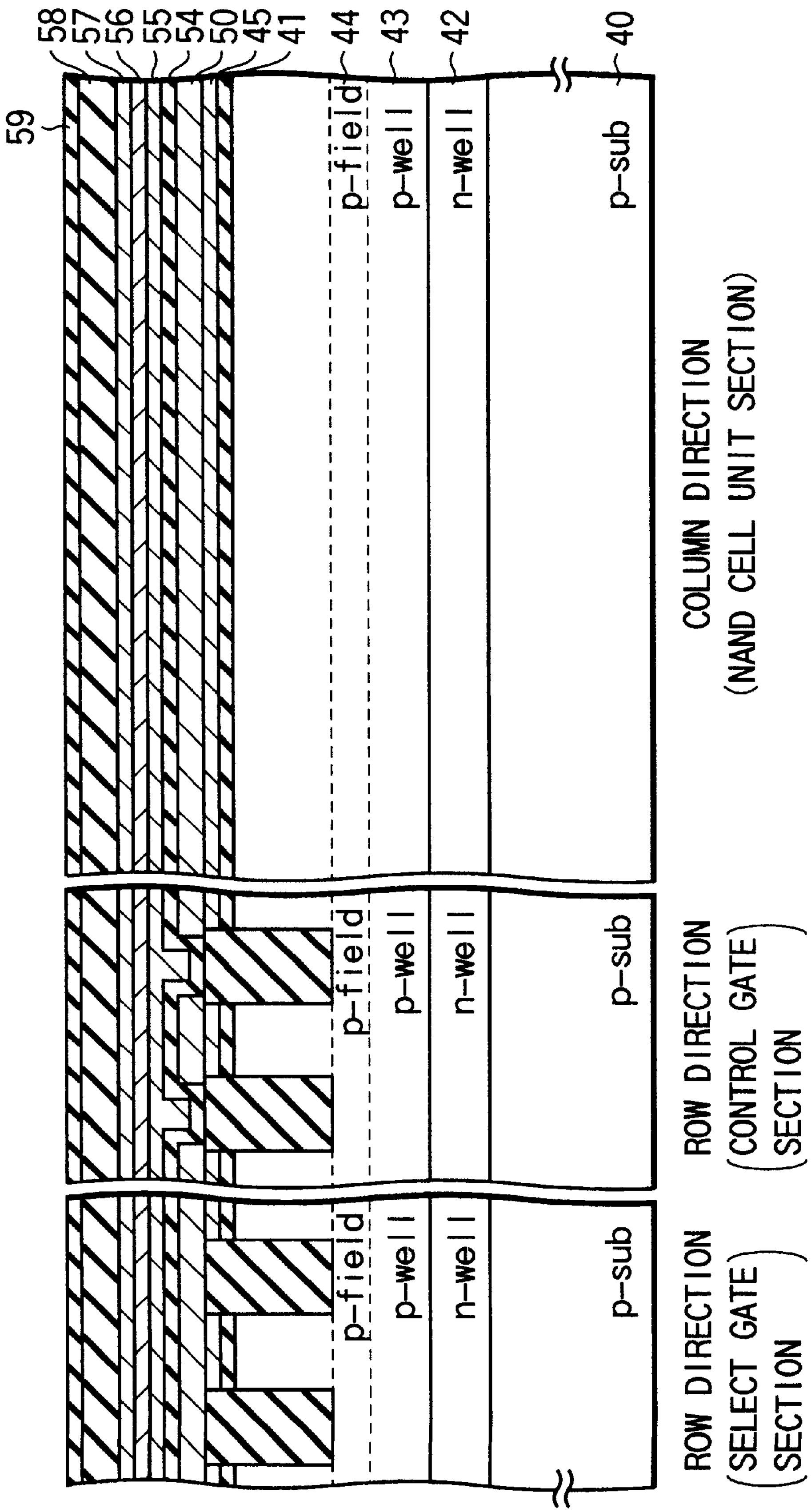
FIG. 39 is a cross sectional view showing a step of the method of manufacturing the semiconductor memory according to the present invention.

Then, as shown in FIG. 39, for example, the CVD method is employed to form a polysilicon film 56 containing n-type impurities and having a thickness of about 100 nm on the polysilicon film 55. For example, the CVD method is employed to form a tungsten silicide (WSi) 57 having a thickness of about 100 nm on the polysilicon film 56. Then, the CVD method is employed to form a silicon nitride film 58 having a thickness of about 280 nm on the tungsten silicide film 57. Then, the CVD method is employed to form a silicon oxide film (a TEOS film) 59 having a thickness of 50 nm on the silicon nitride film 58.

Then, PEP is performed so that a resist pattern is formed on the silicon oxide film 59. The formed resist pattern is used as a mask to etch the silicon oxide film 59 by RIE. The silicon oxide film 59 is used as a mask to etch the silicon nitride film 58 by RIE. Then, the silicon oxide film 59 is removed.

Figure 40:
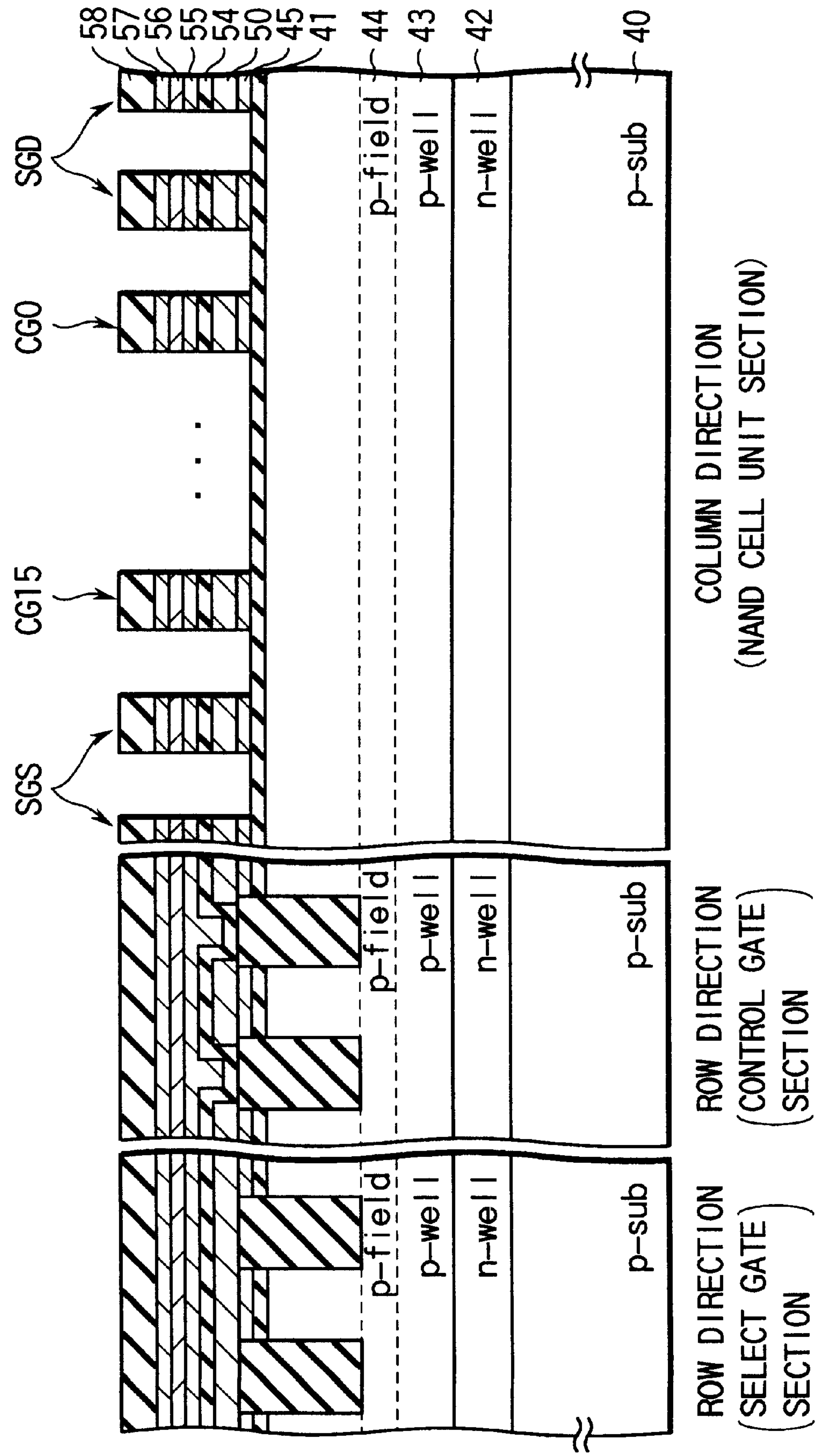
FIG. 40 is a cross sectional view showing a step of the method of manufacturing the semiconductor memory according to the present invention.

Then, as shown in FIG. 40, the patterned silicon nitride film 58 is used as a mask when the tungsten silicide film 57, the polysilicon films 54 and 55, the insulating film 54 and the polysilicon films 45 and 50 are sequentially etched by RIE. Thus, the control gates CG0 to CG15 and select gates SGS and SGD extending in the row direction and the floating gates immediately below the control gates CG0 to CG15 are formed.

Figure 41:
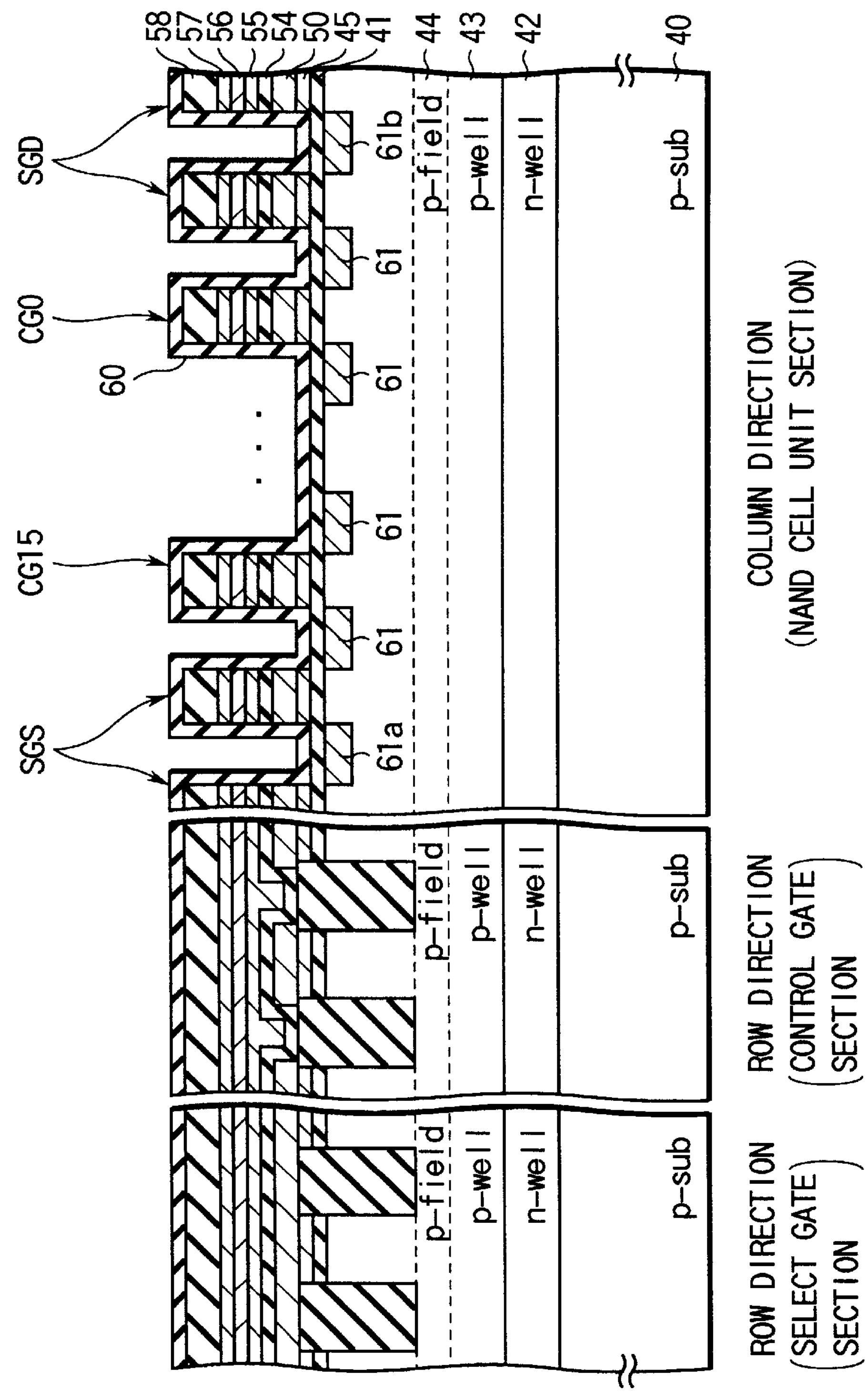
FIG. 41 is a cross sectional view showing a step of the method of manufacturing the semiconductor memory according to the present invention.

Then, as shown in FIG. 41, the silicon nitride film 58 (the control gates and the select gates) is used as a mask when ions of n-type impurities (phosphor or arsenic) are implanted into the p-well region 43 by a self-align method. Thus, n-type diffusion layers 61, 61*a* and 61*b* are formed. Note that the diffusion layer 61*a* serves as the source of the NAND cell unit. The diffusion layer 61*b* serves as the drain of the NAND cell unit.

Then, for example, the CVD method is employed to form silicon nitride films 60 serving as spacers and each having a thickness of about 60 nm on the side walls of the control gate CG0 to CG15, the select gates SGS and SGD and the floating gates.

Figure 42:
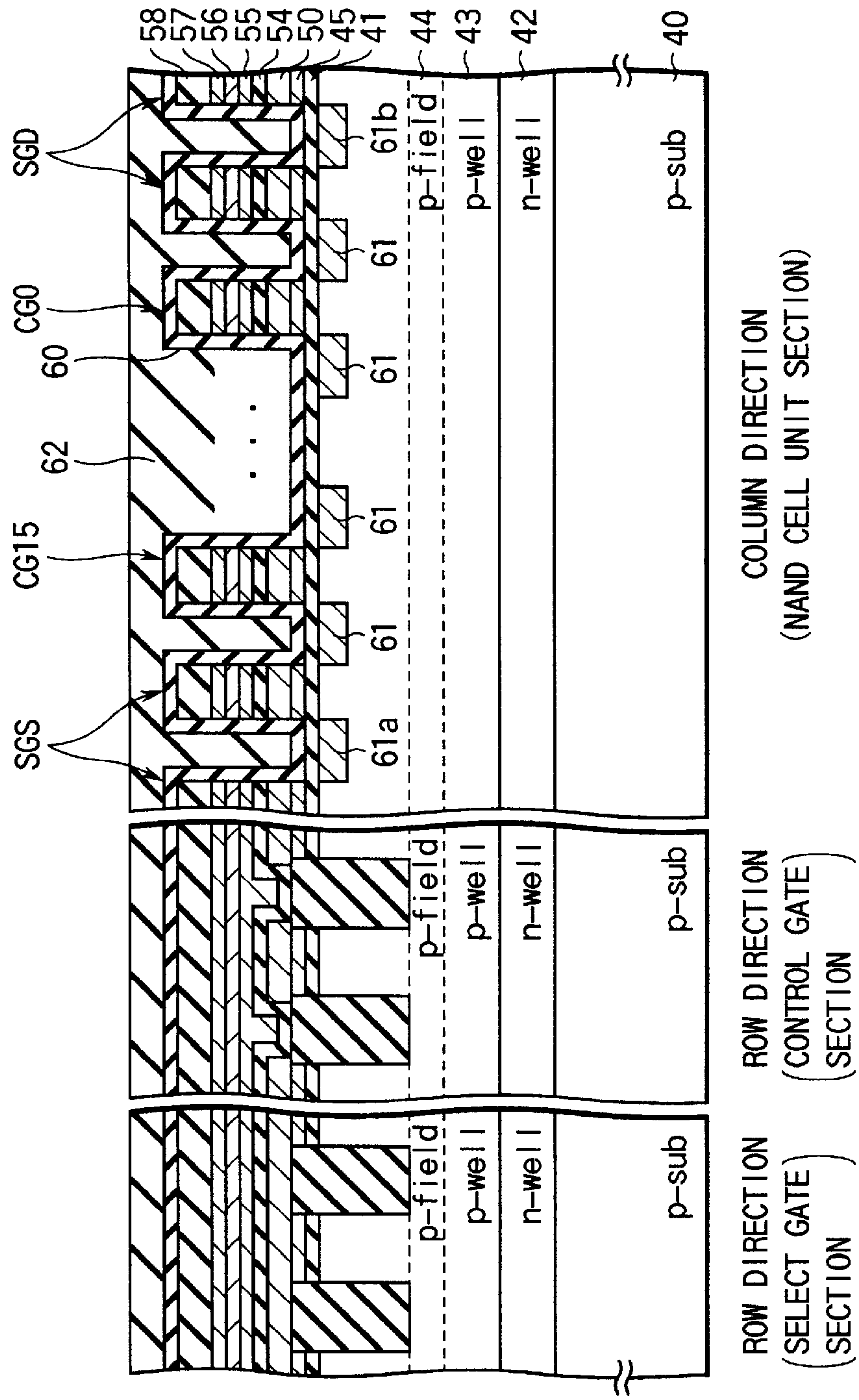
FIG. 42 is a cross sectional view showing a step of the method of manufacturing the semiconductor memory according to the present invention.

Then, as shown in FIG. 42, a BPSG film 62 having a thickness of about 1.45 mm is formed on the silicon nitride film 60. Then, the CMP method is employed to polish the BPSG film 62 by about 0.4 mm so that the surface of the BPSG film 62 is flattened.

Figure 43:
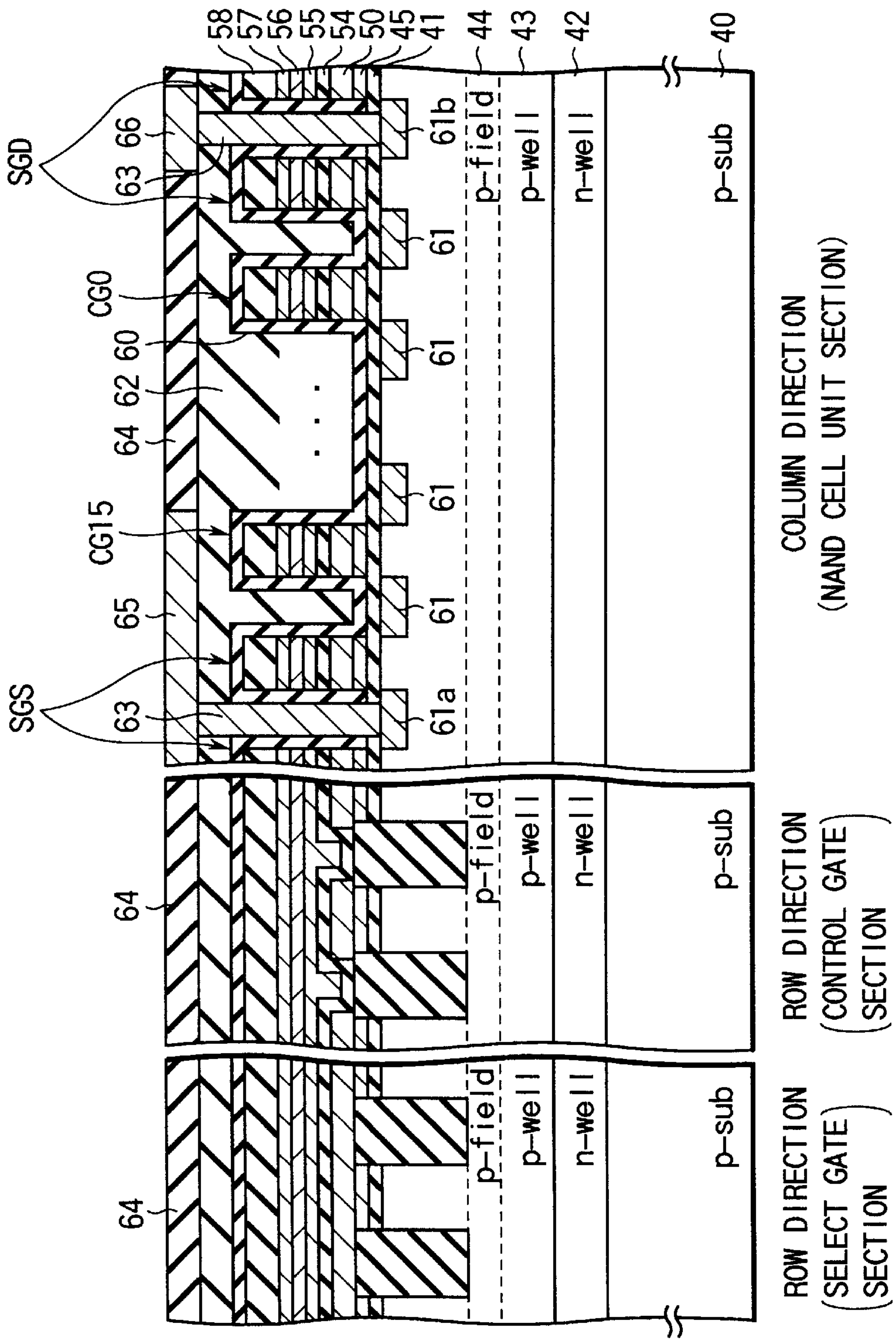
FIG. 43 is a cross sectional view showing a step of the method of manufacturing the semiconductor memory according to the present invention.

Then, as shown in FIG. 43, PEP and RIE are employed so that contact holes which reach the BPSG film 62, the silicon nitride film 60, the silicon oxide film 41 and the diffusion layers 61*a* and 61*b* are formed. A polysilicon film 63 containing impurities is formed in only the contact hole so that a contact plug is formed.

Then, a TEOS film 64 is formed on the BPSG film 62. Moreover, grooves for electric lines are formed in the TEOS film 64. Tungsten films for completely plugging the grooves for the electric lines are formed on the TEOS film 64. The tungsten films are polished by the CMP method in such a manner that the tungsten films are left in only the grooves for the electric liens. As a result, source electric lines 65 which are connected to the sources of the NAND cell units and electric lines 66 which are connected to the drains of the NAND cell units are formed.

Figure 44:
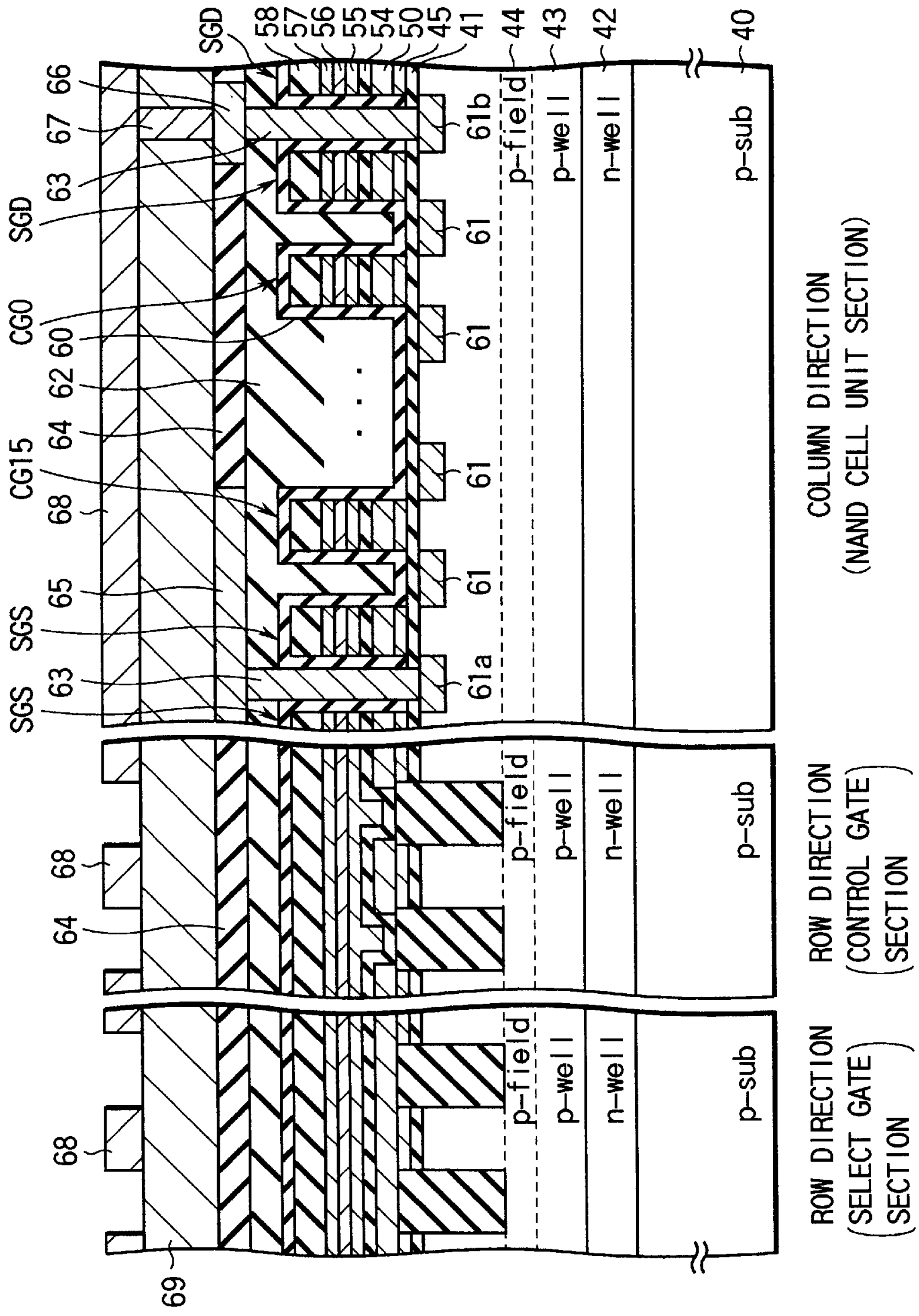
FIG. 44 is a cross sectional view showing a step of the method of manufacturing the semiconductor memory according to the present invention.

Then, as shown in FIG. 44, a TEOS film 69 is formed on the TEOS film 64. Then, PEP and RIE are employed so that via holes which reach the electric lines 66 are formed in the TEOS film 69. Tungsten films 67 containing impurities are formed in only the contact holes so that contact plugs are formed. Moreover, a plurality of bit lines 68 in the form of a laminate composed of, for example, aluminum, titanium and titanium nitride are formed on the TEOS film 69.

Then, a TEOS film is formed on the bit lines 68. Moreover, electric lines in the form of a laminate composed of aluminum, titanium and titanium nitride are formed on the TEOS film. Moreover, a passivation film in the form of a silicon nitride film is formed on the electric lines.

As a result of the above-mentioned manufacturing process, the NAND flash EEPROM is manufactured.

In this embodiment, the contact plug for the electric line 66 is provided immediately above the contact plug for the diffusion layer 61*b*. However, both contact plugs may be formed as shown in FIGS. 22 to 29 such that overlap is prevented. In the foregoing case, the contact plugs for the electric lines 66 can be formed in the zigzag configuration. Therefore, the intervals among the electric lines can be reduced.

As described above, the nonvolatile semiconductor memory according to the present invention and having the structure that the shielded bit line sensing scheme is employed in data read attains the following effects.

The shield bit lines are set to the power source potential VDD which is the same as the precharge potential of the select bit lines as well as the ground potential GND. Therefore, when precharge of the select bit lines is performed, no parasitic capacitance is caused between adjacent bit lines, that is, between the select bit lines and the shield bit lines. Therefore, a high speed precharging operation can be performed with small power consumption.

In the NAND flash EEPROM, the ground potential GND is applied to the sources of the NAND cell units which are connected to the select bit lines. On the other hand, the power source potential VDD is applied to the sources of the NAND cell units which are connected to the shield bit lines. Therefore, the select bit lines maintain the precharge potential or change to the ground potential GND in accordance with data (the threshold voltage) in the selected memory cells. Therefore, a usual data read operation can be performed. On the other hand, the power source potential VDD is commonly applied to the sources and drains of the NAND cell units which are connected to the shield bit lines. Therefore, stress which is imposed on the memory cells of the NAND cell units which are connected to the shield bit lines can be relaxed.

Moreover, the circuit according to the present invention has the structure that the select bit lines are precharged to the power source potential VDD. On the other hand, the shield bit lines are fixed to the power source potential VDD. Therefore, the conventional VDD/GND apply circuit can be omitted. That is, the source line decoder applies the power source potential VDD to the select bit lines and the shield bit lines. Therefore, enlargement of the size of the memory can be prevented.

The layout (the structure of the device) of the memory cell array section according to the present invention enables both source lines SL1 and SL2 which can independently set potentials to be disposed on the memory cell array. Moreover, the sources (the diffusion layers) of the NAND cell units are electrically isolated from one another by a device isolation film continuously extending in the column direction and formed into, for example, the STI structure. Therefore, the sources of two NAND cell units adjacent to each other in the row direction are connected to different source lines. As a result, the potentials can independently be set. That is, the shielded bit line sensing scheme according to the present invention can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:

a memory cell array having first and second memory cells;

a word line commonly connected to control gates of the first and the second memory cells;

a first bit line connected to a drain-side node of the first memory cell;

a second bit line connected to a drain-side node of the second memory cell and disposed adjacent to the first bit line;

a switch circuit operated in a first data read in such a manner as to precharge the first bit line to a precharge potential followed by bringing the first bit line to a floating state and to fix the second bit line to a positive potential and operated in a second data read in such a manner as to precharge the second bit line to the precharge potential followed by bringing the second bit line to the floating state and to fix the first bit line to the positive potential; and a decoder for selecting the word line, outputting data in the first memory cell to the first bit line in the first data read and outputting data in the second memory cell to the second bit line in the second data read.

2. A nonvolatile semiconductor memory according to claim 1, wherein the precharge potential and the positive potential are substantially simultaneously applied to the first and second bit lines.

3. A nonvolatile semiconductor memory according to claim 1, wherein the precharge potential and the positive potential are equal to each other.

4. A nonvolatile semiconductor memory according to claim 1, wherein each of the precharge potential and the positive potential is a power source potential which is substantially simultaneously applied to the first and second bit lines from a power source.

5. A nonvolatile semiconductor memory according to claim 1, further comprising a latch circuit connected to the first and the second bit lines and having a function of a sense amplifier.

6. A nonvolatile semiconductor memory comprising:

a memory cell array having first and second memory cells, the first memory cell being disposed adjacent to the second memory cell;

a word line commonly connected to control gates of the first and second memory cells;

a first bit line connected to a drain-side node of the first memory cell;

a second bit line connected to a drain-side node of the second memory cell and disposed adjacent to the first bit line;

a first source line connected to a source-side node of the first memory cell; and a second source line connected to a source-side node of the second memory cell and isolated from the first source line.

7. A nonvolatile semiconductor memory according to claim 6, further comprising a source line decoder operated in a first data read outputting data of the first memory cell in such a manner as to set the second source line to a positive potential and set the first source line to a low potential which is lower than the positive potential and operated in a second data read outputting data of the second memory cell in such a manner as to set the first source line to the positive potential and set the second source line to the low potential.

8. A nonvolatile semiconductor memory according to claim 7, further comprising a switch circuit structured to be operated in the first data read in such a manner as to precharge the first bit line to a precharge potential followed by bringing the first bit line to a floating state and to fix the second bit line to a positive potential and operated in the second data read in such a manner as to precharge the second bit line to the precharge potential followed by bringing the second bit line to the floating state and to fix the first bit line to the positive potential; and a decoder for selecting the word line, outputting data of the first memory cell to the first bit line in the first data read and outputting data of the second memory cell to the second bit line in the second data read.

9. A nonvolatile semiconductor memory according to claim 8, wherein each of the precharge potential and the positive potential is a power source potential and the low potential is a ground potential.

10. A nonvolatile semiconductor memory according to claim 6, wherein the source-side node of the first memory cell and the source-side node of the second memory cell are isolated from each other.

11. A nonvolatile semiconductor memory comprising:

first and second NAND cell units constituted by NAND columns having a plurality of memory cells connected to one another in series and two select transistors each of which is connected to of both ends of the NAND columns;

a first bit line connected to a drain-side node of the first NAND cell unit;

a second bit line connected to a drain-side node of the second NAND cell unit and disposed adjacent to the first bit line;

a switch circuit operated in a first data read in such a manner as to precharge the first bit line to a precharge potential followed by bringing the first bit line to a floating state and to fix the second bit line to a positive potential and operated in a second data read in such a manner as to precharge the second bit line to the precharge potential followed by bringing the second bit line to the floating state and to fix the first bit line to the positive potential; and a decoder for outputting data of one memory cell in the first NAND cell units to the first bit line in the first data read and outputting data of one memory cell in the second NAND cell units to the second bit line in the second data read.

12. A nonvolatile semiconductor memory according to claim 11, further comprising a first source line connected to a source-side node of the first NAND cell unit; and a second source line connected to a source-side node of the second NAND cell unit and isolated from the first source line.

13. A nonvolatile semiconductor memory according to claim 12, further comprising a source line decoder operated in the first data read in such a manner as to set the second source line to the positive potential and set the first source line to a low potential which is lower than the positive potential and operated in the second data read in such a manner as to set the first source line to the positive potential and set the second source line to the low potential.

14. A nonvolatile semiconductor memory according to claim 13, wherein each of the precharge potential and the positive potential is a power source potential and the low potential is a ground potential.

15. A nonvolatile semiconductor memory according to claim 12, wherein the source-side node of the first memory cell and the source-side node of the second memory cell are isolated from each other.

16. A nonvolatile semiconductor memory according to claim 12, wherein the first NAND cell unit and the second NAND cell unit are isolated from each other by a device isolation film having a line pattern extending substantially in parallel with the first and second bit lines.

17. A data read method of a nonvolatile semiconductor memory having a word line commonly connected to control gates of first and second memory cells, a first bit line connected to a drain-side node of the first memory cell and a second bit line connected to a drain-side node of the second memory cell and disposed adjacent to the first bit line, comprising the steps of:

precharging the first bit line to a precharge potential followed by bringing the first bit line to a floating state and outputting data of the first memory cell to the first bit line in a state in which the second bit line is fixed to a positive potential in a first data read; and precharging the second bit line to the precharge potential followed by bringing the second bit line to the floating state and outputting data of the second memory cell to the second bit line in a state in which the first bit line is fixed to the positive potential in a second data read.

18. A data read method according to claim 17, wherein a period of time in which the precharge potential is applied to the first bit line and a period of time in which the positive potential is applied to the second bit line are substantially the same in the first data read, and a period of time in which the precharge potential is applied to the second bit line and a period of time in which the positive potential is applied to the first bit line are substantially the same in the second data read.

19. A data read method according to claim 17, wherein each of the precharge potential and the positive potential is a power source potential, and the power source potential is simultaneously applied to the first and second bit lines from a power source in the first data read and the second data read.

20. A data read method according to claim 17, wherein the positive potential is applied to a source-side node of the second memory cell and a low potential which is lower than the positive potential is applied to a source-side node of the first memory cell in the first data read, and the positive potential is applied to a source-side node of the first memory cell and the low potential is applied to a source-side node of the second memory cell in the second data read.

21. A data read method according to claim 20, wherein each of the precharge potential and the positive potential is a power source potential, and the low potential is a ground potential.

22. A data read method of a nonvolatile semiconductor memory having a first bit line connected to a drain-side node of a first NAND cell unit and a second bit line connected to a drain-side node of a second NAND cell unit and disposed adjacent to the first bit line, comprising the steps of:

precharging the first bit line to a precharge potential followed by bringing the first bit line to a floating state and outputting data of one memory cell of the first NAND cell unit to the first bit line in a state in which the second bit line is fixed to a positive potential in a first data read, and precharging the second bit line to the precharge potential followed by bringing the second bit line to the floating state and outputting data of one memory cell in the second NAND cell unit to the second bit line in a state in which the first bit line is fixed to the positive potential in a second data read.

23. A data read method according to claim 22, wherein a period of time in which the precharge potential is applied to the first bit line and a period of time in which the positive potential is applied to the second bit line are substantially the same in the first data read, and a period of time in which the precharge potential is applied to the second bit line and a period of time in which the positive potential is applied to the first bit line are substantially the same in the second data read.

24. A data read method according to claim 22, wherein each of the precharge potential and the positive potential is a power source potential, and the power source potential is simultaneously applied to the first and second bit lines from a power source in the first data read and the second data read.

25. A data read method according to claim 22, wherein the positive potential is applied to a source-side node of the second NAND cell unit and a low potential which is lower than the positive potential is applied to a source-side node of the first NAND cell unit in the first data read, and the positive potential is applied to a source-side node of the first NAND cell unit and the low potential is applied to a source-side node of the second NAND cell unit in the second data read.

26. A data read method according to claim 25, wherein each of the precharge potential and the positive potential is a power source potential, and the low potential is a ground potential.

* * * * *